(12) United States Patent
Jo et al.

(10) Patent No.: US 11,980,088 B2
(45) Date of Patent: May 7, 2024

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventors: Sohee Jo, Cheonan-si (KR); Eunjae Jeong, Hwaseong-si (KR); Dongjun Kim, Suwon-si (KR); Minji Kim, Hwaseong-si (KR); Hankyu Pak, Suwon-si (KR); Sanghyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 426 days.

(21) Appl. No.: 17/373,336

(22) Filed: Jul. 12, 2021

(65) Prior Publication Data
US 2022/0020930 A1    Jan. 20, 2022

(30) Foreign Application Priority Data
Jul. 20, 2020    (KR) ........................ 10-2020-0089878

(51) Int. Cl.
*H01L 51/50* (2006.01)
*H10K 85/40* (2023.01)
(Continued)

(52) U.S. Cl.
CPC ........... *H10K 85/636* (2023.02); *H10K 85/40* (2023.02); *H10K 85/615* (2023.02);
(Continued)

(58) Field of Classification Search
CPC .. H10K 85/636; H10K 85/615; H10K 85/633; H10K 85/6574
See application file for complete search history.

(56) References Cited

U.S. PATENT DOCUMENTS

| 4,720,432 A | 1/1988 | VanSlyke et al. |
| 5,061,569 A | 10/1991 | VanSlyke et al. |

(Continued)

FOREIGN PATENT DOCUMENTS

| JP | H 11-144873 A | 5/1999 |
| JP | 2000-302756 A | 10/2000 |

(Continued)

*Primary Examiner* — Anthony Ho
(74) *Attorney, Agent, or Firm* — Lewis Roca Rothgerber Christie LLP

(57) ABSTRACT

An organic electroluminescence device includes a first electrode, a hole transport region on the first electrode, a light-emitting layer on the hole transport region, an electron transport region on the light-emitting layer, and a second electrode on the electron transport region. The hole transport region includes an amine compound represented by Formula 1.

20 Claims, 2 Drawing Sheets

Formula 1

(51) Int. Cl.
*H10K 85/60* (2023.01)
*H10K 50/15* (2023.01)

(52) U.S. Cl.
CPC ....... *H10K 85/633* (2023.02); *H10K 85/6574* (2023.02); *H10K 50/15* (2023.02)

(56) References Cited

U.S. PATENT DOCUMENTS

| | | |
|---|---|---|
| 5,681,664 A | 10/1997 | Tamano et al. |
| 6,242,115 B1 | 6/2001 | Thomson et al. |
| 8,021,764 B2 | 9/2011 | Hwang et al. |
| 8,173,272 B2 | 5/2012 | Jang et al. |
| 2015/0380657 A1 | 12/2015 | Yokoyama et al. |
| 2016/0118591 A1 | 4/2016 | Yokoyama et al. |

FOREIGN PATENT DOCUMENTS

| | | |
|---|---|---|
| JP | 3189376 B2 | 7/2001 |
| JP | 3261930 B2 | 3/2002 |
| JP | 2003-133075 A | 5/2003 |
| JP | 2004-079265 A | 3/2004 |
| JP | 2006-151979 A | 6/2006 |
| JP | 2010-083767 A | 4/2010 |
| KR | 10-0867526 B1 | 11/2008 |
| KR | 10-2015-0124443 A | 11/2015 |
| KR | 10-2016-0030109 A | 3/2016 |

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

This application claims priority to and the benefit of Korean Patent Application No. 10-2020-0089878, filed on Jul. 20, 2020, the entire content of which is hereby incorporated by reference.

BACKGROUND

1. Field

The present disclosure herein relates to an organic electroluminescence device and an amine compound for an organic electroluminescence device.

2. Description of Related Art

Recently, as an image display apparatus, an organic electroluminescence display apparatus has been actively developed. The organic electroluminescence display apparatus is different from a liquid crystal display apparatus or the like, and is a so-called self-luminescent display apparatus that implements display by recombining, in a light-emitting layer, holes and electrons respectively injected from a first electrode and a second electrode to cause an organic compound-containing light-emitting material in the light-emitting layer to emit light.

In the application of an organic electroluminescence element to display devices, there is a demand for an organic electroluminescence element having characteristics such as low driving voltage, high luminous efficiency, and long service life. Development of a material for an organic electroluminescence element capable of stably achieving such characteristics is continuously desired.

SUMMARY

One or more aspects of the present disclosure are directed towards an organic electroluminescence device and an amine compound for an organic electroluminescence device. More particularly, one or more aspects of the present disclosure are directed towards a highly efficient organic electroluminescence device and an amine compound included in a hole transport region of the electroluminescence device.

An embodiment of the present disclosure provides an amine compound represented by Formula 1 below.

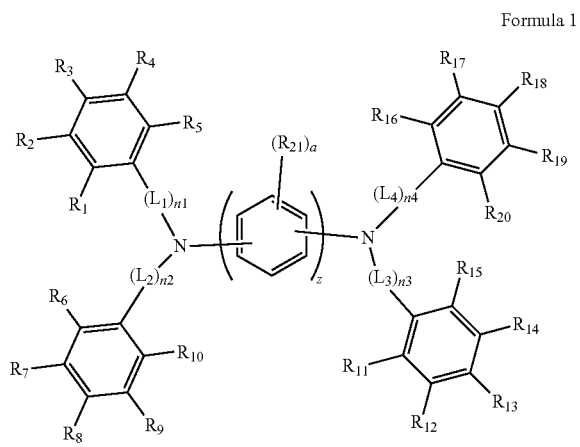

Formula 1

In Formula 1, $L_1$ to $L_4$ are each independently a direct bond, a substituted or unsubstituted arylene group having 6 to 30 ring-forming carbon atoms, or a substituted or unsubstituted heteroarylene group having 2 to 30 ring-forming carbon atoms; n1 to n4 are each independently an integer of 0 to 3; z is an integer of 1 to 5; a is an integer of 0 to 4; and $R_1$ to $R_{21}$ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In an embodiment, one of $R_1$ to $R_{20}$ may be a substituted silyl group, and the substituted silyl group may be a trialkylsilyl group. For example, it may be a trimethylsilyl group, a triethylsilyl group, or a tripropylsilyl group. The substituted silyl group is substituted with 6 or more and 30 or less ring carbon atoms (e.g., 6 to 30 ring-forming carbon atoms).

In an embodiment, Formula 1 may be represented by Formula 2 below.

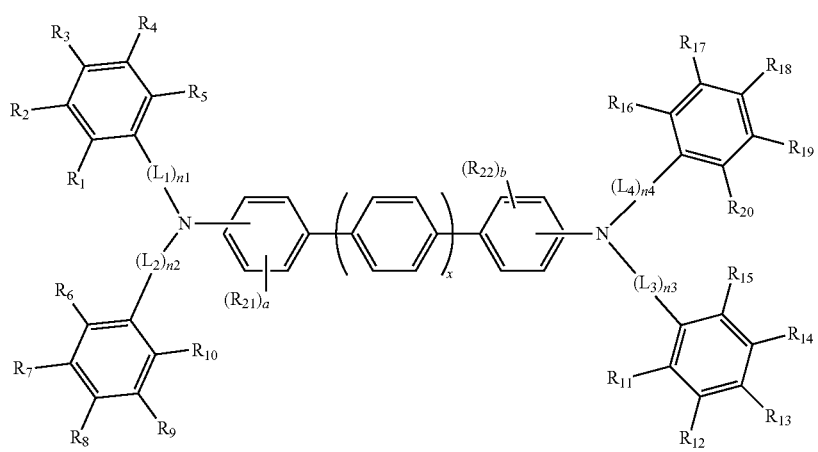

Formula 2

In Formula 2, $R_{22}$ is a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted ring heteroaryl group having 2 to 30 ring-forming carbon atoms; b is an integer of 0 to 4; x is an integer of 0 to 2; and $L_1$ to $L_4$, n1 to n4, a, and $R_1$ to $R_{21}$ are the same as defined in Formula 1.

In an embodiment, any one among $R_1$ to $R_5$ may be a substituted silyl group or an aryl group having 6 to 30 ring-forming carbon atoms in which a silyl group is substituted.

In an embodiment, any one among $R_6$ to Rio may be a substituted silyl group or an aryl group having 6 to 30 ring-forming carbon atoms in which a silyl group is substituted.

In an embodiment, any one among $R_{11}$ to $R_{15}$ may be a substituted silyl group or an aryl group having 6 to 30 ring-forming carbon atoms in which a silyl group is substituted.

In an embodiment, any one among $R_{16}$ to $R_{20}$ may be a substituted silyl group or an aryl group having 6 to 30 ring-forming carbon atoms in which a silyl group is substituted.

In an embodiment, Formula 2 may be represented by Formula 3 below.

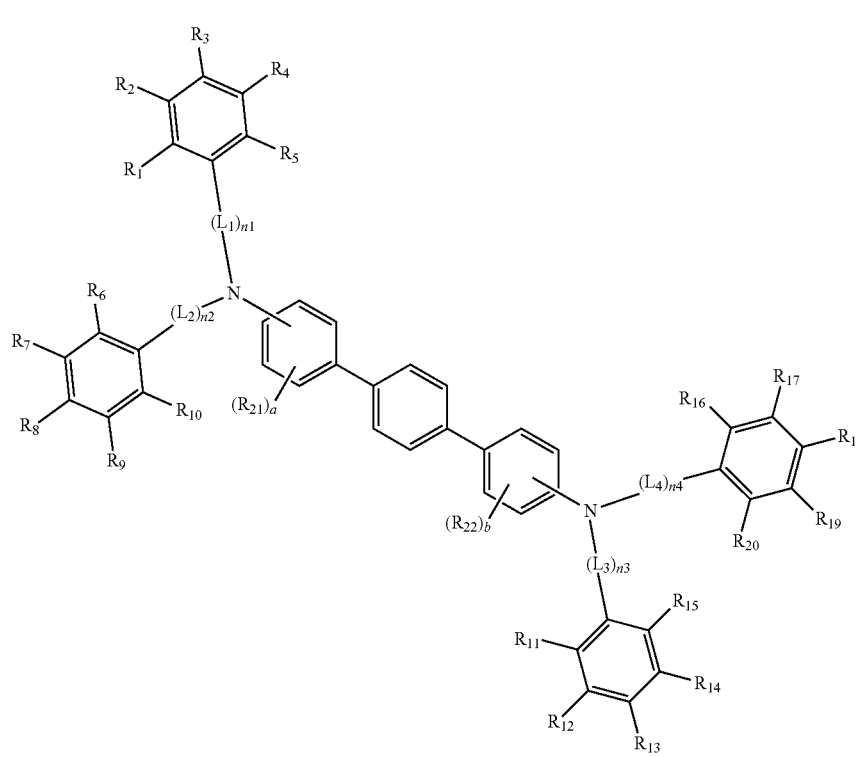

Formula 3

In Formula 3, $L_1$ to $L_4$, n1 to n4, a, b, and $R_1$ to $R_{22}$ are the same as defined in Formula 2.
In an embodiment, Formula 3 may be represented by Formula 4 below.
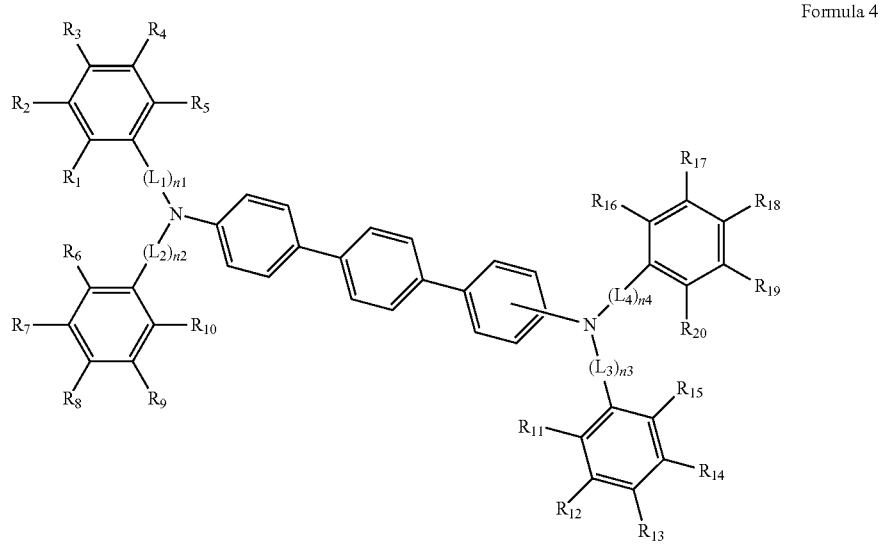
Formula 4
In Formula 4, $L_1$ to $L_4$, n1 to n4, and $R_1$ to $R_{20}$ are the same as defined in Formula 3.
In an embodiment, Formula 4 may be represented by Formula 4-1 below.
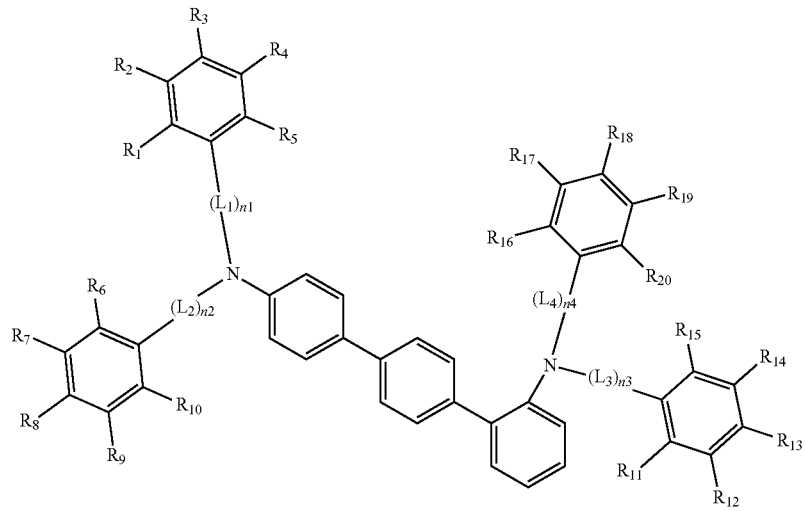
Formula 4-1

In Formula 4-1, $L_1$ to $L_4$, n1 to n4, and $R_1$ to $R_{20}$ are the same as defined in Formula 4.
In an embodiment, Formula 4 may be represented by Formula 4-2 below.
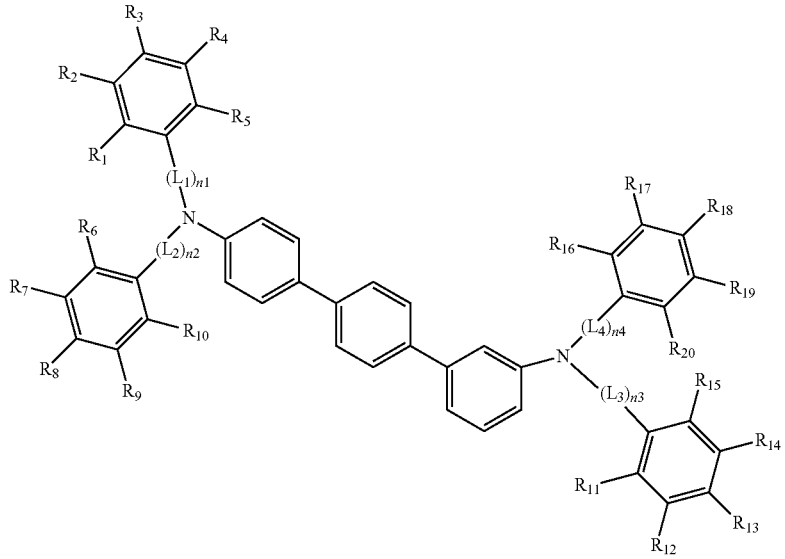
Formula 4-2
In Formula 4-2, $L_1$ to $L_4$, n1 to n4, and $R_1$ to $R_{20}$ are the same as defined in Formula 4.
In an embodiment, Formula 4 may be represented by Formula 4-3 below.
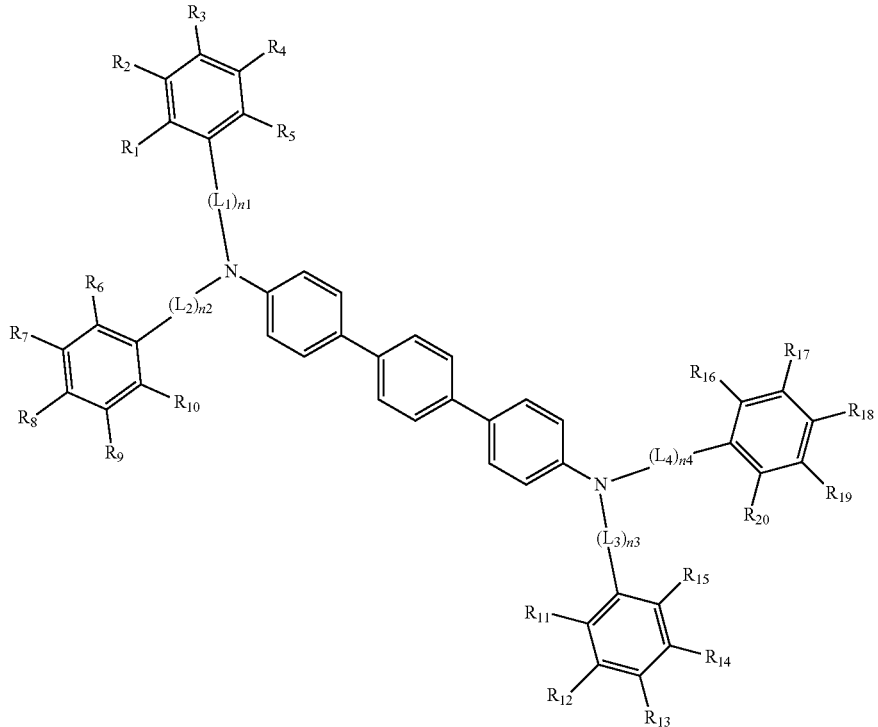
Formula 4-3

In Formula 4-3, $L_1$ to $L_4$, n1 to n4, and $R_1$ to $R_{20}$ are the same as defined in Formula 4.

In an embodiment, $L_1$ to $L_4$ in Formula 1 may each independently be a direct bond, a substituted or unsubstituted phenylene group, or a substituted or an unsubstituted biphenylene group.

In an embodiment, the amine compound represented by Formula 1 may be at least one selected from compounds represented by Compound Group 1 (the Compound Group 1 illustrated immediately after current paragraph [0108]).

In an embodiment, an organic electroluminescence device may include a first electrode EL1, a hole transport region HTR provided on the first electrode EL1, a light-emitting layer EML provided on the hole transport region HTR, an electron transport region ETR provided on the light-emitting layer EML, and a second electrode EL2 provided on the electron transport region ETR, the organic electroluminescence device including the amine compound. In an embodiment, the hole transport region HTR may include the amine compound.

In an embodiment, the hole transport region HTR may include a hole injection layer HIL disposed on the first electrode EL1 and a hole transport layer HTL disposed on the hole injection layer HIL, the hole transport layer HTL may include the amine compound.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
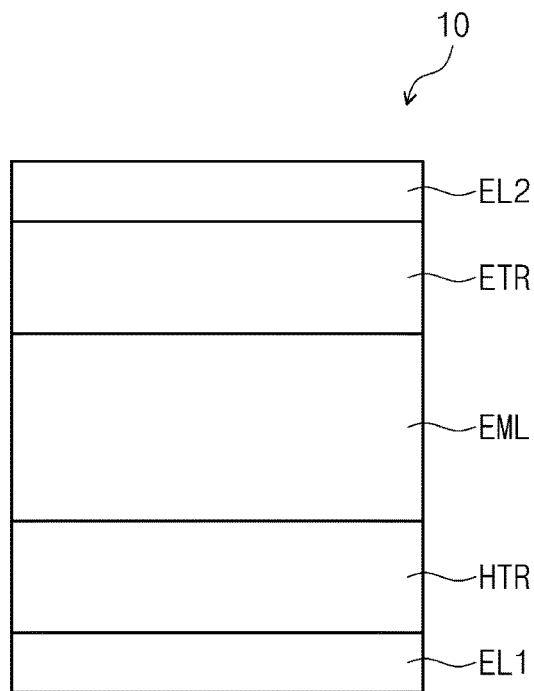
FIG. 1 is a cross-sectional view schematically illustrating an organic electroluminescence device according to an embodiment of the present disclosure.

The present disclosure may be embodied in different forms and may have various suitable modifications, and example embodiments will be explained in more detail with reference to the accompany drawings. The present disclosure may, however, be embodied in different forms and should not be construed as limited to the embodiments set forth herein. Rather, all suitable modifications, equivalents, and substituents which are included in the spirit and technical scope of the present disclosure are included in the present disclosure. As used herein, the use of the term "may," when describing embodiments of the present disclosure, refers to "one or more embodiments of the present disclosure."

In the specification, it will be understood that when an element or layer is referred to as being "on", "connected to" or "coupled to" another element or layer, the element or layer may be directly on, directly connected to, or directly coupled to the other element or layer, or one or more third components may be arranged therebetween.

Like numbers refer to like elements throughout. Also, the thickness, the ratio, and the dimension of the elements may be exaggerated for effective description of the technical contents.

As used herein, the term "and/or" includes any and all combinations of one or more of the associated listed items.

The terms such as first and second may be used to describe various components, but the components should not be limited by the terms. The terms are used only for the purpose of distinguishing one component from another component.

For example, without departing from the scope of the embodiment of present disclosure, a first component may be referred to as a second component, and similarly, a second component may be referred to as a first component. Singular expressions may include plural expressions unless the context clearly indicates otherwise.

In addition, terms such as "below," "lower," "above," and "upper" are used to describe the relationship (e.g., spatial relationship) between components shown in the drawings. The terms are relative concepts and are described based on the directions indicated in the drawings.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms like "includes" and "comprises," when used in this specification, specify the presence of stated features, integers, steps, operations, elements, and/or components, but do not preclude the presence or addition of one or more other features, integers, steps, operations, elements, components, and/or groups thereof.

Hereinafter, an organic electroluminescence device according to an embodiment of the present disclosure and a compound according to an embodiment, included therein will be explained with reference to the accompanying drawings.

FIG. 1 to FIG. 4 are cross-sectional views schematically illustrating organic electroluminescence devices according to embodiments of the present disclosure. Referring to FIG. 1 to FIG. 4, in an organic electroluminescence device 10 according to an embodiment, a first electrode EL1 and a second electrode EL2 may be disposed to face each other (e.g., may overlap each other in the plan view), and a light-emitting layer EML may be disposed between the first electrode EL1 and the second electrode EL2.

Also, the organic electroluminescence device 10 according to an embodiment further includes a plurality of functional layers between the first electrode EL1 and the second electrode EL2 in addition to the light-emitting layer EML.

The plurality of the functional layers may include a hole transport region HTR, and an electron transport region ETR. In some embodiments, the organic electroluminescence device 10 according to an embodiment may include a first electrode EL1, a hole transport region HTR, a light-emitting layer EML, an electron transport region ETR, and a second electrode EL2, which are stacked in sequence. Also, the organic electroluminescence device 10 according to an embodiment may include a capping layer CPL disposed on the second electrode EL2.

The organic electroluminescence device 10 according to an embodiment includes an amine compound according to an embodiment described later in the hole transport region HTR disposed between the first electrode EL1 and the second electrode EL2. However, an embodiment of the present disclosure is not limited thereto. In some embodiments, the organic electroluminescence device 10 according to an embodiment is described later as having an amine compound in the light-emitting layer EML and/or in the electron transport region ETR disposed between the first electrode EL1 and the second electrode EL2, and also in the hole transport region HTR. In some embodiments, the hole transport region HTR, the light-emitting layer EML, and/or the electron transport region ETR may each contain an amine compound. In some embodiments, the capping layer CPL may include an amine compound. For example, in some embodiments, the hole transport region HTR, the light-emitting layer EML, the electron transport region ETR, and/or the capping layer CPL may include an amine compound.

Figure 2:
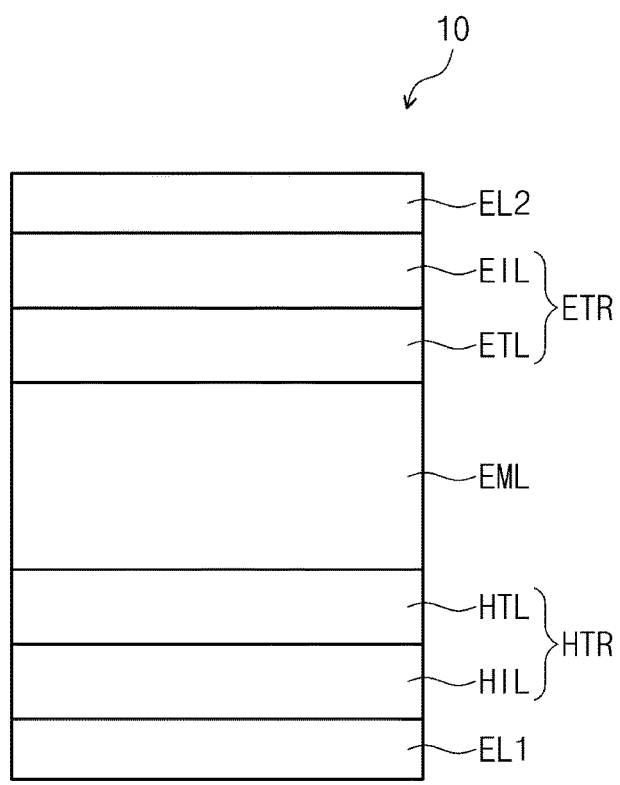
FIG. 2 is a cross-sectional view schematically illustrating an organic electroluminescence device according to an embodiment of the present disclosure.
Figure 3:
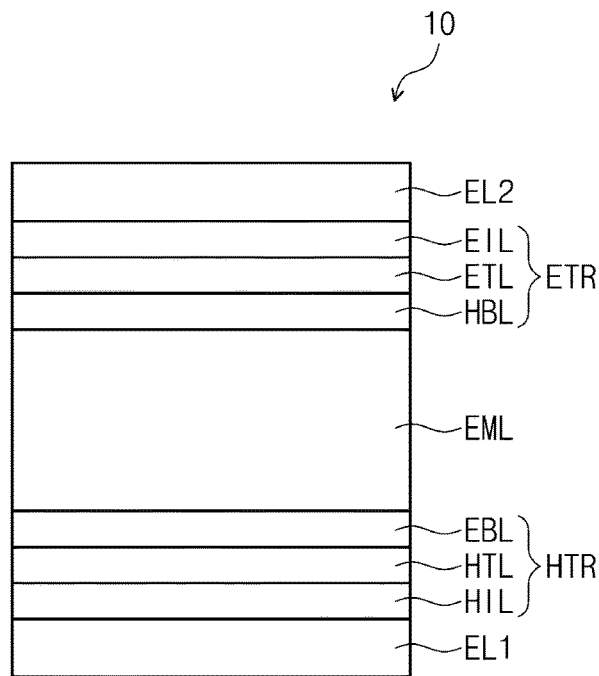
FIG. 3 is a cross-sectional view schematically illustrating an organic electroluminescence device according to an embodiment of the present disclosure.

Meanwhile, compared to FIG. 1, FIG. 2 illustrates a cross-sectional view of an organic electroluminescence device 10 according to an embodiment in which the hole transport region HTR includes a hole injection layer HIL and a hole transport layer HTL, and the electron transport region ETR includes an electron injection layer EIL and an electron transport layer ETL. Also, compared to FIG. 1, FIG. 3 illustrates a cross-sectional view of an organic electroluminescence device 10 according to an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL.

Figure 4:
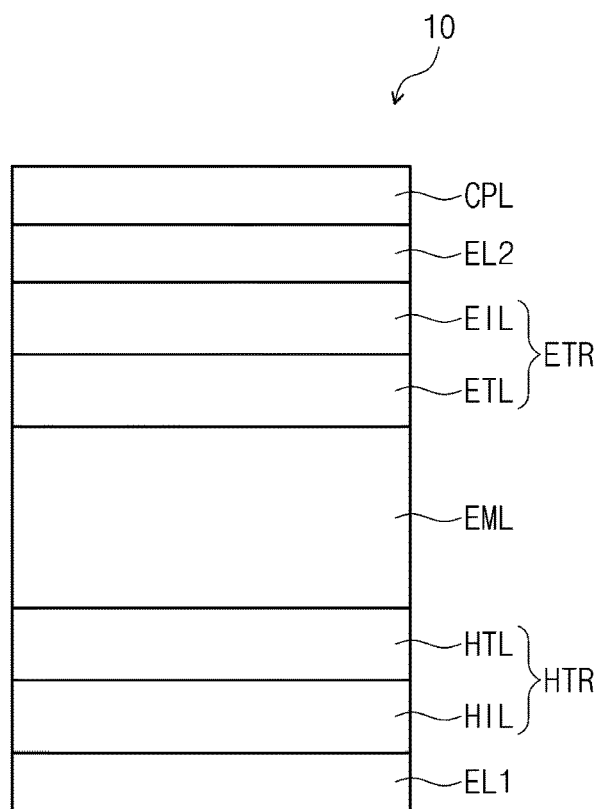
FIG. 4 is a cross-sectional view schematically illustrating an organic electroluminescence device according to an embodiment of the present disclosure.

Compared to FIG. 2, FIG. 4 illustrates a cross-sectional view of an organic electroluminescence device 10, according to an embodiment, including a capping layer CPL disposed on the second electrode EL2.

The first electrode EL1 has a conductivity. The first electrode EL1 may be formed of a metal alloy and/or a conductive compound. The first electrode EL1 may be a pixel electrode or a positive electrode. The first electrode EL1 may be a transmissive electrode, a transflective electrode, or a reflective electrode. If the first electrode EL1 is the transmissive electrode, the first electrode EL1 may include (e.g., be) a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include (e.g., be) silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca (lithium fluoride/Ca), LiF/Al, molybdenum (Mo), titanium (Ti), compounds thereof, or mixtures thereof (for example, a mixture of Ag and Mg). Also, the first electrode EL1 may have a multilayer structure including a reflective layer or a transflective layer formed of one or more of the above materials, and a transparent conductive layer formed of ITO, IZO, ZnO, ITZO and/or the like. For example, the first electrode EL1 may include a three-layer structure of ITO/Ag/ITO. However, an embodiment of the present disclosure is not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed of a single material, a single layer formed of a plurality of different materials, or may have a multilayer structure including a plurality of layers formed of a plurality of different materials.

For example, the hole transport region HTR may have a single-layer structure of a hole injection layer HIL and/or a hole transport layer HTL, and may have a single-layer structure formed of a hole injection material and/or a hole transport material. Also, the hole transport region HTR may have a structure of a single layer formed of a plurality of different materials, or may have a structure in which a hole injection layer HIL/hole transport layer HTL (a hole injection layer HIL and a hole transport layer HTL), a hole injection layer HIL/hole transport layer HTL/hole buffer layer (a hole injection layer HIL, a hole transport layer HTL, and a hole buffer layer), or a hole injection layer HIL/hole transport layer HTL/hole blocking layer EBL (a hole injection layer HIL, a hole transport layer HTL, and a hole blocking layer EBL) are stacked in sequence from the first electrode EL1. However, the present disclosure is not limited thereto.

The hole transport region HTR of the organic electroluminescence device 10 according to an embodiment includes an amine compound according to an embodiment of the present disclosure.

Meanwhile, the term "substituted or unsubstituted" herein may refer to something being substituted or unsubstituted with at least one substituent selected from the group consisting of a deuterium atom, a halogen atom, a cyano group, a nitro group, an amino group, a silyl group, an oxy group, a thiol group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group and an heterocyclic group. In addition, the substituents may each be substituted or unsubstituted. For example, the biphenyl group may be interpreted as an aryl group or as a phenyl group substituted with a phenyl group.

In the specification, examples of the halogen atom include a fluorine atom, a chlorine atom, a bromine atom and an iodine atom.

In the specification, the silyl group includes an alkyl silyl group and an aryl silyl group. Examples of the silyl group include a trimethylsilyl group, a t-butyldimethylsilyl group, a vinyldimethylsilyl group, a propyldimethylsilyl group, a triphenylsilyl group, a diphenylsilyl group, a phenylsilyl group, etc., but the present disclosure is not limited thereto.

In the specification, the alkyl group may have (e.g., be) a straight chain, a branched chain or a cyclic type (e.g., a cyclic compound). The number of carbon atoms in the alkyl group may be, for example, 1 to 50, 1 to 30, 1 to 20, 1 to 10, or 1 to 6. Examples of the alkyl group include a methyl group, an ethyl group, an n-propyl group, an isopropyl group, an n-butyl group, an s-butyl group, a t-butyl group, an i-butyl group, a 2-ethylbutyl group, 3, a 3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-icosyl group, a 2-ethyl icosyl group, a 2-butyl icosyl group, a 2-hexyl icosyl group, a 2-octylicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group, etc., but the present disclosure is not limited thereto.

In the specification, the alkenyl group refers to a hydrocarbon group containing one or more carbon double bonds in the middle or end of an alkyl group having 2 or more carbon atoms. The alkenyl group may be straight or branched. The number of carbon atoms is not particularly limited, but may be, for example, 2 to 30, 2 to 20, or 2 to 10. Examples of the alkenyl group include, although not limited to, a vinyl group, a 1-butenyl group, a 1-pentenyl group, a 1,3-butadienyl aryl group, a styrenyl group, a styrylvinyl group, etc., but the present disclosure is not limited thereto.

In the specification, the alkynyl group refers to a hydrocarbon group including one or more carbon triple bonds in the middle or end of an alkyl group having 2 or more carbon atoms. The alkynyl group may be straight or branched. The number of carbon atoms is not particularly limited, but may be, for example, 2 to 30, 2 to 20, or 2 to 10. Some examples of the alkynyl group may include an ethynyl group, a propynyl group, etc. However, the present disclosure is not limited thereto.

In the specification, the hydrocarbon ring group may be a functional group or substituent derived from an aliphatic hydrocarbon ring, or may be a functional group or substituent derived from an aromatic hydrocarbon ring. The number of ring-forming carbon atoms of the hydrocarbon ring group may be, for example, 5 to 60, 5 to 30, or 5 to 20.

In the specification, the aryl group may refer to a functional group or substituent derived from an aromatic hydrocarbon ring. The aryl group may be a monocyclic aryl group or a polycyclic aryl group. The number of ring-forming carbon atoms of the aryl group may be, for example, 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quarterphenyl group, a quincphenyl group, a sexyphenyl group, a triphenylenyl group, a pyrenyl group, a benzofluoranthenyl group, a chrysenyl group, etc. However, an embodiment of the present disclosure is not limited thereto.

In the specification, the fluorenyl group may be substituted, and two substituents may be bonded to each other to form a spiro structure. An example in which the fluorenyl group is substituted is as follow. However, the present disclosure is not limited thereto.

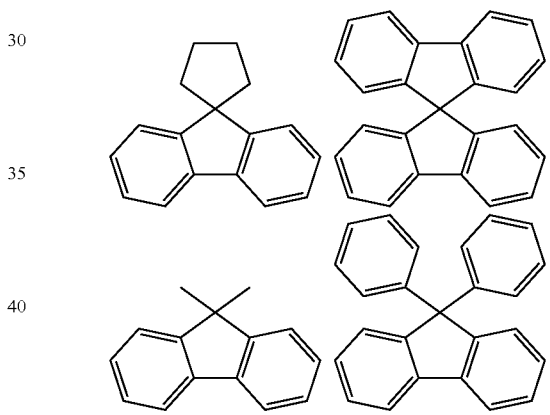

In the specification, the heterocyclic group refers to a functional group or substituent derived from a ring containing, as a hetero atom, at least one of boron (B), oxygen (O), nitrogen (N), phosphorus (P), silicon (Si) or sulfur (S). The heterocyclic group includes an aliphatic heterocyclic group and an aromatic heterocyclic group. The aromatic heterocyclic group may be a heteroaryl group. The aliphatic heterocycle and aromatic heterocycle may each be a monocycle or polycycle.

In the specification, the heterocyclic group may include, as a hetero atom, at least one of B, O, N, P, Si, or S. When the heterocyclic group contains two or more hetero atoms, the two or more hetero atoms may be the same as or different from each other. The heterocyclic group may be a monocyclic heterocyclic group or a polycyclic heterocyclic group, and may conceptually include a heteroaryl group. The number of ring-forming carbon atoms of the heterocyclic group may be, for example, 2 to 30, 2 to 20, or 2 to 10.

In the specification, the aliphatic heterocyclic group may include, as a hetero atom, at least one of B, O, N, P, Si or S.

The aliphatic heterocyclic group may have a number of ring-forming carbon atoms of, for example, 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, and the like. However, an embodiment of the present disclosure is not limited thereto.

In the specification, the heteroaryl group may include, as a hetero atom, at least one of B, O, N, P, Si or S. When the heteroaryl group contains two or more heteroatoms, the two or more heteroatoms may be the same as or different from each other. The heteroaryl group may be a monocyclic heterocyclic group or a polycyclic heterocyclic group. The number for ring-forming carbon atoms of the heteroaryl group may be, for example, 2 to 30, 2 to 20, or 2 to 10. Examples of the heteroaryl group may include thiophene, furan, pyrrole, imidazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc. However, the present disclosure is not limited thereto.

In the specification, the number of carbon atoms of the amine group is not particularly limited, but may be, for example, 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methylanthracenylamine group, a triphenylamine group, etc., but the present disclosure is not limited thereto.

In the specification, except that the arylene group is a divalent group, the above description regarding the aryl group is applied to the arylene group.

In the specification, except that the heteroarylene group is a divalent group, the above description regarding the heteroaryl group is applied to the heteroarylene group.

In the specification, the alkyl group in an alkylaryl group, an alkylamino group, an alkyl silyl group, and an alkyl amine group, is the same as the example of the above-described alkyl group. That is, examples of each of the alkyl group in an alkylaryl group, an alkylamino group, an alkyl silyl group, and an alkyl amine group may include the same examples as described above with respect to the alkyl group.

In the specification, the aryl group in an aryl amino group, an aryl silyl group, and an aryl amine group is the same as the example of the above-described aryl group. That is, examples of each of the aryl group in an aryl amino group, an aryl silyl group, and an aryl amine group may include the same examples as described above with respect to the aryl group.

In the specification, a direct linkage may refer to a single bond.

Meanwhile, in the specification, "*―――" may refer to a connected position.

The amine compound according to an embodiment of the present disclosure is represented by Formula 1 below.

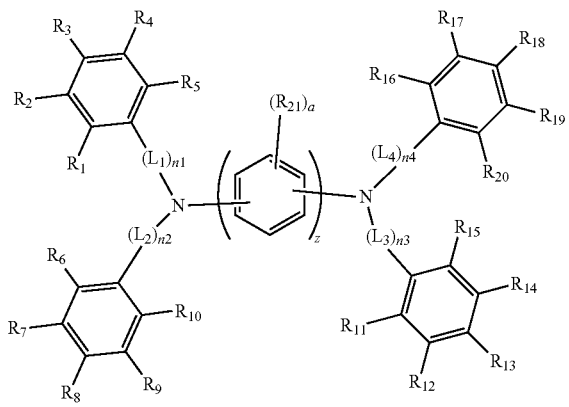

Formula 1

In Formula 1, $L_1$ to $L_4$ are each independently a direct bond, a substituted or unsubstituted arylene group having 6 to 30 ring-forming carbon atoms, or a substituted or unsubstituted heteroarylene group having 2 to 30 ring-forming carbon atoms.

In Formula 1, n1 to n4 are each independently an integer of 0 to 3; and when n1 is 2 or more, a plurality of $L_1$'s are the same as or different from each other, when n2 is 2 or more, a plurality of $L_2$'s are the same as or different from each other, when n3 is 2 or more, a plurality of $L_3$'s are the same as or different from each other, and when n4 is 2 or more, a plurality of $L_4$'s are the same as or different each other.

In Formula 1, z is an integer of 1 to 5.

In Formula 1, a is an integer of 0 to 4, and when a is 2 or more, a plurality of $R_{21}$'s are the same as or different from each other.

In Formula 1, $R_1$ to $R_{21}$ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

However, at least one among $R_1$ to $R_{20}$ is a substituted silyl group or an aryl group having 6 to 30 ring-forming carbon atoms in which a silyl group is substituted.

In an embodiment, any one among $R_1$ to $R_{20}$ may be a substituted silyl group or an aryl group having 6 to 30 ring-forming carbon atoms in which a silyl group is substituted.

In an embodiment, the substituted silyl group may be a trialkylsilyl group. For example, the substituted silyl group may be a trimethylsilyl group, a triethylsilyl group, or a tripropylsilyl group. For example, the substituted silyl group may be represented by Formula 7 below.

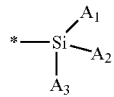

Formula 7

In Formula 7, $A_1$ to $A_3$ may each independently be a substituted or unsubstituted alkyl group having 1 to 20 carbon atoms.

In an embodiment, the amine compound may be a diamine compound. In an embodiment, the amine compound does not include a heteroaryl group containing N.

In an embodiment, $L_1$ to $L_4$ in Formula 1 may each independently be a direct bond, a substituted or unsubstituted phenylene group, or a substituted or unsubstituted biphenylene group.

In an embodiment, Formula 1 may be represented by Formula 2 below.

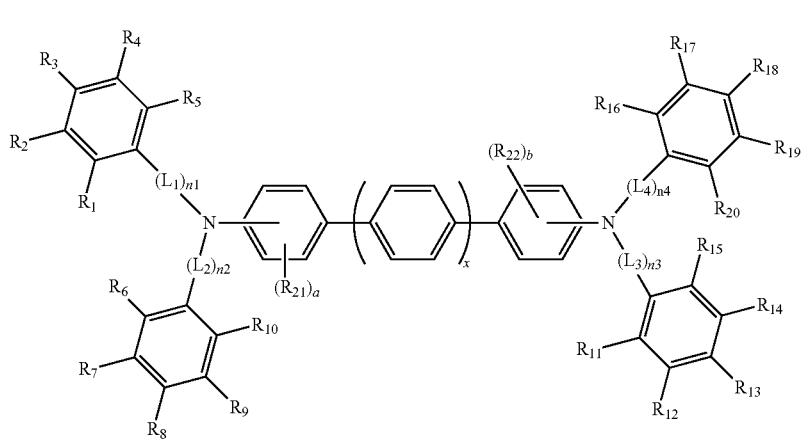

Formula 2

In Formula 2, $R_{22}$ is a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, In Formula 2, b is an integer of 0 to 4. Meanwhile, when b is 2 or more, a plurality of $R_{22}$'s are the same as or different from each other.

In Formula 2, x may be an integer of 0 to 2

In Formula 2, $L_1$ to $L_4$, n1 to n4, a, and $R_1$ to $R_{21}$ are the same as defined in Formula 1. For example, the description of $L_1$ to $L_4$, n1 to n4, a, and $R_1$ to $R_{21}$ provided with respect to Formula 1 may apply to $L_1$ to $L_4$, n1 to n4, a, and $R_1$ to $R_{21}$ of Formula 2.

In an embodiment, at least one among (e.g., any one among) $R_1$ to $R_5$ may be a substituted silyl group or an aryl group having 6 to 30 ring-forming carbon atoms in which a silyl group is substituted.

In an embodiment, at least one among (e.g., any one among) $R_6$ to $R_{10}$ may be a substituted silyl group or an aryl group having 6 to 30 ring-forming carbon atoms in which a silyl group is substituted.

In an embodiment, at least one among (e.g., any one among) $R_{11}$ to $R_{15}$ may be a substituted silyl group or an aryl group having 6 to 30 ring-forming carbon atoms in which a silyl group is substituted.

In an embodiment, at least one among (e.g., any one among) $R_{16}$ to $R_{20}$ may be a substituted silyl group or an aryl group having 6 to 30 ring-forming carbon atoms in which a silyl group is substituted.

In an embodiment, Formula 2 may be represented by Formula 3 below.

Formula 3
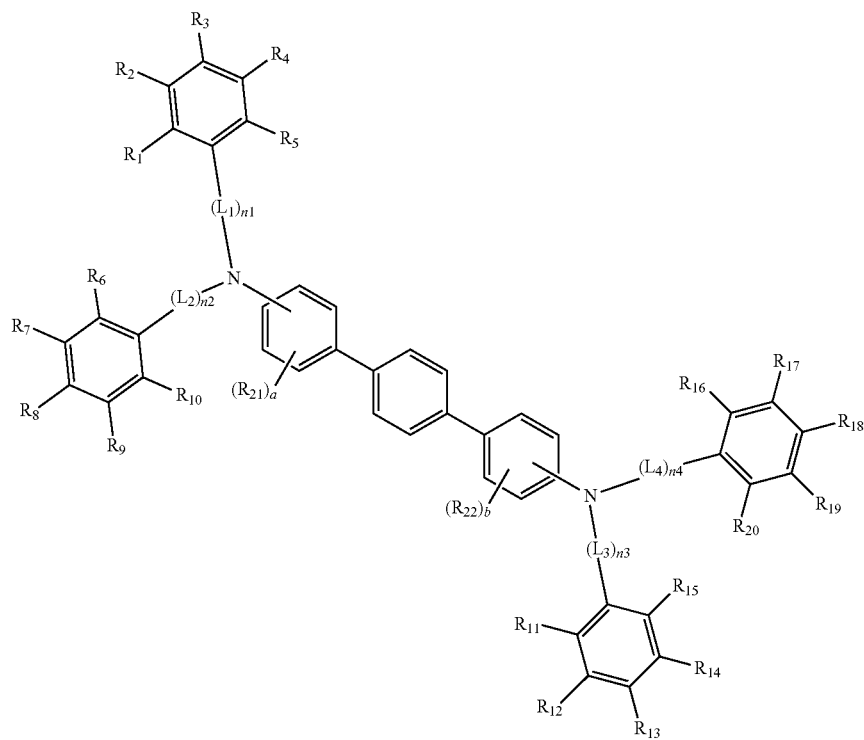
In Formula 3, $L_1$ to $L_4$, n1 to n4, a, b, and $R_1$ to $R_{22}$ are the same as defined in Formula 2.
In an embodiment, $R_{21}$ and $R_{22}$ may be a hydrogen atom or a deuterium atom.
In an embodiment, Formula 3 may be represented by Formula 4 below.
Formula 4
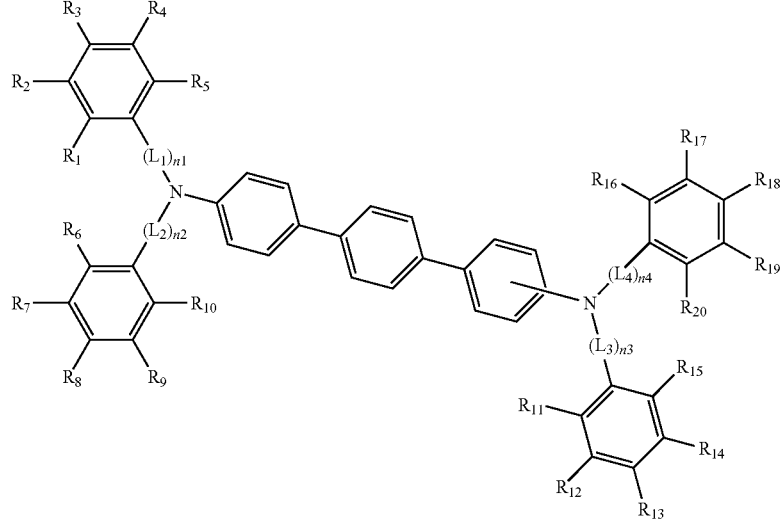

In Formula 4, $L_1$ to $L_4$, n1 to n4, and R1 to R20 are the same as defined in Formula 3.

In an embodiment, Formula 3 is represented by Formula 5 below.

Formula 5

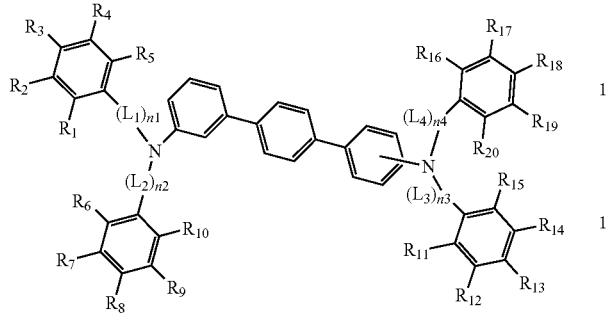

In Formula 5, $L_1$ to $L_4$, n1 to n4, and $R_1$ to $R_{20}$ are the same as defined in Formula 3.

In an embodiment, Formula 3 may be represented by Formula 6 below.

Formula 6

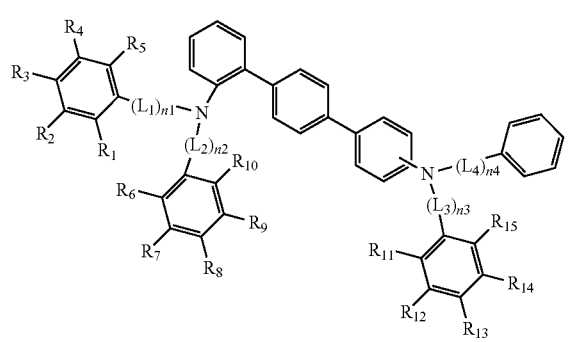

In Formula 6, $L_1$ to $L_4$, n1 to n4, and $R_1$ to $R_{20}$ are the same as defined in Formula 3.

In an embodiment, Formula 4 may be represented by Formula 4-1 below.

Formula 4-1

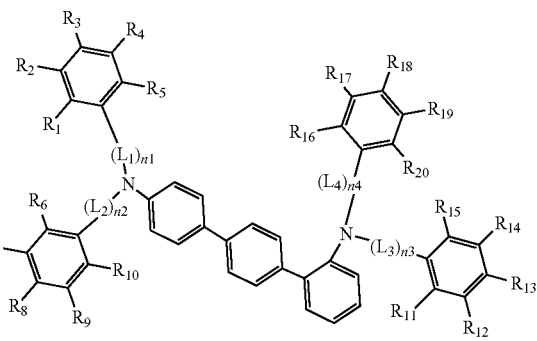

In Formula 4-1, $L_1$ to $L_4$, n1 to n4, and $R_1$ to $R_{20}$ are the same as defined in Formula 4.

In an embodiment, Formula 4 may be represented by Formula 4-2 below.

Formula 4-2

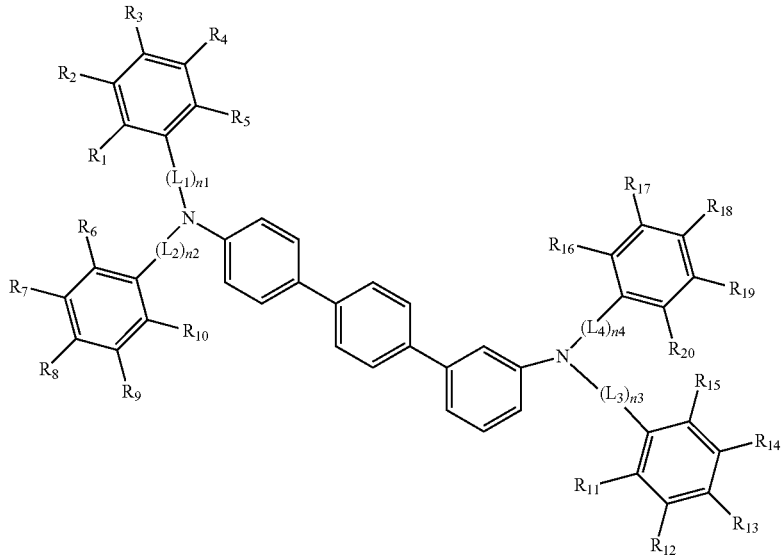

In Formula 4-2, $L_1$ to $L_4$, n1 to n4, and $R_1$ to $R_{20}$ are the same as defined in Formula 4.

In an embodiment, Formula 4 may be represented by Formula 4-3 below.

Formula 4-3

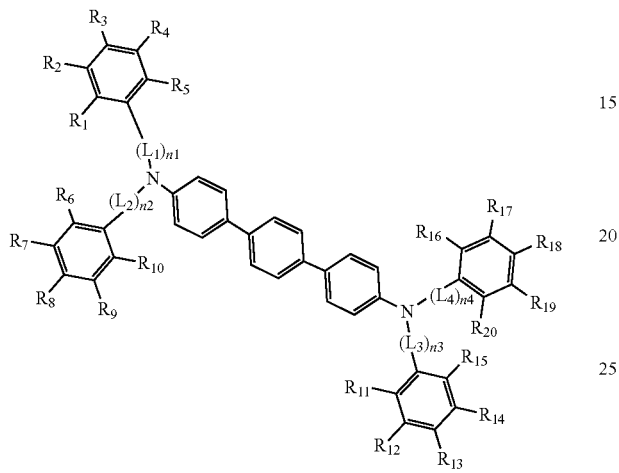

In Formula 4-3, $L_1$ to $L_4$, n1 to n4, and $R_1$ to $R_{20}$ are the same as defined in Formula 4.

The amine compound represented by Formula 1 according to an embodiment of the present disclosure may be any one selected from the compounds represented by Compound Group 1 below. However, an embodiment of the present disclosure is not limited thereto.

Compound Group 1

1

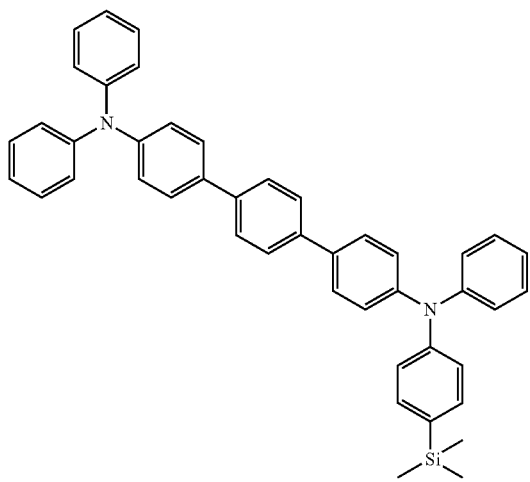

2

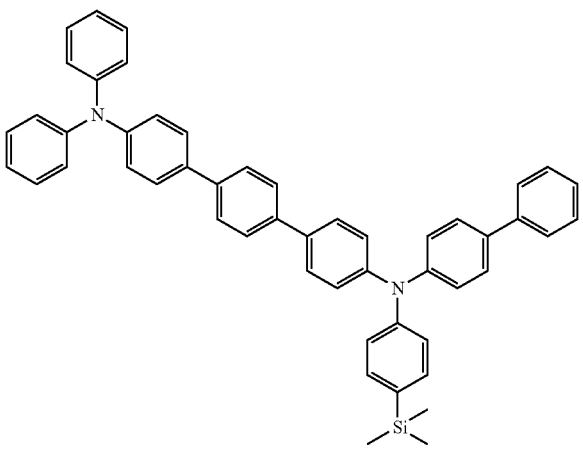

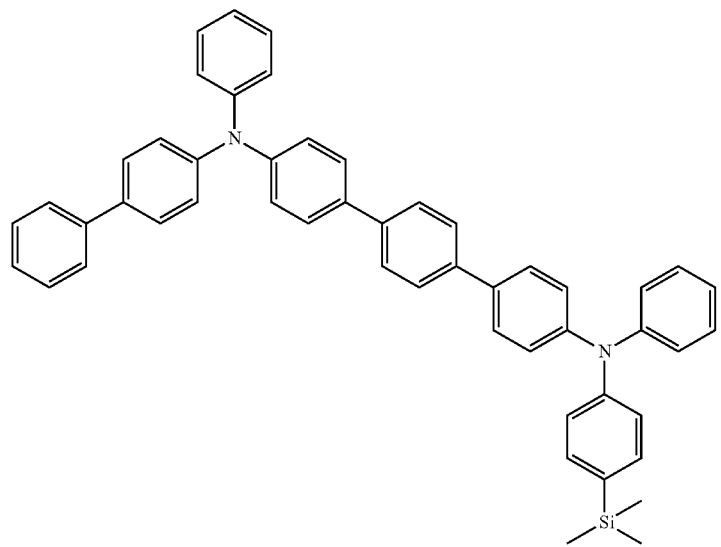
3
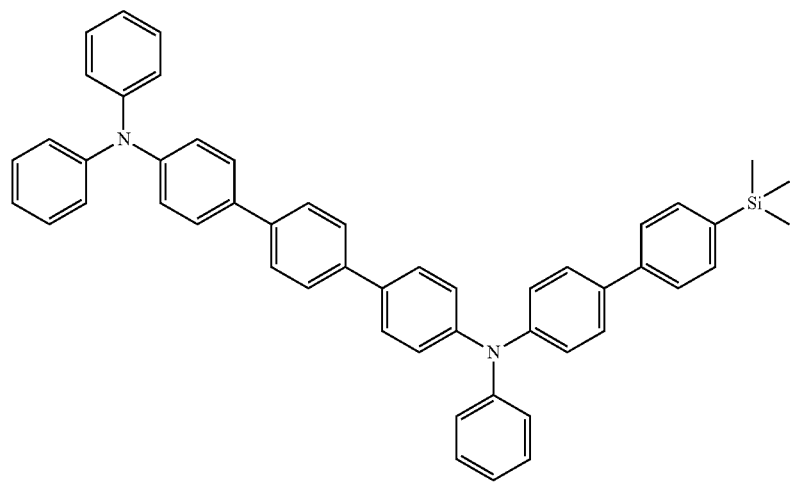
4
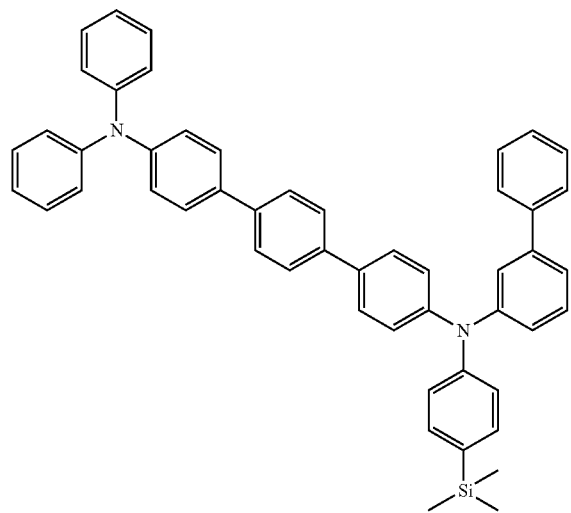
5
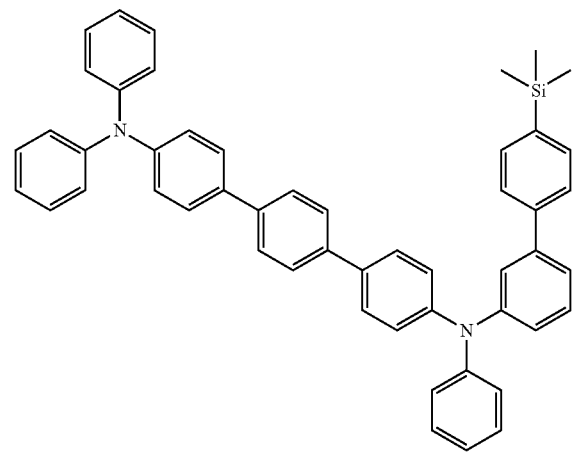
6

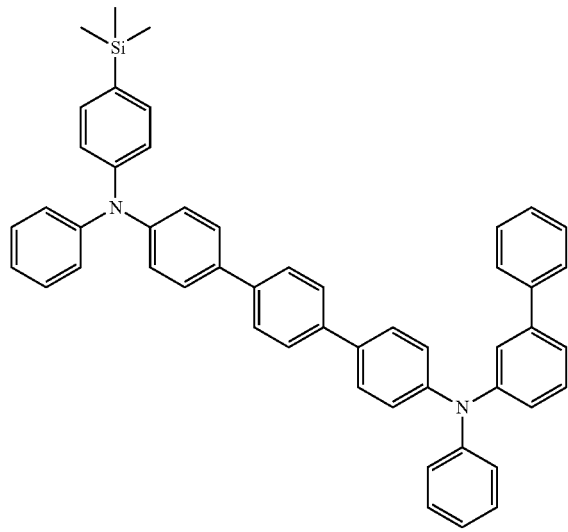
7
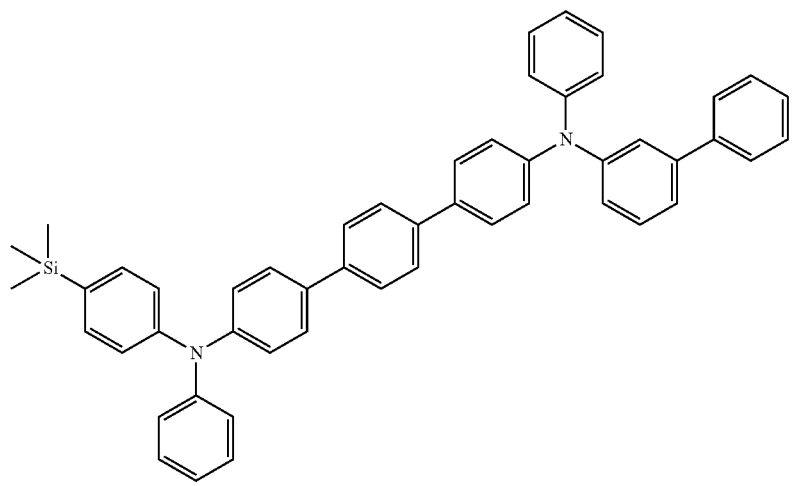
8
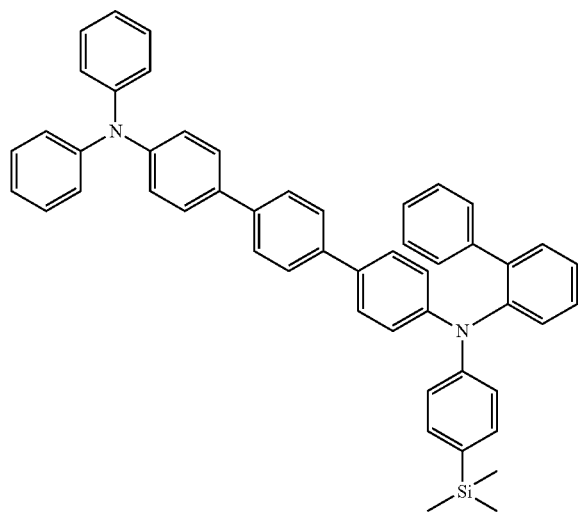
8-1
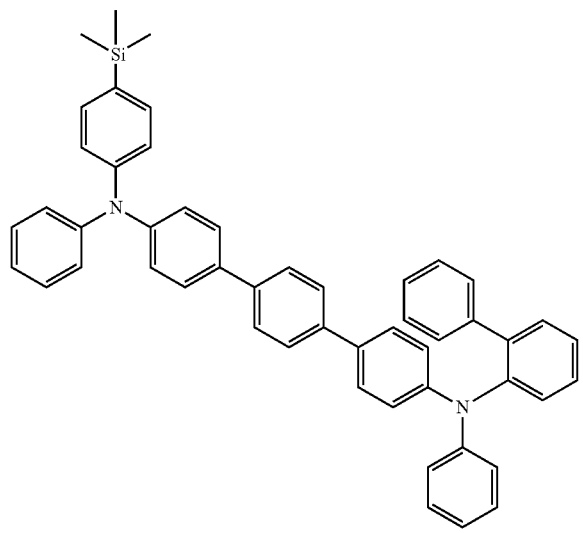
9

-continued
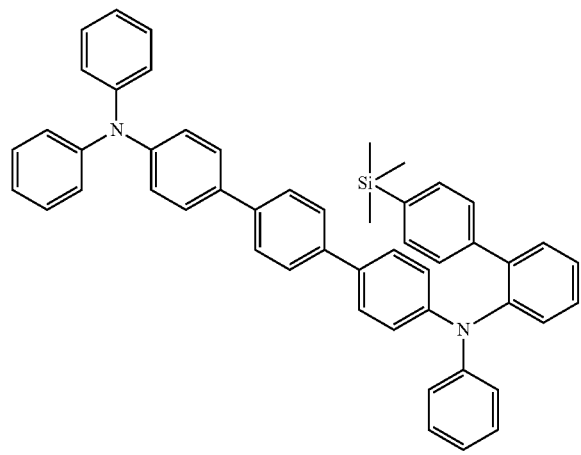
10
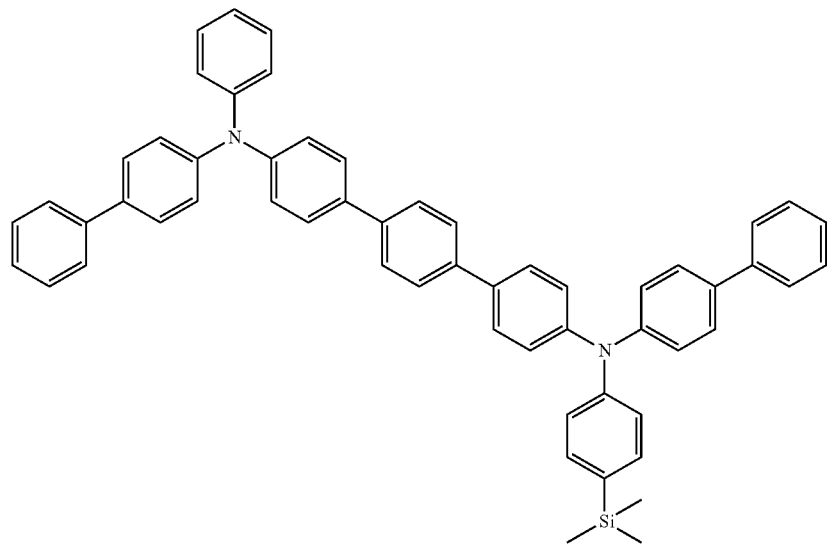
11
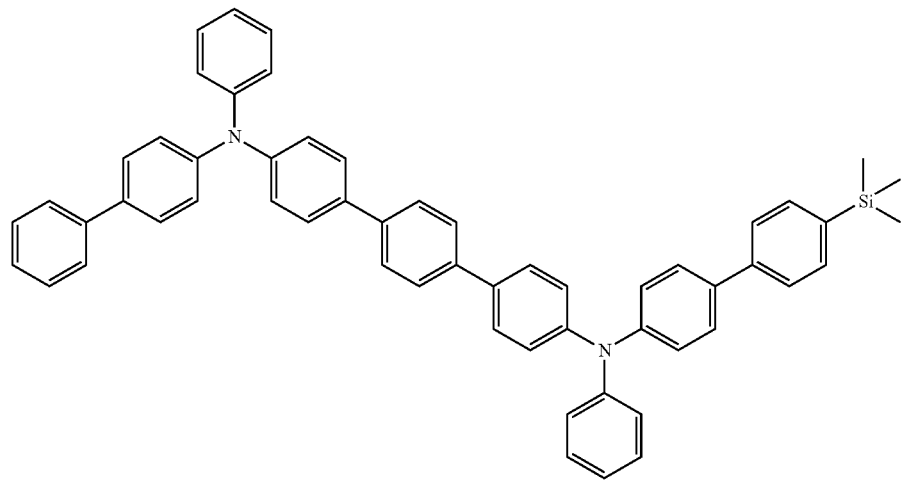
12

13
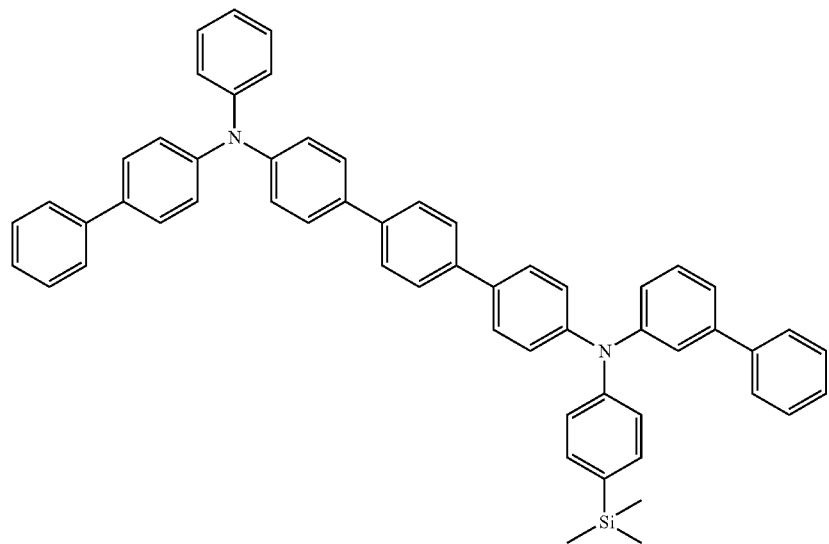
14
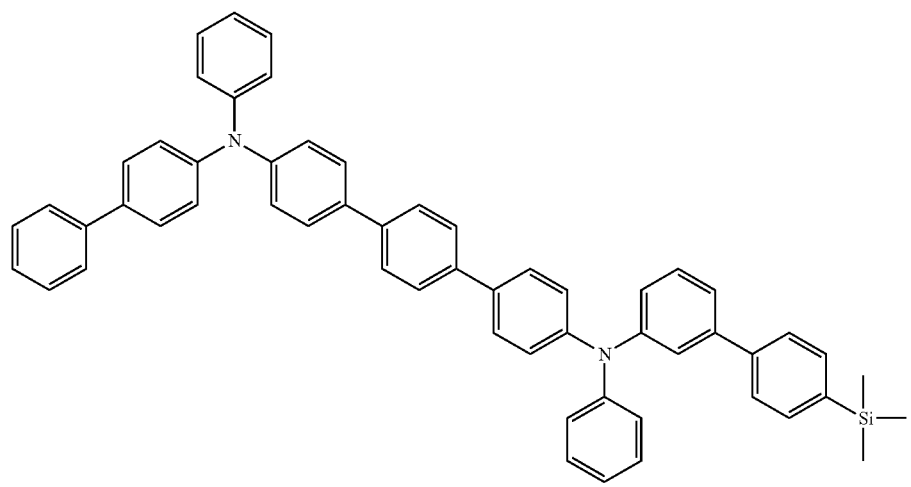
15
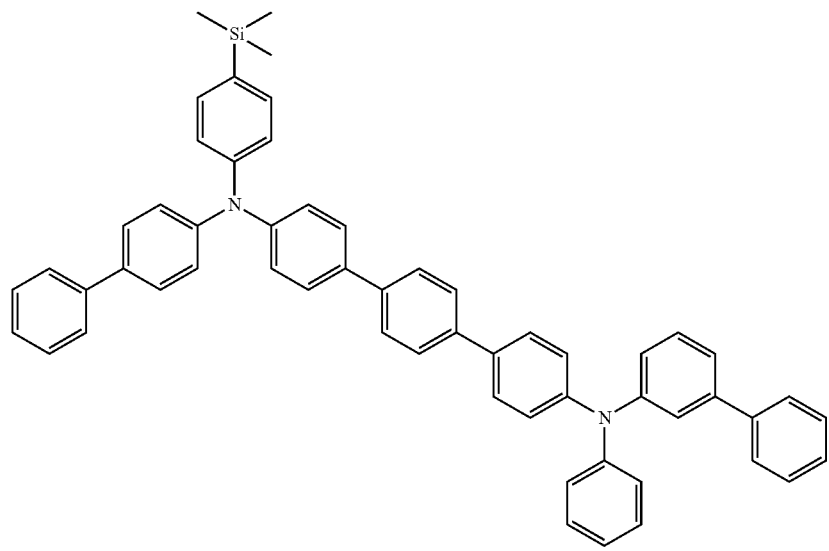

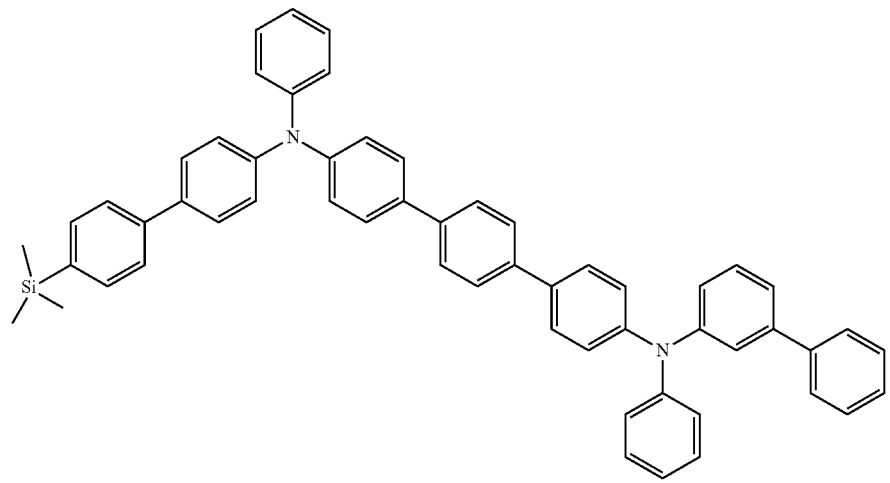
16
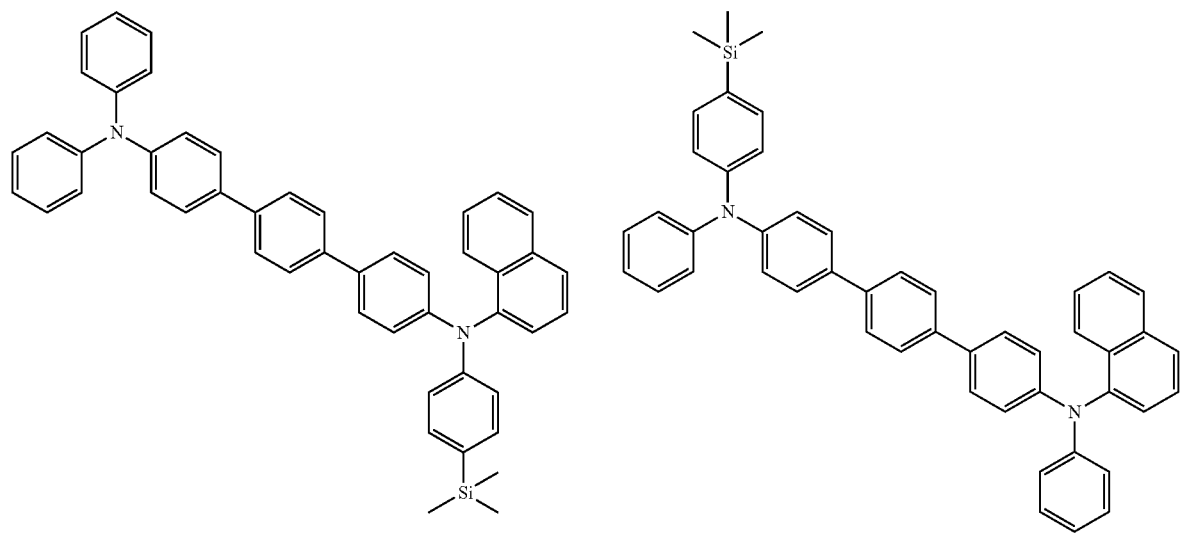
17
18
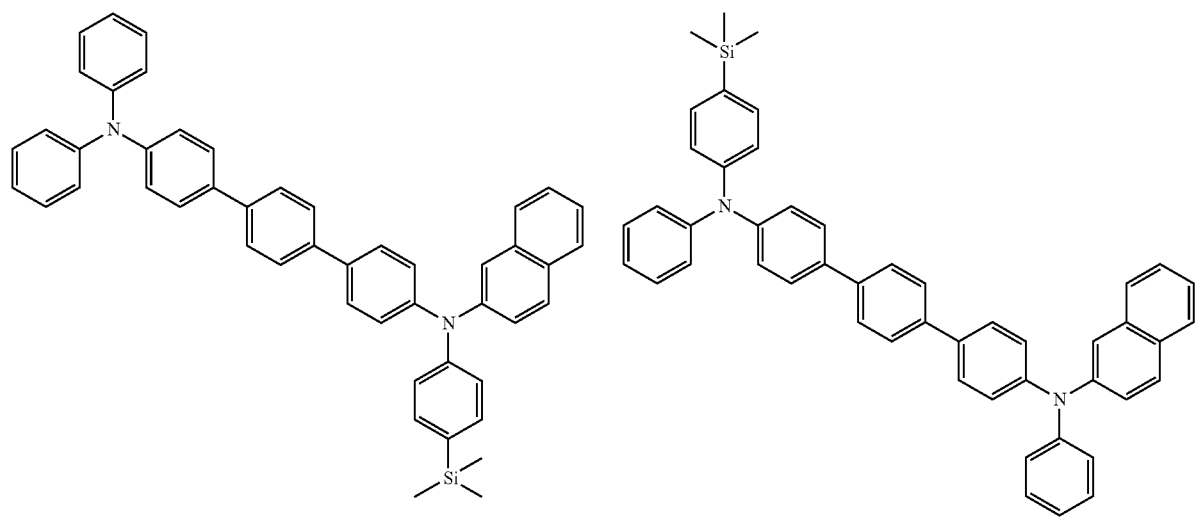
19
20

-continued
21
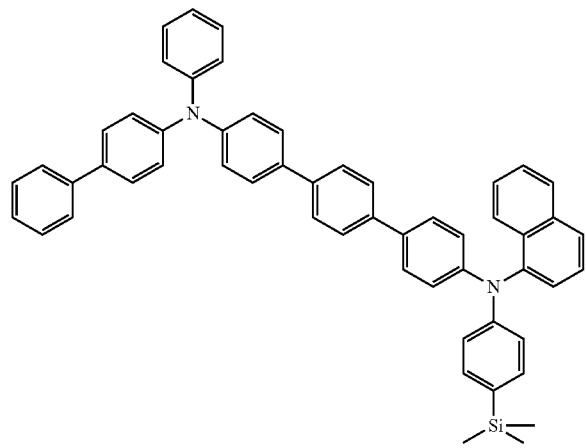
22
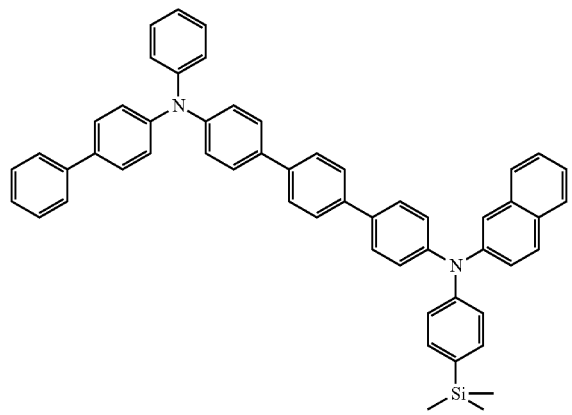
23
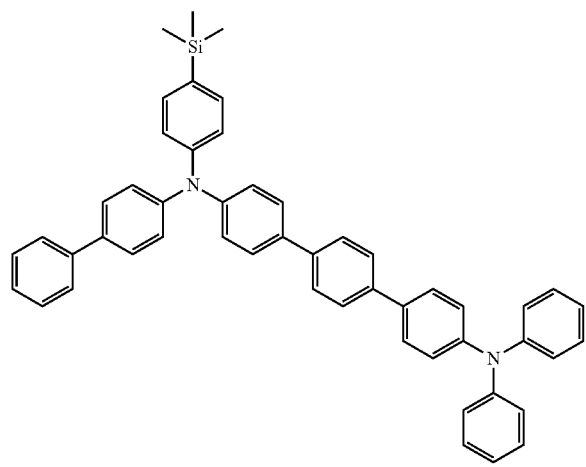
24
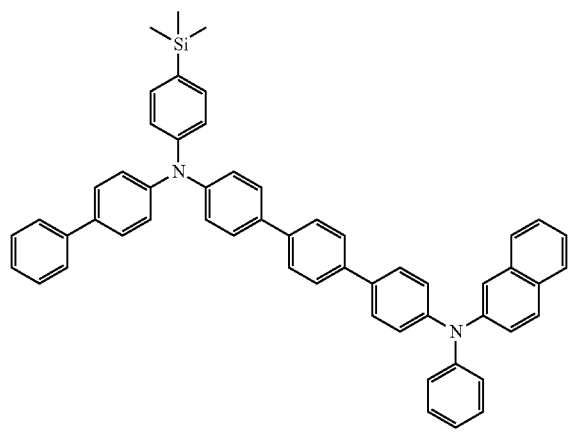
25
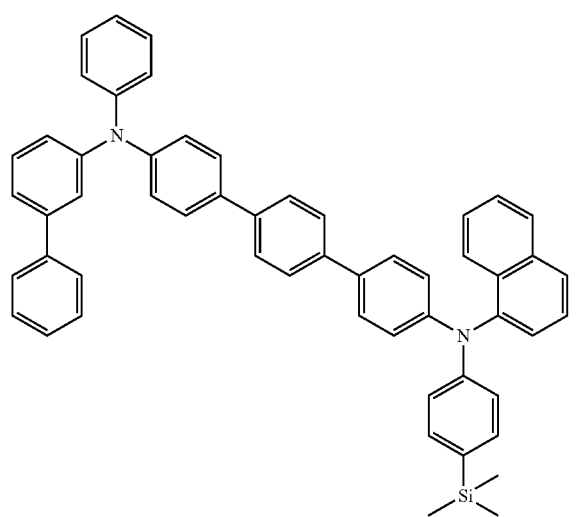
26
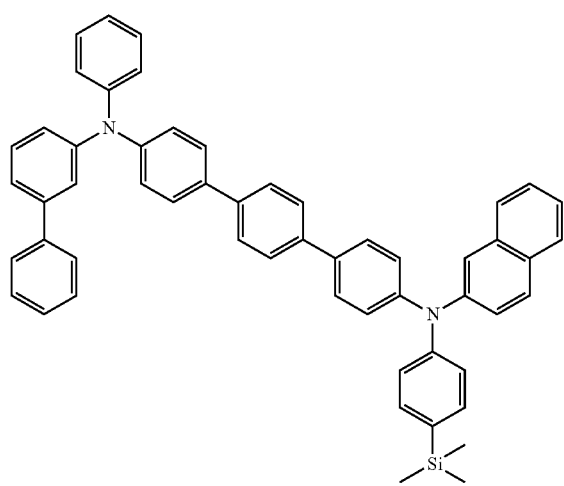

-continued
27
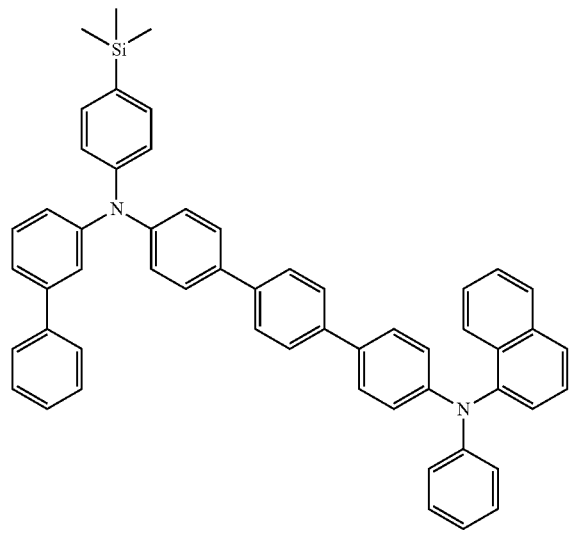
28
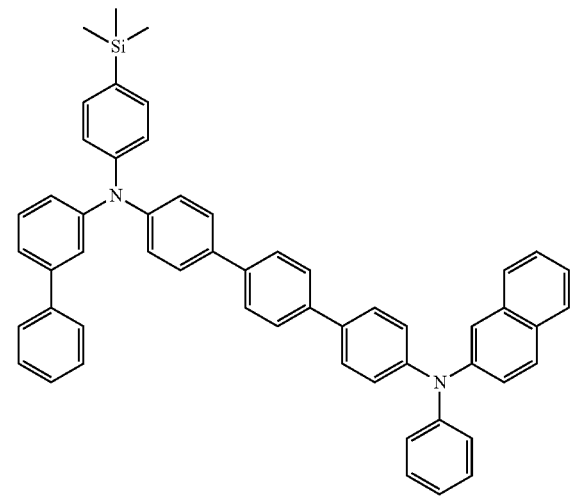
29
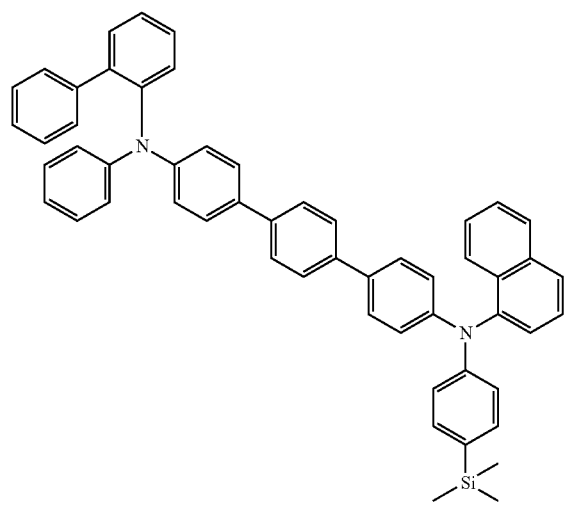
30
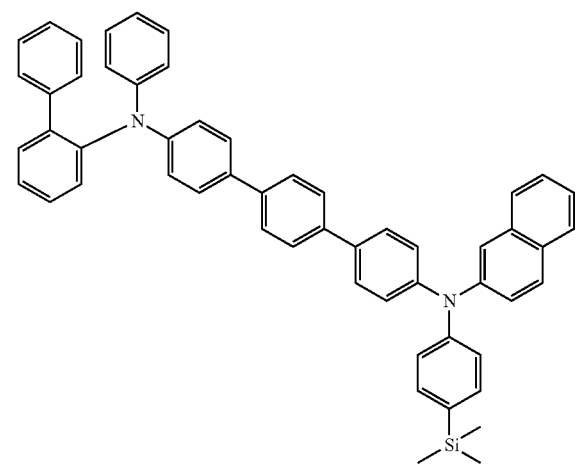
31
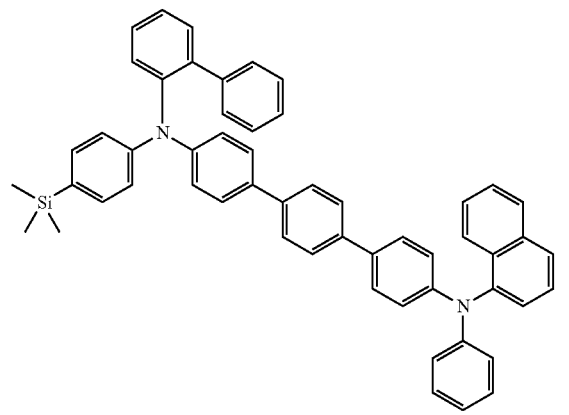
32
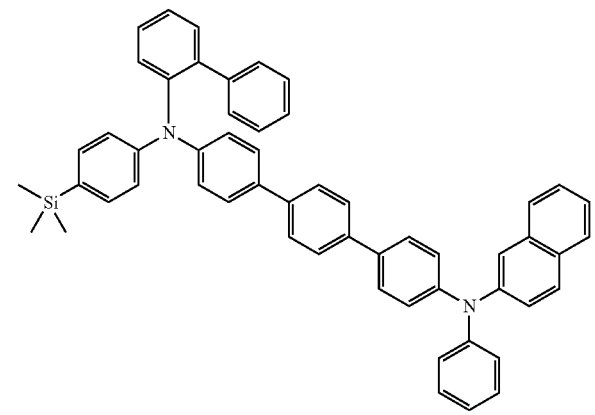

-continued
33
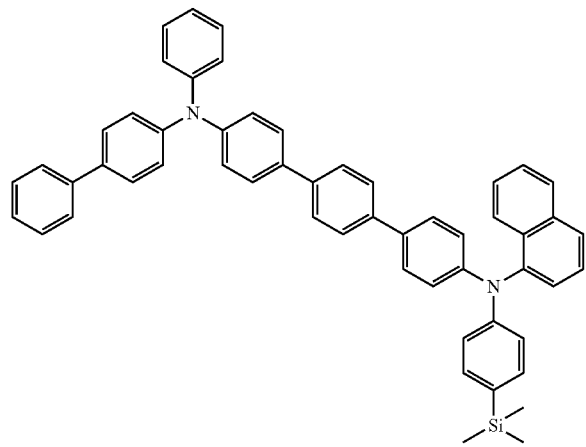
34
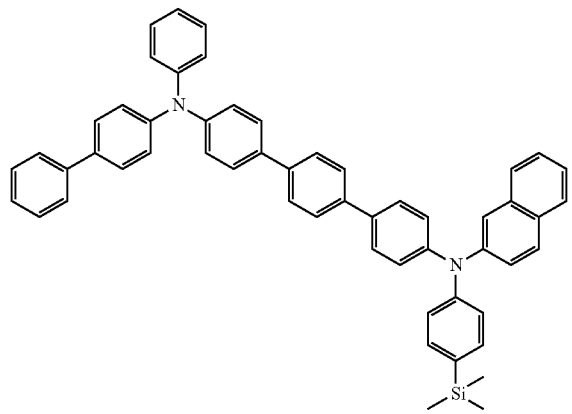
35
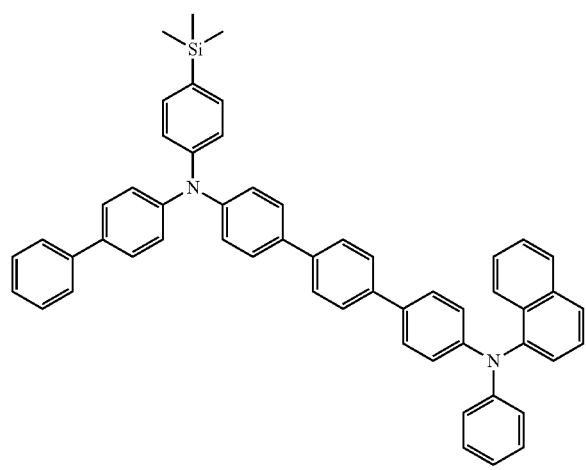
36
37
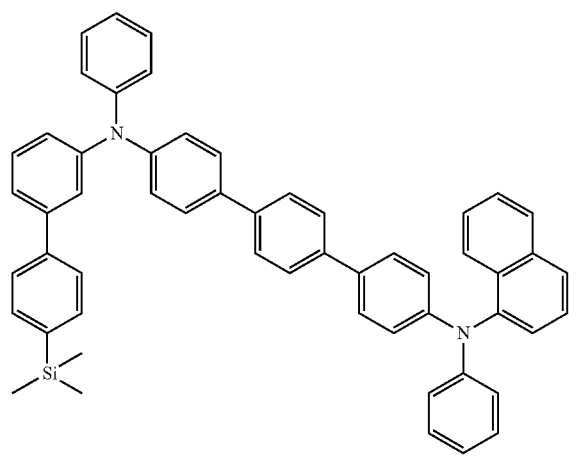
38
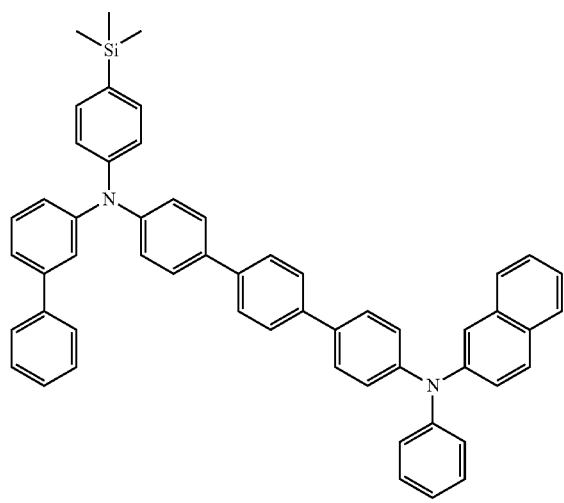

39
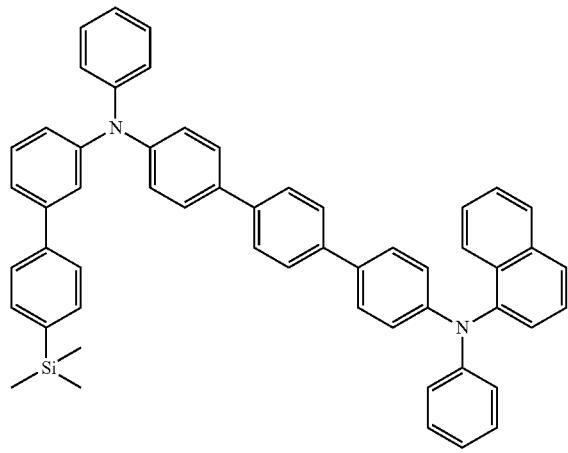
40
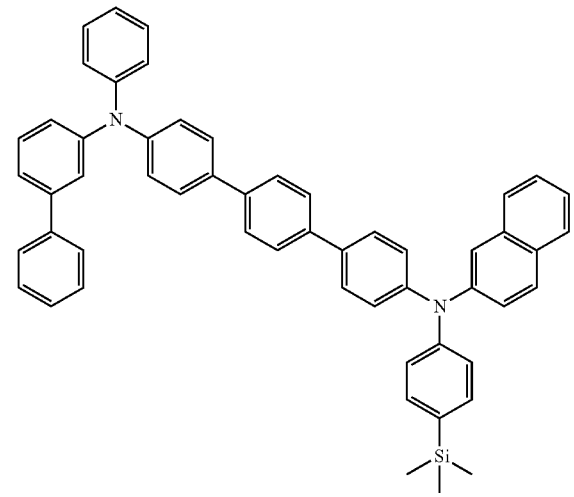
41
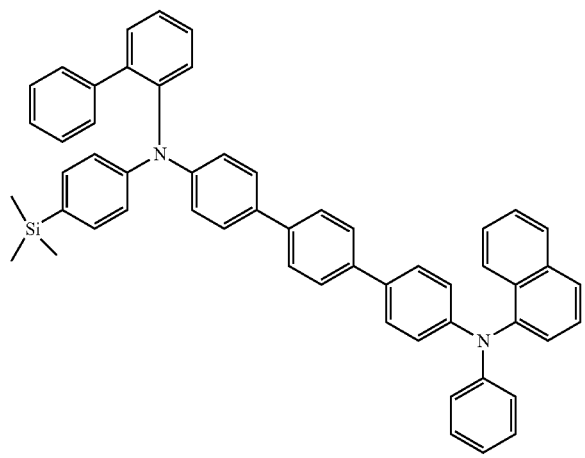
42
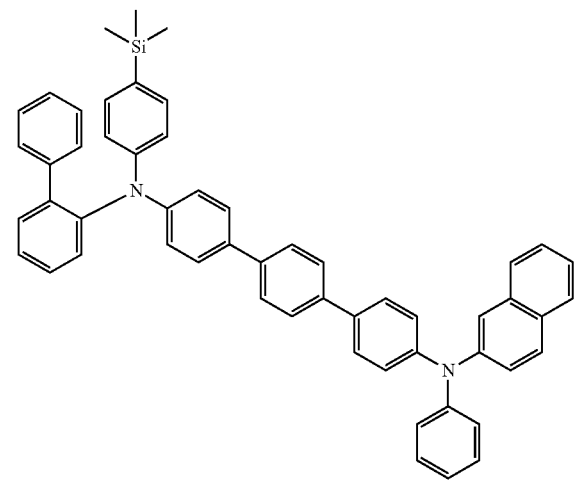
43
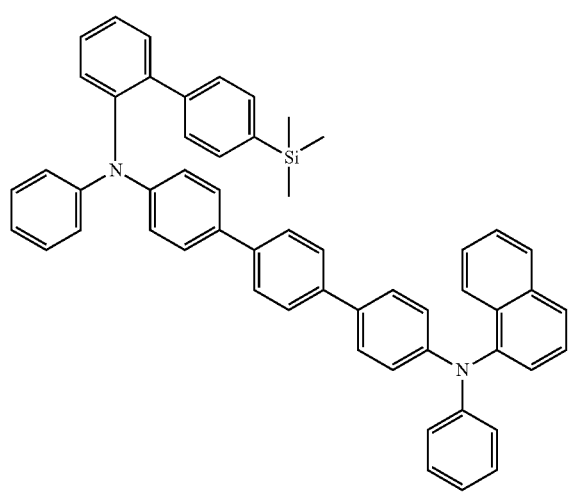
44
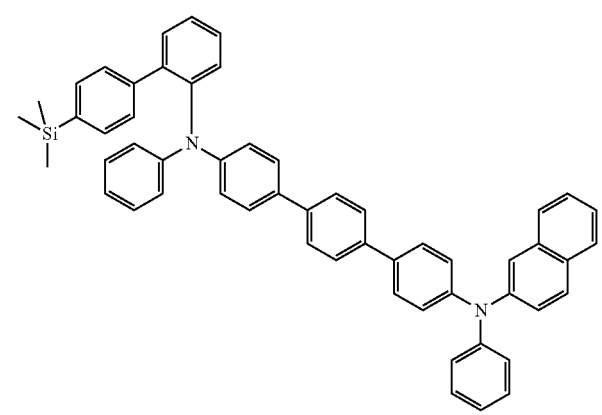

-continued
45
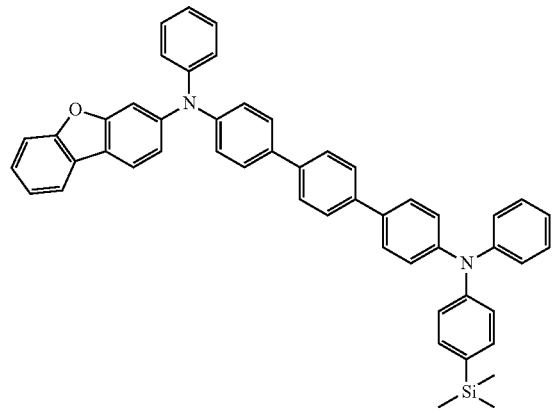
46
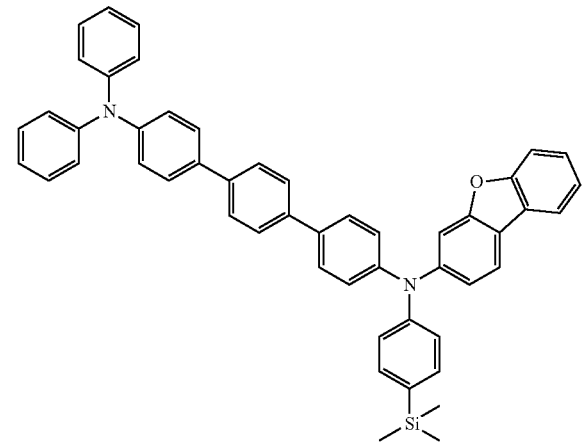
47
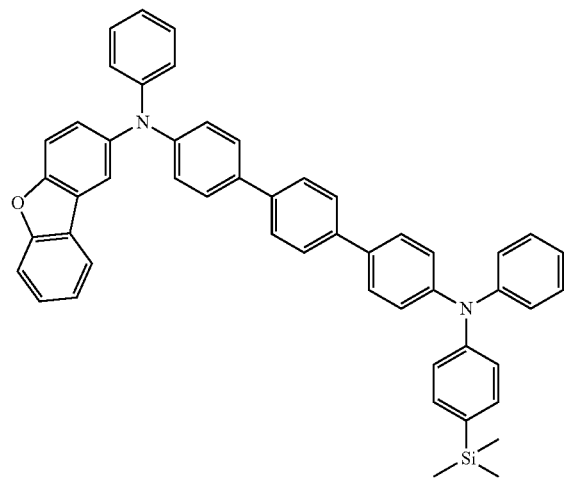
48
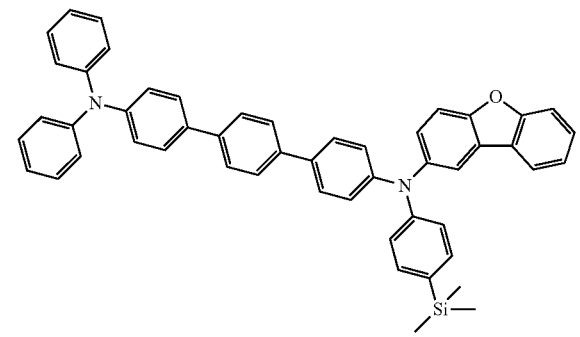
49
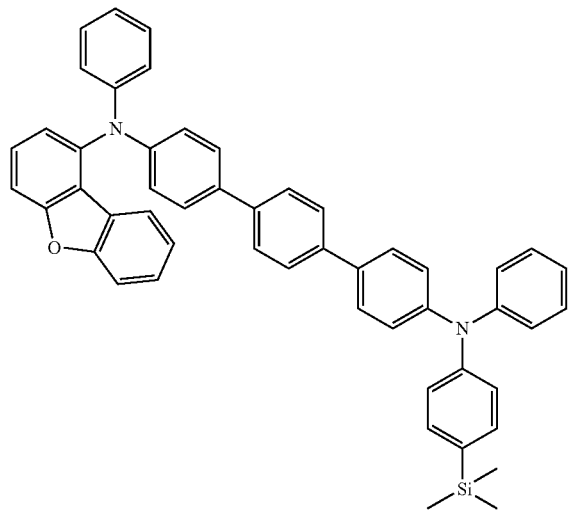
50
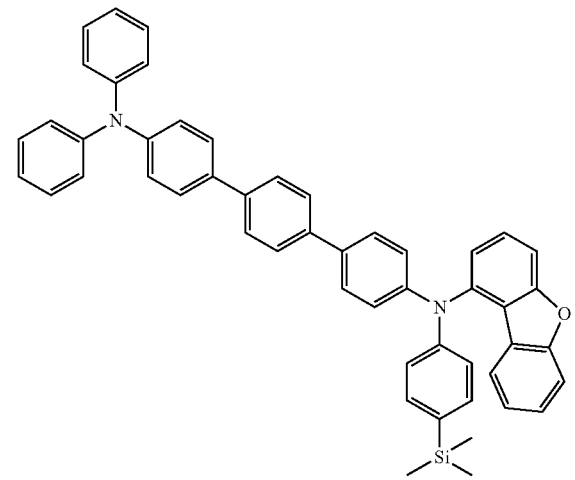

-continued
51
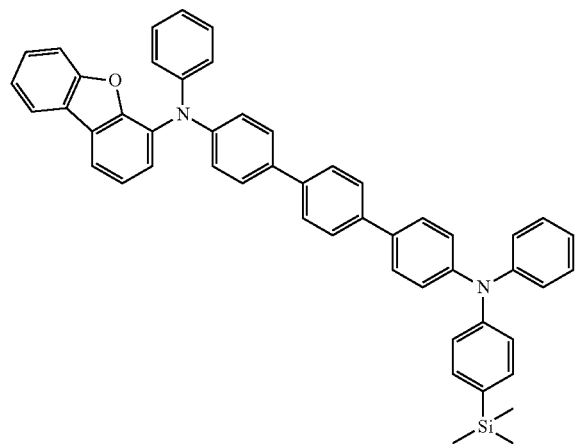
52
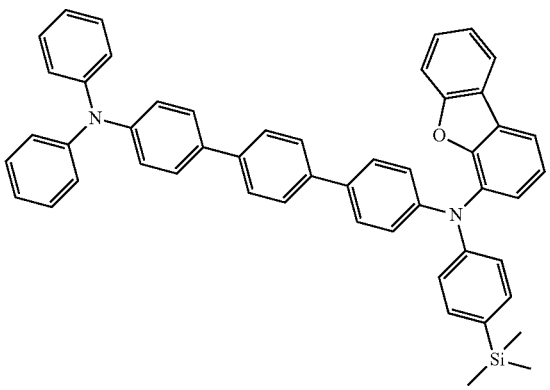
53
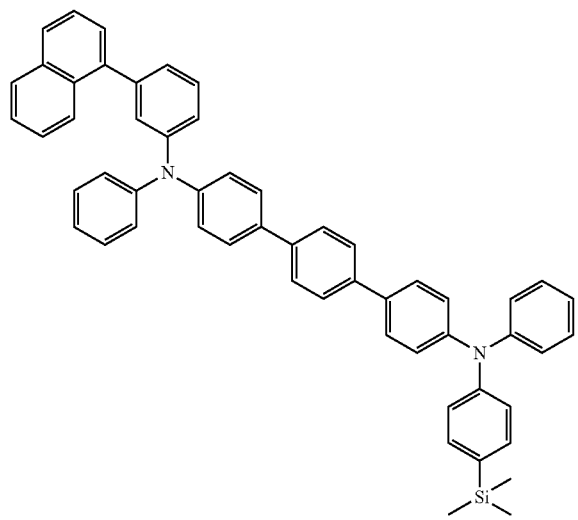
54
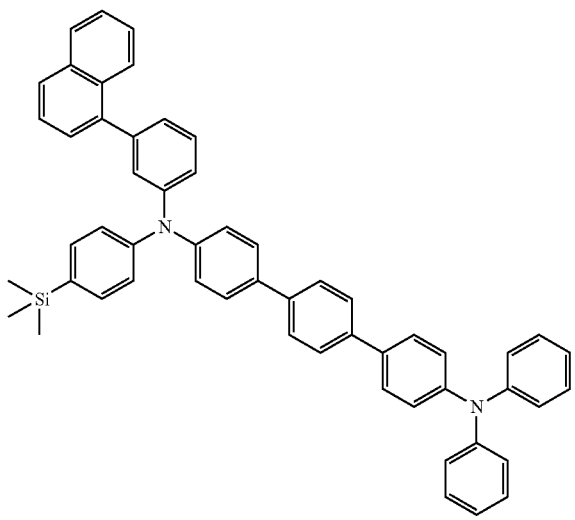
55
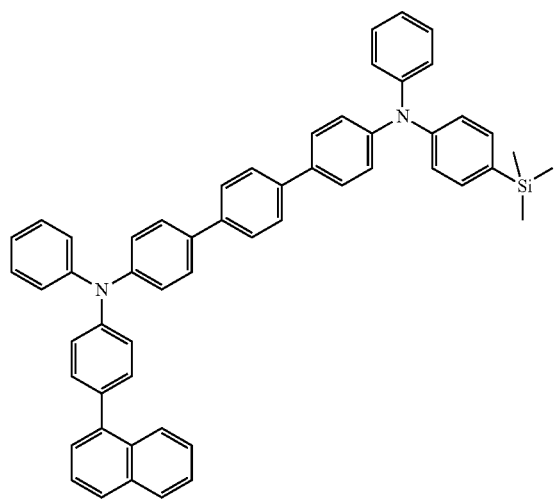
56
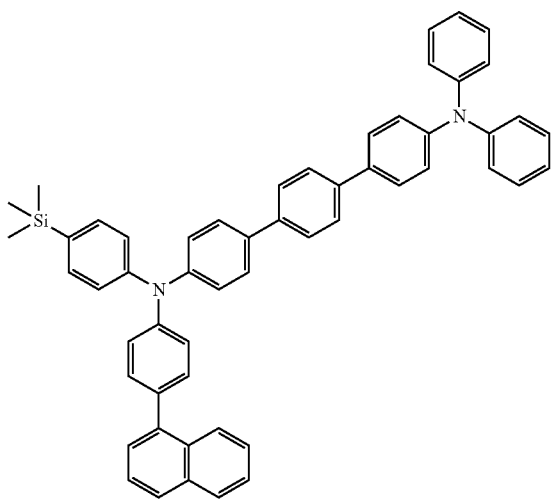

-continued
57
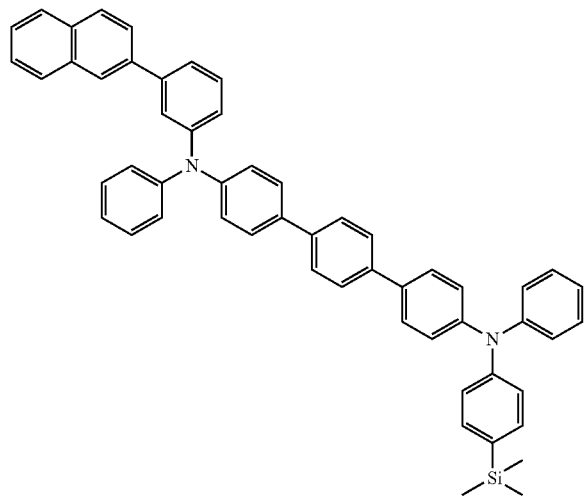
58
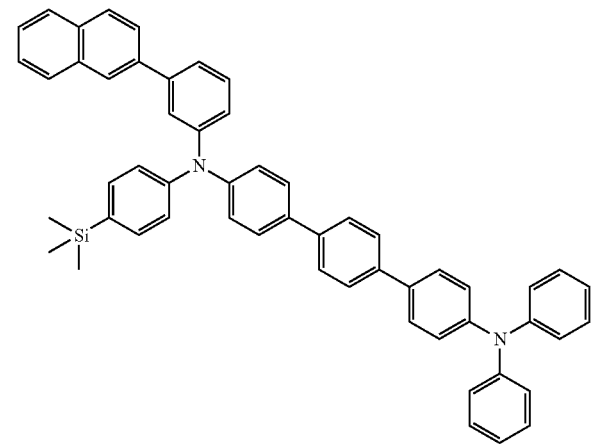
59
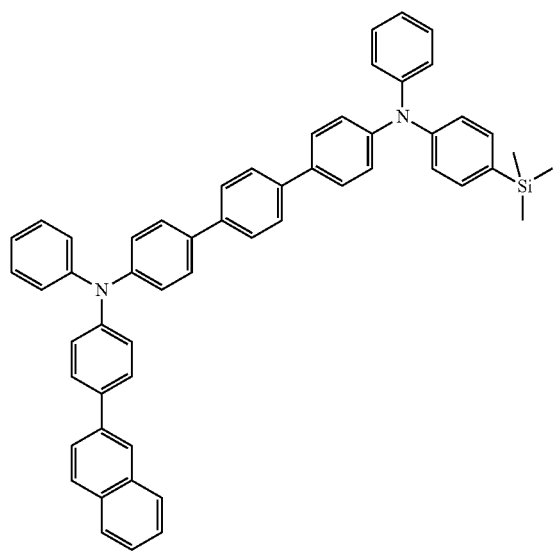
60
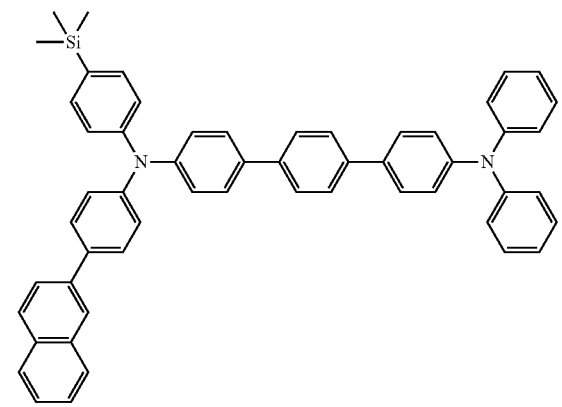
61
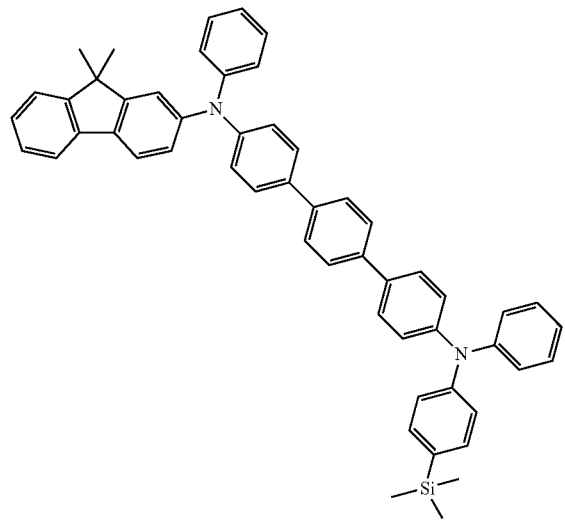
62
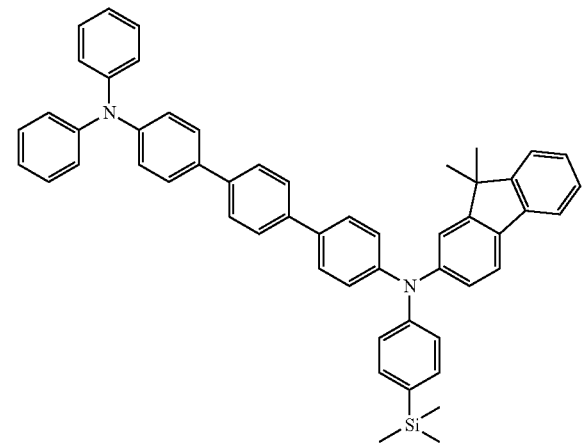

-continued
63
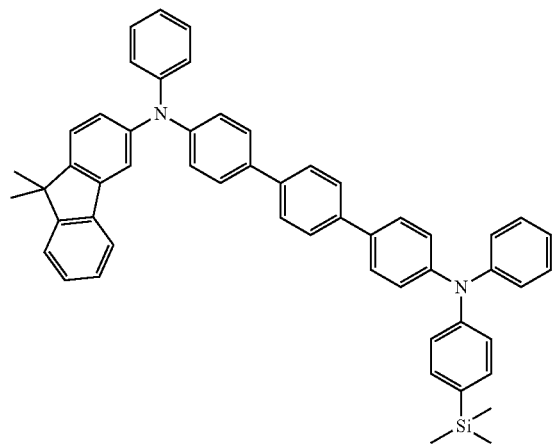
64
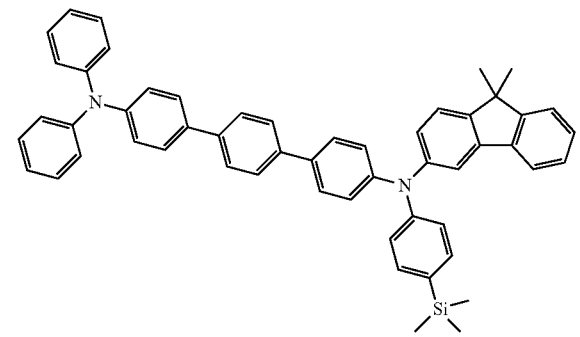
65
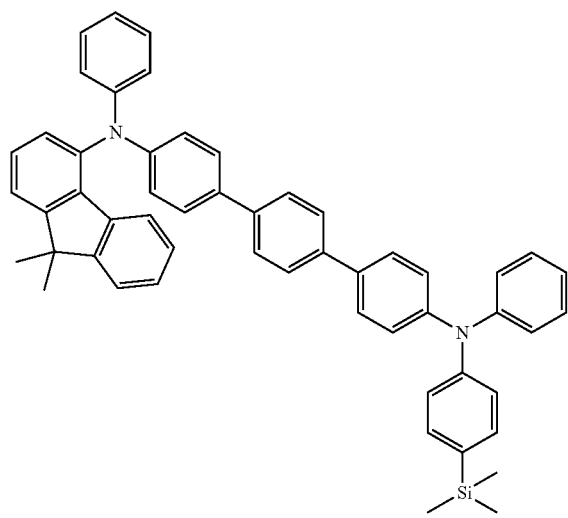
66
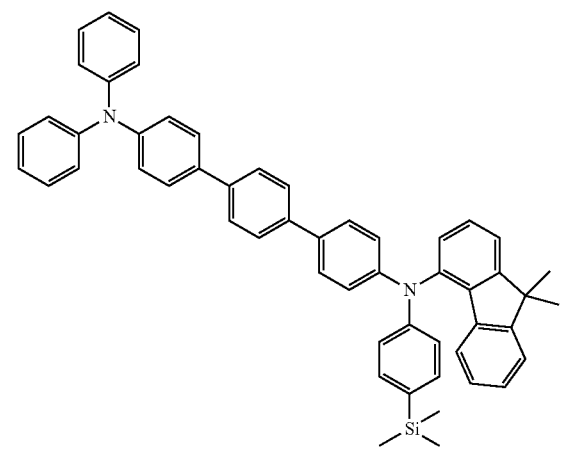
67
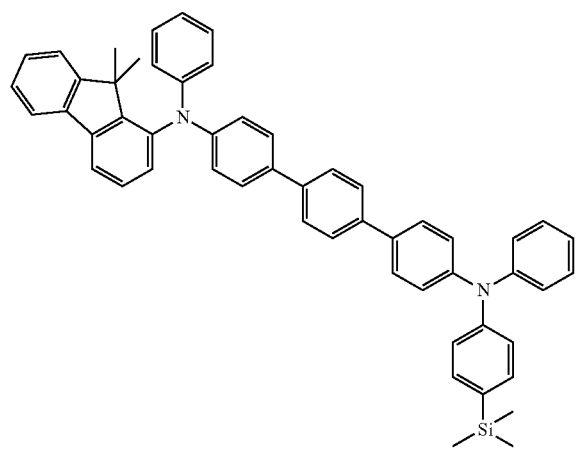
68
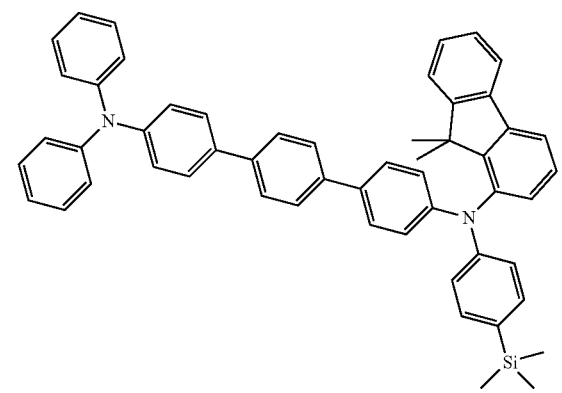

-continued
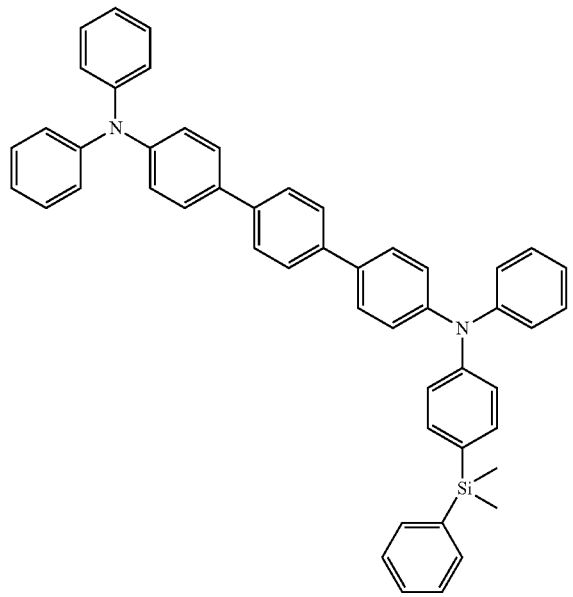

-continued
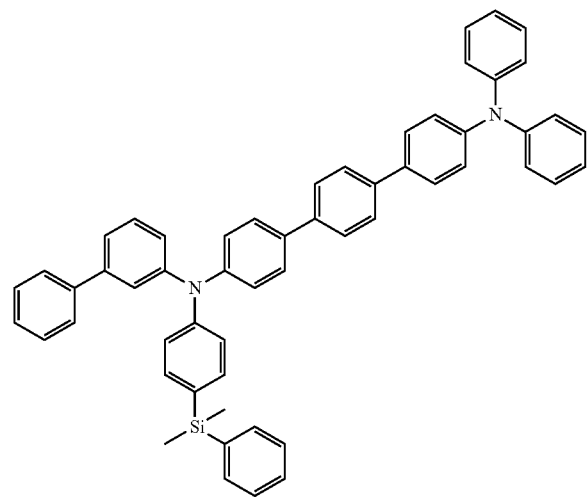
73
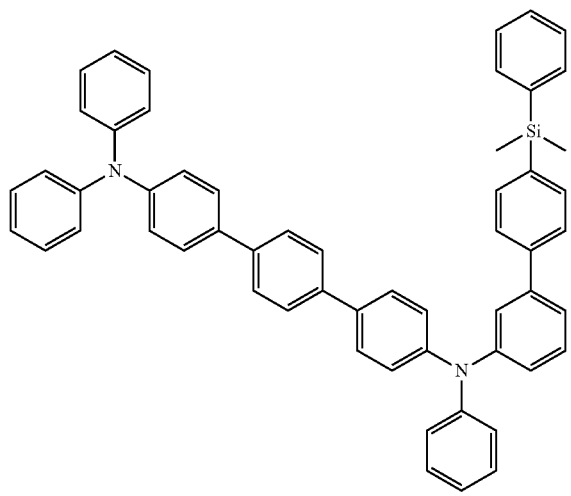
74
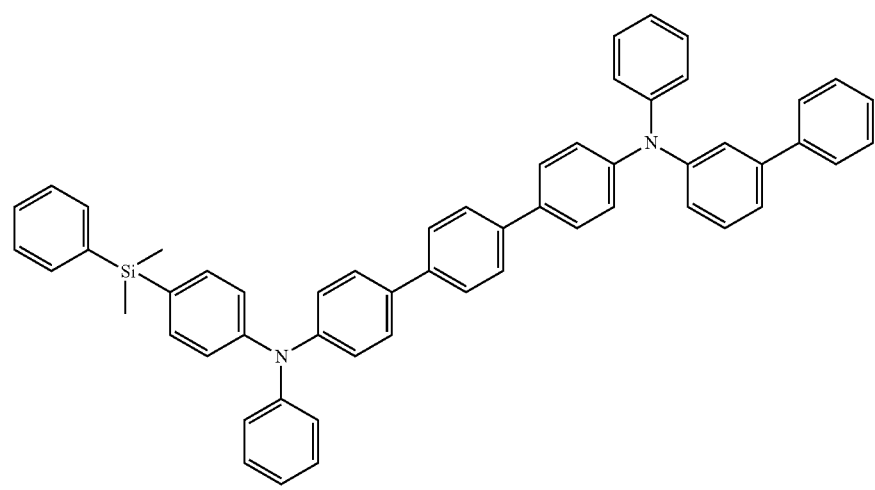
75
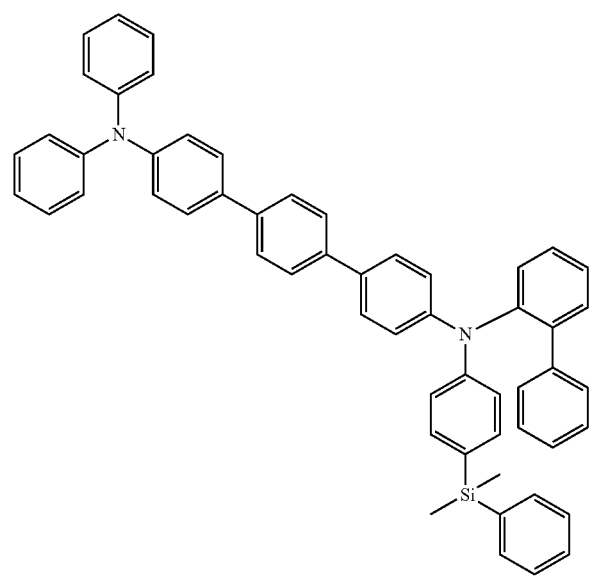
76
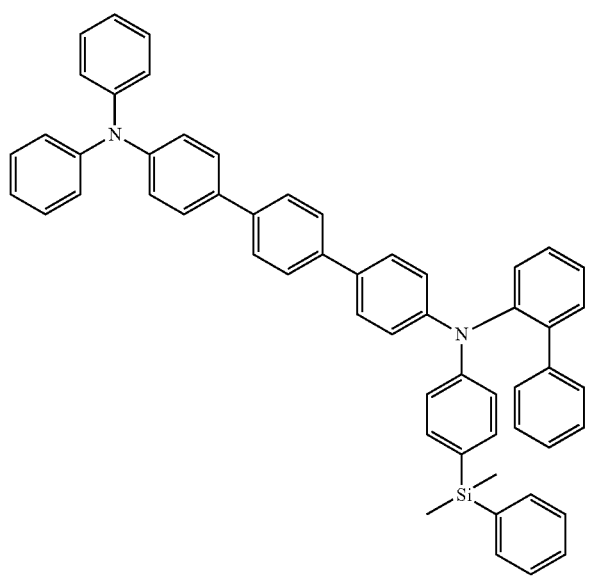
77

78
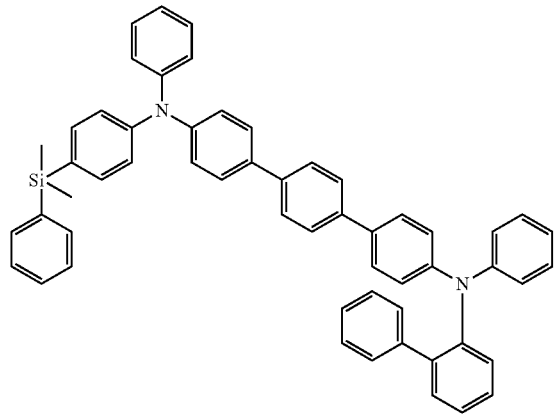
79
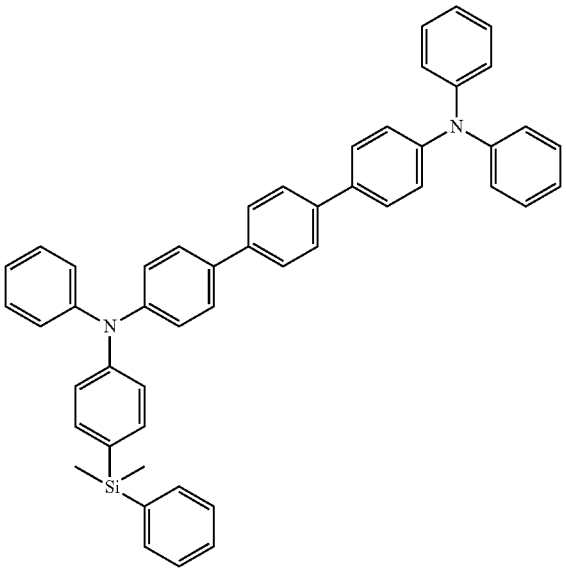
80
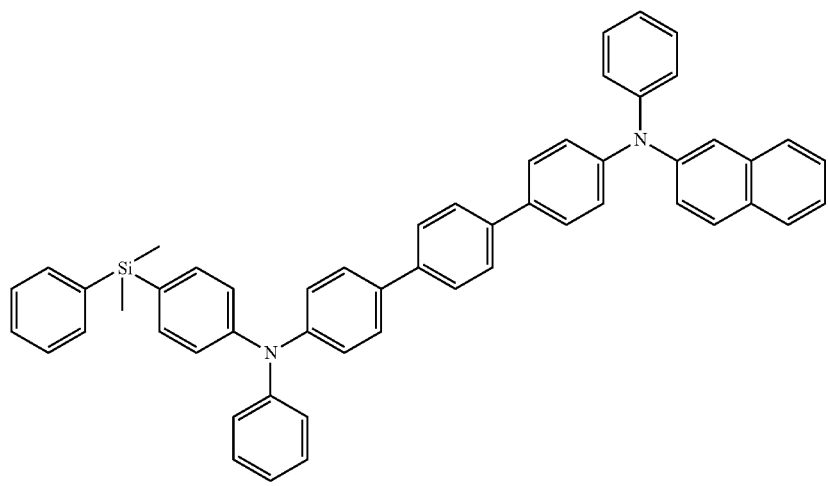
81
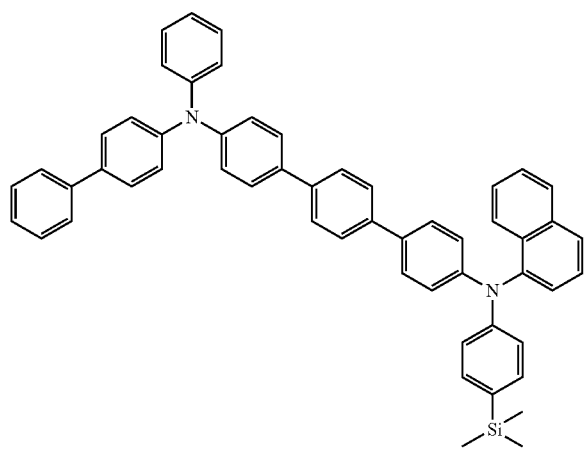
82
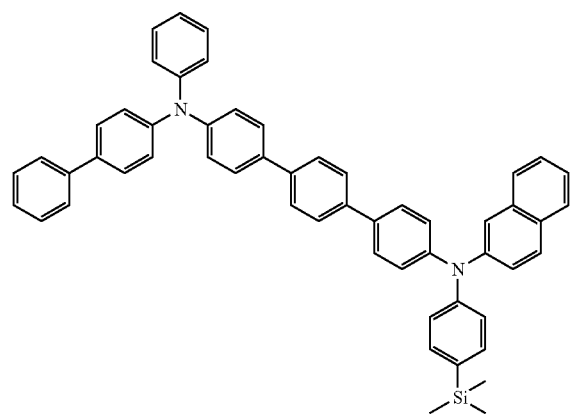

83
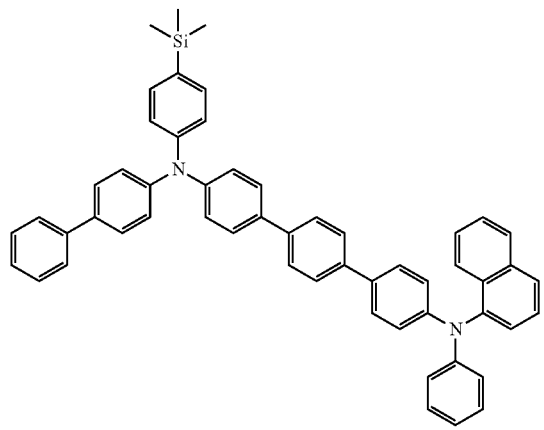
84
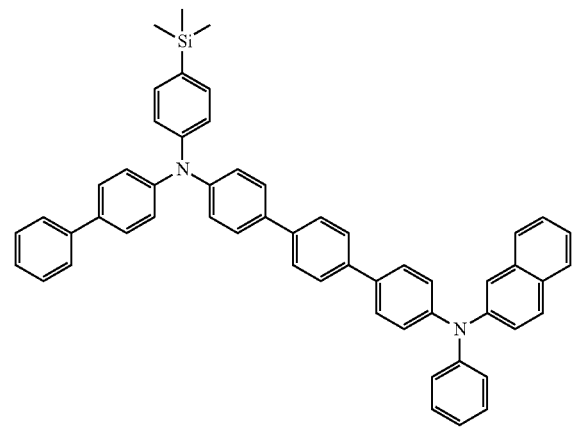
85
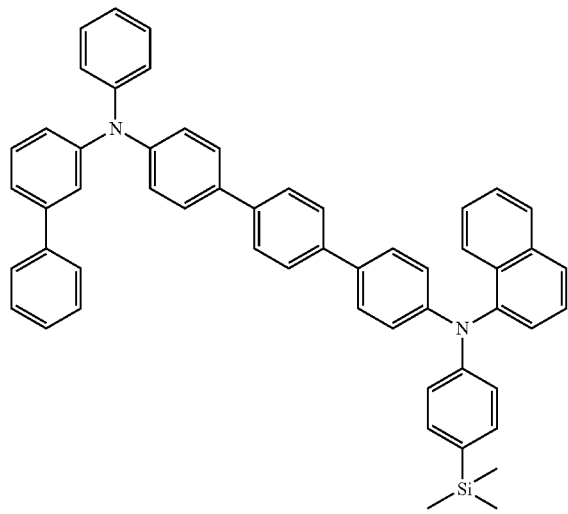
86
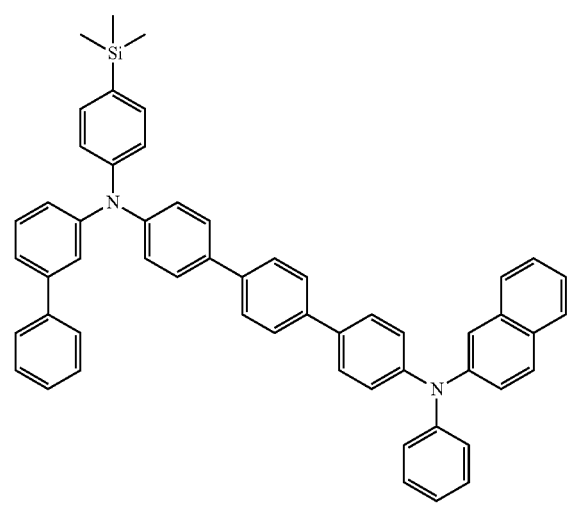
87
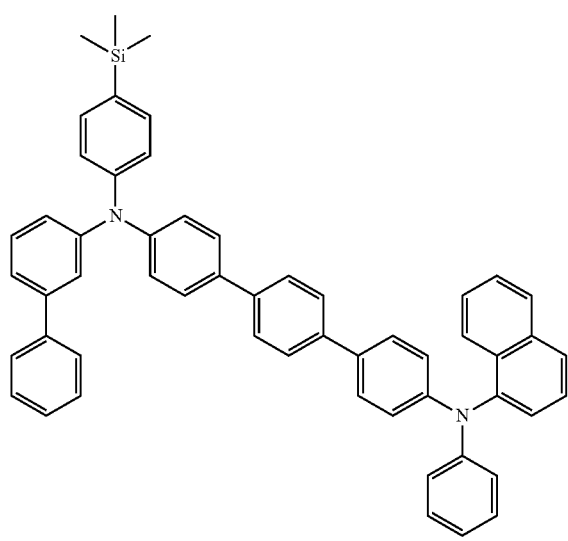
88

Referring again to FIG. 1 to FIG. 3, an organic electroluminescence device according to an embodiment of the present disclosure will be described.

As described above, the hole transport region HTR includes (e.g., is) the amine compound according to an embodiment of the present disclosure. For example, the hole transport region HTR includes (e.g., is) an amine compound represented by Formula 1.

When the hole transport region HTR has a multilayer structure having a plurality of layers, any one layer among the plurality of layers may include (e.g., be) the amine compound represented by Formula 1. For example, the hole transport region HTR includes a hole injection layer HIL disposed on the first electrode EL1 and a hole transport layer HTL disposed on the hole injection layer HIL, and the hole transport layer HTL may include (e.g., be) an amine compound represented by Formula 1. However, the present disclosure is not limited thereto. For example, the hole injection layer HIL may include (e.g., be) the amine compound represented by Formula 1.

The hole transport region HTR may include (e.g., be) one, two or more amine compounds, each represented by Formula 1. For example, the hole transport region HTR may include (e.g., be) at least one selected from among compounds represented in the above-described Compound Groups 1 to 3.

The hole transport region HTR may be formed utilizing (e.g., using) various suitable methods such as a vacuum evaporation method, a spin coating method, a cast method, a Langmuir-Blodgett (LB) method, an inkjet printing method, a laser printing method, a laser induced thermal imaging (LITI), etc.

However, the hole transport region HTR may further include (e.g., be) one or more of the following materials for each layer.

The hole injection layer HIL may include (e.g., be), for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylam ino] triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PAN I/CSA), polyaniline/poly(4-styrenesulfonate) (PANI/PSS), N,N'-di(naphthalene-1-yl)-N,N'-diphenyl-benzidine (NPD), polyetherketone containing triphenylamine (TPAPEK), 4-Isopropyl-4'-methyldiphenyliodonium [tetrakis(pentafluorophenyl)borate], dipyrazino[2,3-f: 2',3'-h] quinoxaline-2,3,6,7,10,11-hexacarbonitrile (HAT-CN), etc.

The hole transport layer HTL may include (e.g., be) typical materials known (e.g., materials generally available) in the art. For example, the hole transport layer HTL may further include (e.g., be) carbazole-based derivatives such as N-phenylcarbazole and/or polyvinylcarbazole, fluorene-based derivatives, triphenylamine-based derivatives such as N,N'-bis(3-methylphenyl)-N,N'-diphenyl-[1,1-biphenyl]-4,4'-diamine (TPD), 4,4',4"-tris(N-carbazolyl)triphenylamine (TCTA), etc., (N,N'-di(naphthalene-1-yl)-N(NPD), N'-diphenyl-benzidine), 4,4'-Cyclohexylidene bis[N,N-bis(4-methylphenyl)benzenam ine] (TAPC), 4,4'-Bis[N,N-(3-tolyl)amino]-3,3'-dimethylbiphenyl (HMTPD), 1,3-Bis(N-carbazolyl)benzene (mCP), etc.

The electron blocking layer EBL may include (e.g., be), for example, carbazole-based derivatives such as N-phenylcarbazole and/or polyvinylcarbazole, fluorine-based derivatives, Triphenylamine-based derivatives such as (N,N'-bis(3-methylphenyl)-N(TPD) and/or N'-diphenyl-[1,1-biphenyl]-4,4'-diamine), 4,4',4"-tris(N-carbazolyl) triphenylamine (TCTA), N,N'-di(naphthalene-1-yl)-N,N'-diphenyl-benzidine (NPD), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-Bis(N-carbazolyl)benzene (mCP), and/or 1,3-bis(1,8-dimethyl-9H-carbazol-9-yl)benzene (mDCP), etc.

The thickness of the hole transport region HTR may be from about 50 Å to about 15,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase in a driving voltage.

The hole transport region HTR may further include (e.g., be), in addition to the above-described materials, a charge generating material to increase conductivity. The charge generating material may be dispersed uniformly or non-uniformly in the hole transport region HTR. The charge generating material may be, for example, a p-dopant. The p-dopant may be at least one of the quinone derivatives, metal oxides, or cyano group-containing compounds, but the present disclosure is not limited thereto. For example, non-limiting examples of the p-dopant may include (e.g., be) quinone derivatives such as Tetracyanoquinodimethane (TCNQ) and/or 2,3,5,6-tetrafluoro-7,7',8,8'-tetracyanoquinodimethane (F4-TCNQ), a metal halide such as $MgF_2$, CuI, and/or RbI, and/or metal oxides such as tungsten oxide, and/or molybdenum oxide, but an embodiment of the present disclosure is not limited thereto.

As described above, the hole transport region HTR may further include at least one of a hole buffer layer or an electron blocking layer EBL. The hole buffer layer may increase light luminous efficiency by compensating for a resonance distance according to the wavelength of light emitted from the light-emitting layer EML. As a material included in the hole buffer layer, a material which may be included in the hole transport region HTR may be utilized (e.g., used). In some embodiments, the hole buffer layer may include (e.g., be) one or more of the materials that may be included in the hole transport region HTR. The electron blocking layer EBL is a layer that is to prevent or block injection of electrons from the electron transport region ETR to the hole transport region HTR.

The light-emitting layer EML is provided on the hole transport region HTR. The light-emitting layer EML may have a thickness of, for example, about 100 Å to about 1,000 Å, for example about 100 Å to about 600 Å. The light-emitting layer EML may have (e.g., may consist of) a single layer formed of (e.g., consisting of) a single material or a single layer formed of a plurality of different materials, or the light-emitting layer EML may have a multilayer structure having a plurality of layers formed of a plurality of different materials.

As the material of the light-emitting layer EML, a known or generally available light-emitting material may be utilized (e.g., used). In some embodiments, the light-emitting layer EML may include (e.g., be) a known or generally available light-emitting material. Although not particularly limited, the material of the light-emitting layer EML may be selected from among a fluoranthene derivative, a pyrene derivative, an arylacetylene derivative, an anthracene derivative, a fluorene derivative, a perylene derivative, a chrysene derivative, etc. In some embodiments, the material of the light-emitting layer EML may employ a pyrene derivative, a perylene derivative, and/or an anthracene derivative. For example, an anthracene derivative represented by Formula 10 may be utilized (e.g., used) as a host material for the light-emitting layer EML.

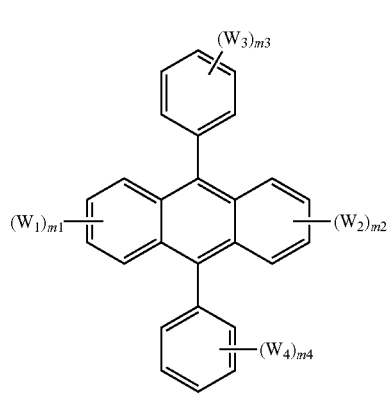

Formula 10

In Formula 10, $W_1$ to $W_4$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a ring. In formula 10, m1 and m2 are each independently an integer of 0 to 4, and m3 and m4 are each independently an integer of 0 to 5.

In some embodiments, when m1 is 1, $W_1$ is not a hydrogen atom, and when m2 is 1, $W_2$ is not a hydrogen atom. In some embodiments, when m3 is 1, $W_3$ is not a hydrogen atom, and when m4 is 1, W4 is not a hydrogen atom.

When m1 is 2 or more, a plurality of $W_1$'s are the same as or different from each other. When m2 is 2 or more, a plurality of $W_2$'s are the same as or different from each other. When m3 is 2 or more, a plurality of $W_3$'s are the same as or different from each other. When m4 is 2 or more, a plurality of $W_4$'s are the same as or different from each other.

Examples of the compound represented by Formula 10 may include (e.g., be) compounds represented by the structural formula below. However, the compound represented by Formula 10 is not limited thereto.

a-6
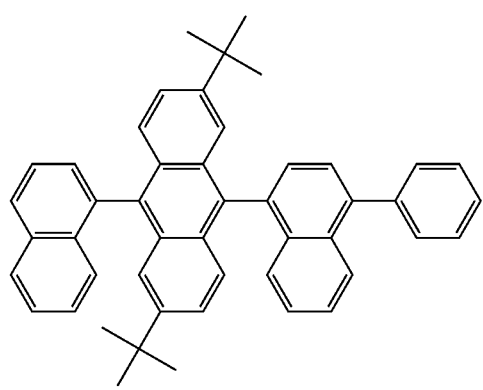
a-7
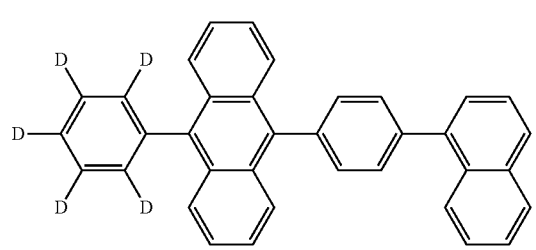
a-8
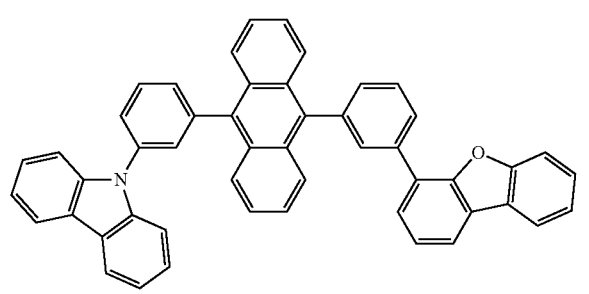
a-9
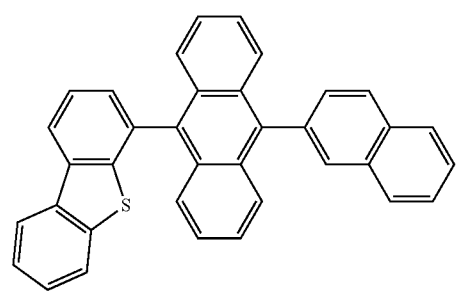
a-10
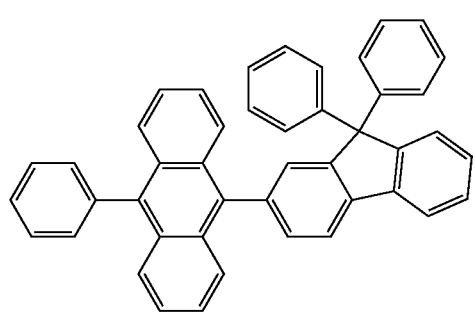
a-11
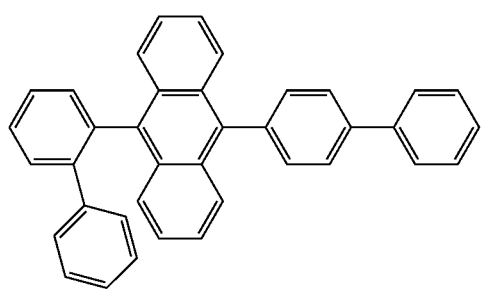
a-12
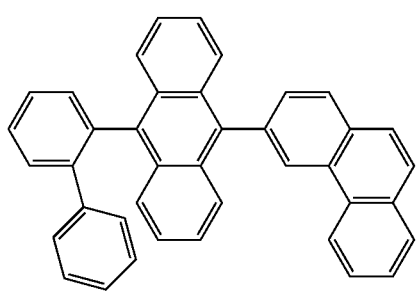
a-13
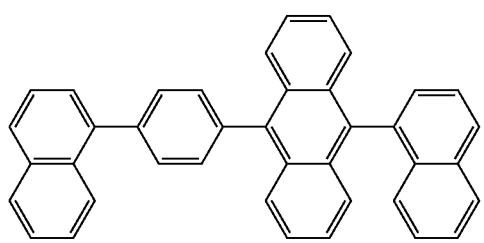
a-14
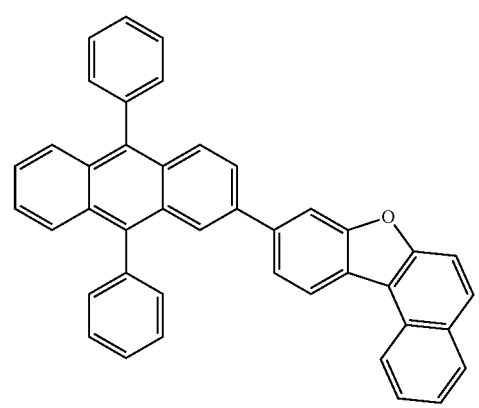

-continued a-15

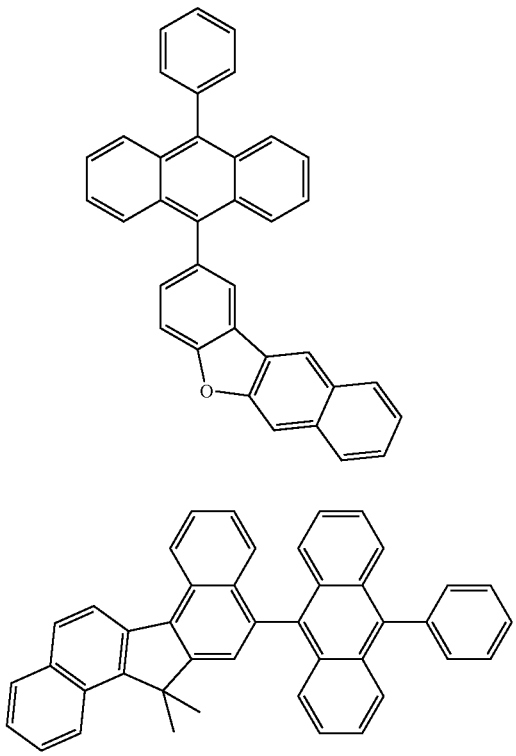

a-16

The light-emitting layer EML may include a dopant, and a generally known material may be utilized (e.g., used) as the dopant. For example, the dopant may employ (e.g., be) at least one selected from among the styryl derivatives (for example, 1,4-bis[2-(3-N-ethylcarbazoryl)vinyl]benzene (BCzVB), 4-(di-p-tolylamino)-4''-[(di-p-tolylamino)styryl] stilbene (DPAVB), 4,4'-bis[2-(4-(N,N-diphenylamino)phenyl)vinyl]biphenyl (DPAVBi), N-(4-((E)-2-(6-((E)-4-(diphenylamino)styryl)naphthalen-2-Avinyl)phenyl)-N-phenylbenzenamine (N-BDAVBi)), perylene and perylene derivatives (for example, 2,5,8,11-tetra-t-butylperylene (TBPe)), pyrene and pyrene derivatives (for example, 1,1-dipyrene, 1,4-dipyrenylbenzene, 1,4-Bis(N,N-Diphenylamino)pyrene, 1,6-Bis(N,N-Diphenylamino)pyrene), 2,5,8,11-Tetra-t-butylperylene (TBP), and TPBi(1,3,5-tris (1-phenyl-1H-benzo[d]imidazole-2-yl)benzene), but an embodiment of the present disclosure is not limited thereto.

The light-emitting layer EML may include a host material. For example, the light-emitting layer EML may include (e.g., be), as a host material, at least one selected from among tris(8-hydroxyquinolino)aluminum (Alq₃), Bis[2-(diphenylphosphino)phenyl] ether oxide (DPEPO), 4,4'-Bis (carbazol-9-yl)biphenyl (CBP), 1,3-Bis(carbazol-9-yl)benzene(mCP), 2,8-Bis(diphenylphosphoryl)dibenzo[b,d]furan (PPF), 4,4',4''-Tris(carbazol-9-yl)-triphenylamine(TCTA), poly(N-vinylcarbazole(PVK), 9,10-di(naphthalene-2-yl)anthracene(ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis (naphthalen-2-yl)anthracene (MADN), Hexaphenyl cyclotriphosphazene (CP1), 1,4-Bis(triphenylsilyl)benzene (UGH-2), Hexaphenylcyclotrisiloxane (DPSiO₃), Octaphenylcyclotetra siloxane (DPSiO₄), 2,8-Bis(diphenylphosphoryl)dibenzofuran (PPF) and 1,3,5-tris(1-phenyl-1H-benzo [d]imidazole-2-yl)benzene (TPBi), but an embodiment of the present disclosure is not limited thereto.

When the light-emitting layer EML is to emit red light, the light-emitting layer EML may further include (e.g., be), for example, a fluorescent material containing tris(dibenzoylmethanato)phenanthoroline europium (PBD: Eu(DBM)₃ (Phen)) and/or perylene. When the light-emitting layer EML is to emit red light, the dopant included in the light-emitting layer EML may be at least one selected from among, for example, a metal complex and an organometallic complex such as, for example, at least one selected from among acac(bis(1-phenylisoquinoline)acetylacetonate iridium) (PIQIr), acac(bis(1-phenylquinoline)acetylacetonate iridium) (PQIr), tris(1-phenylquinoline)iridium (PQIr) and octaethylporphyrin platinum (PtOEP), rubrene and a derivative thereof, and 4-dicyanomethylene-2-(p-dimethylaminostyryl)-6-methyl-4H-pyran (DCM) and a derivative thereof.

When the light-emitting layer EML is to emit green light, the light-emitting layer may further include (e.g., be), for example, a fluorescent material containing tris(8-hydroxyquinolino)aluminum (Alq₃). When the light-emitting layer EML is to emit green light, the dopant included in the light-emitting layer EML may be at least one selected from among, for example, a metal complex and an organometallic complex such as, for example, at least one selected from among Ir(ppy)₃(fac-tris(2-phenylpyridine)iridium), and coumarin and a derivative thereof.

When the light-emitting layer EML is to emit blue light, the light-emitting layer EML may further include (e.g., be), for example, a fluorescent material including (e.g., be) at least one selected from the group consisting of spiro-DPVBi, spiro-6P, distyryl-benzene (DSB), distyryl-arylene (DSA), polyfluorene (PFO)-based polymer and poly (p-phenylene vinylene) (PPV)-based polymer. When the light-emitting layer EML is to emit blue light, for example, the dopant included in the light-emitting layer EML may be selected from among a metal complex such as (4,6-F2ppy) 2Irpic, an organometallic complex, and perylene and a derivative thereof.

The electron transport region ETR is provided on the light-emitting layer EML. The electron transport region ETR may include at least one of a hole blocking layer HBL, an electron transport layer ETL, or an electron injection layer EIL, but an embodiment of the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single-layer structure of an electron injection layer EIL or an electron transport layer ETL. In some embodiments, the electron transport region ETR may have a single-layer structure formed of an electron injection material and/or an electron transport material. Also, an electron transport region ETR may have a single-layer structure formed of a plurality of different materials, or may have a structure in which an electron transport layer ETL/an electron injection layer EIL, a hole blocking layer HBL/an electron transport layer ETL/an electron injection layer EIL are stacked in the stated order (e.g., in sequence) from the light-emitting layer EML. For example, in some embodiments, the electron transport region ETR may have a structure in which an electron transport layer ETL and an electron injection layer EIL are stacked in sequence from the light-emitting layer EML. In some embodiments, a hole blocking layer HBL, an electron transport layer ETL, and an electron injection layer EIL are stacked in sequence from the light-emitting layer EML. However, an embodiment of the present disclosure is not limited thereto. The thickness of the electron transport region ETR may be, for example, about 100 Å to about 1500 Å.

The electron transport region ETR may be formed utilizing (e.g., using) various suitable methods such as, a vacuum evaporation method, a spin coating method, a cast method, a Langmuir-Blodgett (LB) method, an inkjet printing method, a laser printing method, laser induced thermal imaging (LITI), etc.

When the electron transport region ETR includes the electron transport layer ETL, the electron transport region ETR may contain an anthracene-based compound. However, an embodiment of the present disclosure is not limited thereto. In some embodiments, the electron transport region ETR may include (e.g., be), for example, Tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-ylphenyl)-9,10-dinaphthylanthracene, 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato) aluminum (BAlq), berylliumbis(benzoquinolin-10-olate ($Bebq_2$), 9,10-di(naphthalene-2-yl)anthracene (ADN), or a mixture thereof. The thickness of the electron transport layer(s) ETL may be about 100 Å to about 1,000 Å, for example, about 150 Å to about 500 Å. When the thickness of the electron transport layer(s) ETL satisfies the above-described range, satisfactory electron transport properties may be obtained without a substantial increase in driving voltage.

When the electron transport region ETR includes the electron injection layer EIL, the electron transport region ETR may be utilize (e.g., use) a metal halide such as LiF, NaCl, CsF, RbCl, and/or RbI, a lanthanum group metal such as Yb, a metal oxide such as $Li_2O$ and/or BaO, and/or an 8-hydroxyl-Lithium quinolate (LiQ), etc. However, an embodiment of the present disclosure is not limited thereto. The electron injection layer EIL may also be made of a mixture of an electron transport material and an insulating organometal salt. In some embodiments, the electron injection layer EIL may include (e.g., be) a mixture of an electron injection material and an insulating organometal salt. The organometal salt may be a material having an energy band gap of approximately 4 eV or more. In some embodiments, the organometal salt may include (e.g., be), for example, metal acetate, metal benzoate, metal acetoacetate, metal acetylacetonate, and/or metal stearate. The thickness of the electron injection layer(s) EIL may be about 1 Å to about 100 Å, for example, about 3 Å to about 90 Å. When the thickness of the electron injection layer(s) EIL satisfies the above-described range, satisfactory electron injection properties may be obtained without a substantial increase in driving voltage.

As described above, the electron transport region ETR may include a hole blocking layer HBL. The hole blocking layer HBL may include (e.g., be), for example, at least one of 2,9-dimethyl-4,7-diphenyl-1,10-phenanthroline (BCP), bis[2-(diphenylphosphino)phenyl]ether oxide (DPEPO) or bphen(4,7-diphenyl-1,10-phenanthroline), but an embodiment of the present disclosure is not limited thereto.

The second electrode EL2 is provided on the electron transport region ETR. The second electrode EL2 may be a common electrode and/or a negative electrode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include (e.g., be) Ag, Mg, Cu, Al, Pt, Pd, Au, Ni, Nd, Ir, Cr, Li, Ca, LiF/Ca, LiF/Al, Mo, Ti, or a compound or mixture containing the same (for example, a mixture of Ag and Mg). In some embodiments, the second electrode EL2 may have a multilayer structure including a reflective film and/or a semi-transmissive film formed of at least one selected from the above materials, and a transparent conductive film formed of indium tin oxide (ITO), indium zinc oxide (IZO), zinc oxide (ZnO), and/or indium tin zinc oxide (ITZO), etc.

In some embodiments, the second electrode EL2 may be connected to an auxiliary electrode. When the second electrode EL2 is connected to the auxiliary electrode, the resistance of the second electrode EL2 may be reduced.

Meanwhile, referring to FIG. 4, the organic electroluminescence device 10 according to an embodiment may further include a capping layer CPL disposed on the second electrode EL2. The capping layer CPL may include multiple layers or a single layer.

In an embodiment, the capping layer CPL may include at least one organic layer and at least one inorganic layer. For example, the capping layer CPL may have a structure in which an organic layer/inorganic layer are alternately disposed at least one time, or a structure in which an inorganic layer/organic layer are alternately disposed. For example, the capping layer CPL may include a plurality of organic layers and a plurality of inorganic layers alternately arranged with the plurality of organic layers.

When the capping layer CPL contains an inorganic material, the inorganic material may include (e.g., be) an alkali metal compound such as LiF, and/or an alkaline earth metal compound such as MgF2 ($MgF_2$), SiON, $SiN_x$, and/or $SiO_y$, etc.

When the capping layer CPL includes (e.g., is) an organic material, the capping layer CPL may include (e.g., be) α-NPD, NPB, TPD, m-MTDATA, $Alq_3$, CuPc, (N4, N4, N4',N4'-tetra (biphenyl-4-yl) biphenyl-4,4'-diamine) (TPD15), and/or 4,4',4''-Tris (carbazol sol-9-yl) triphenylamine (TCTA), etc. In some embodiments, the capping layer CPL may contain an epoxy resin, and/or an acrylate such as methacrylate.

However, an embodiment of the present disclosure is not limited thereto, and the capping layer CPL may include (e.g., be) one or more of the compounds P1 to P5 below.

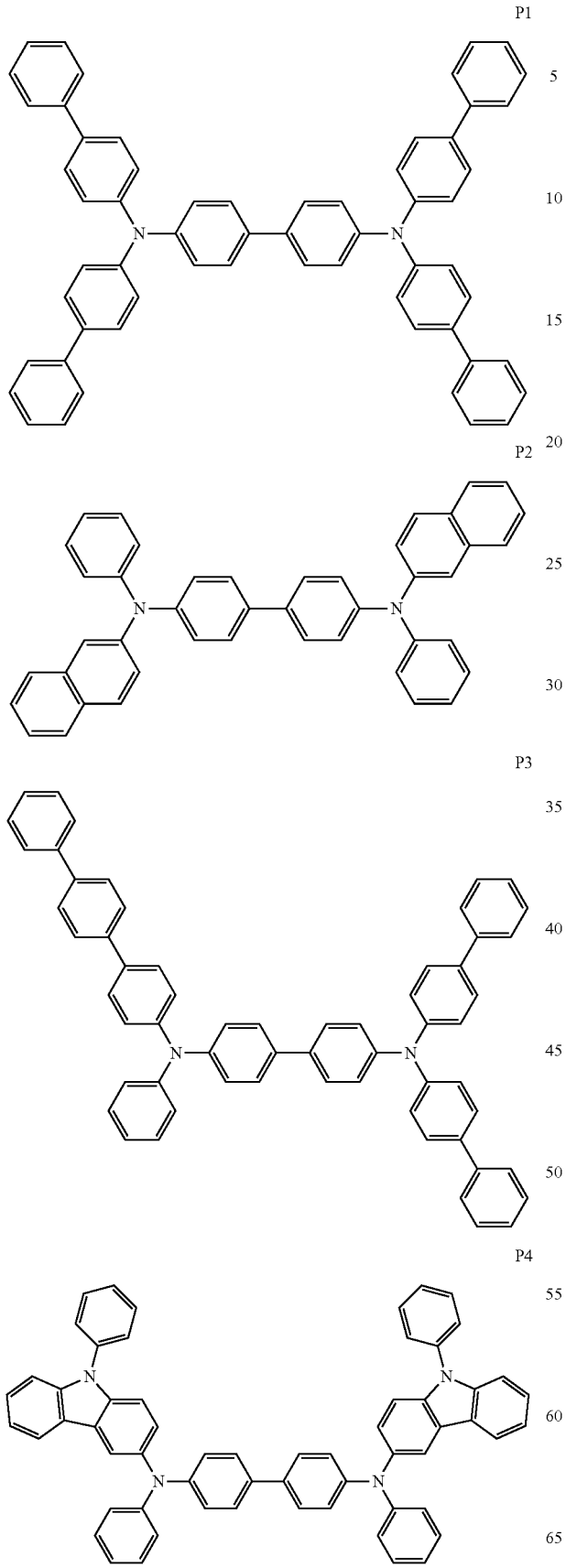
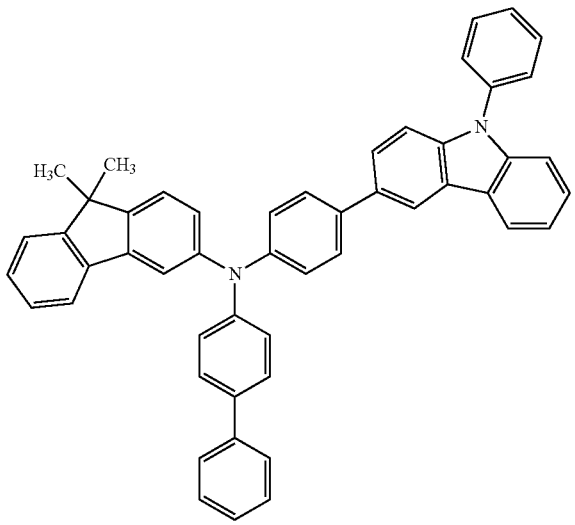

In an embodiment, the capping layer CPL may have a refractive index of 1.6 or more as measured at 589 nm (e.g., at a wavelength of 589 nm). In some embodiments, the capping layer CPL may have a refractive index of 2.0 or less as measured at 589 nm (e.g., at a wavelength of 589 nm).

In an organic electroluminescence device 10, as voltages are respectively applied to the first electrode EL1 and the second electrode EL2, the holes injected from the first electrode EL1 are moved to the light-emitting layer EML through the hole transport region HTR, electrons injected from the second electrode EL2 are moved to the light-emitting layer EML through the electron transport region ETR. The electrons and the holes recombine in the light-emitting layer EML to generate excitons, and when the excitons fall from the excited state to the ground state, light is emitted.

When the organic electroluminescence device 10 is a front-emission type (e.g., kind) device, the first electrode EL1 may be a reflective electrode, and the second electrode EL2 may be a transmissive electrode or a transflective electrode. When the organic electroluminescence device 10 is a back-emission type (e.g., kind) device, the first electrode EL1 may be a transmissive electrode or a transflective electrode, and the second electrode EL2 may be a reflective electrode.

The organic electroluminescence device 10 according to an embodiment of the present disclosure is characterized by containing an amine compound represented by Formula 1, thereby achieving high efficiency and long service life. Also, there is an effect of reducing the driving voltage.

Hereinafter, the organic electroluminescence device of an embodiment of the present disclosure will be described in more detail with reference to Examples and Comparative Examples. The following Examples are only illustrations to assist in the understanding of present disclosure, and the scope of the present disclosure is not limited thereto.

Synthesis Example

The amine compound according to an embodiment of the present disclosure may be synthesized, for example, as follows. However, the method for synthesizing the amine compound according to an embodiment of the present disclosure is not limited thereto.

1. Synthesis of Compound A

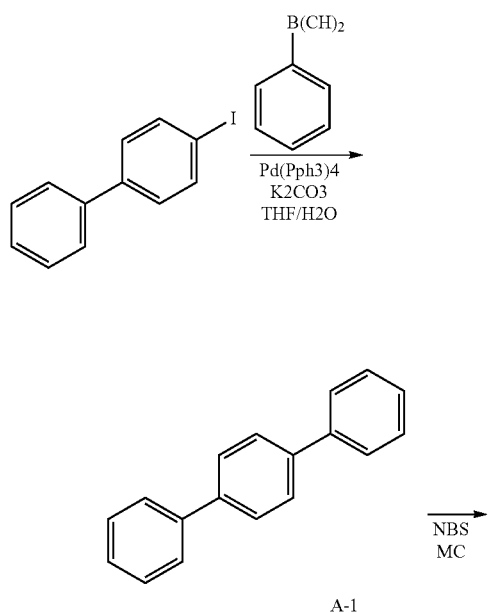

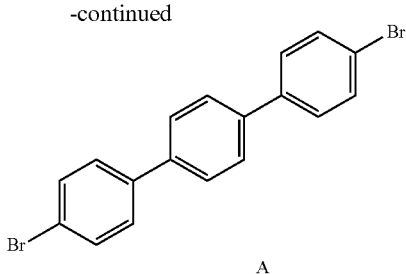

Synthesis of A-1

Phenyl boronic acid (2.4 g), 4-iodo-1,1'-biphenyl (5.6 g), Pd(PPh$_3$)$_4$ (1.2 g), K$_2$CO$_3$ (8.2 g), THF (40 ml), H$_2$O (10 ml) are put into a 1-neck round flask and stirred (80° C., overnight). For example, the mixture is stirred at 80° C. overnight. The reaction product is worked up with EA/H$_2$O and then separated utilizing (e.g., using) column chromatography. 2.4 g is obtained (Yield=50%).

Synthesis of A

A-1 (2.4 g), NBS (3.1 g), and MC (30 ml) are put into a 1-neck round flask and stirred (30° C., 2 h). For example, the mixture is stirred at 30° C. for two hours. The reaction product is worked up with EA/H$_2$O and then separated utilizing (e.g., using) column chromatography. 3.4 g is obtained (Yield=90%).

2. Synthesis of Compound 1

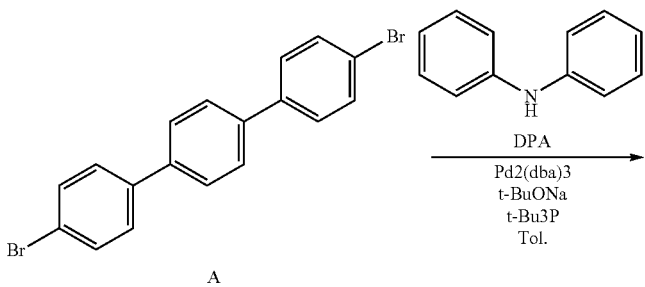

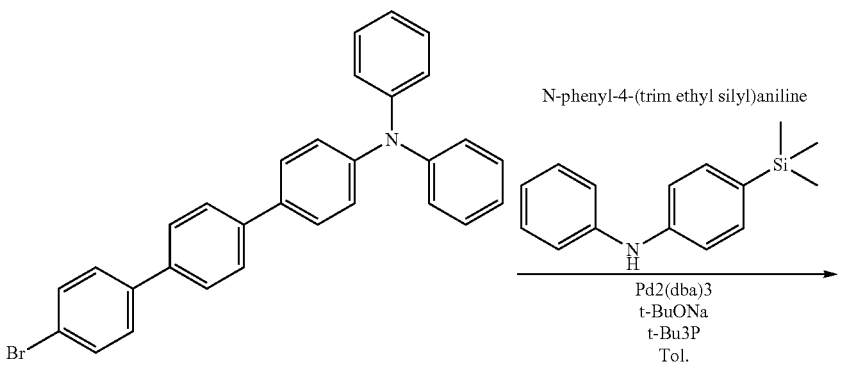

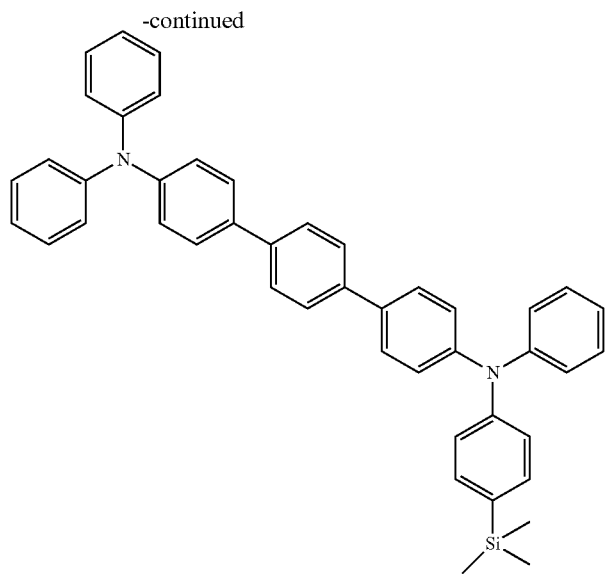

1

Synthesis of 1-1

Compound A (3.4 g), DPA (1.69 g), Pd2(dba)₃ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H₂O and then separated utilizing (e.g., using) column chromatography. 2.94 g is obtained (Yield=70%, Purity=99%).

Synthesis of 1

1-1 (2.85 g), N-phenyl-4-(trimethylsilyl)aniline (1.45 g), Pd₂(dba)₃ (0.27 g), t-BuONa (1.7 g), t-Bu3P (0.04 ml), and Tol. (150 ml) are put into a 1-neck round flask and stirred (100° C., 2 h). For example, the mixture is stirred at 100° C. for two hours. The reaction product is worked up with EA/H₂O and separated utilizing (e.g., using) column chromatography. 3.0 g is obtained (Purity≥99.9%).

3. Synthesis of Compound 2

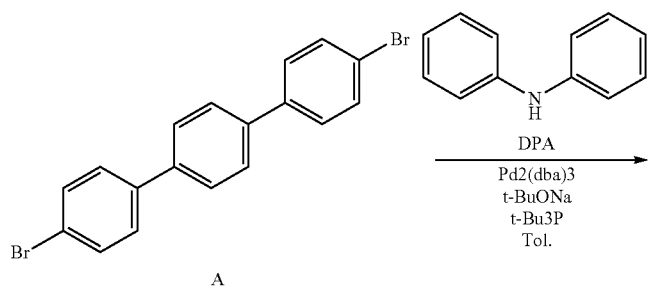

A

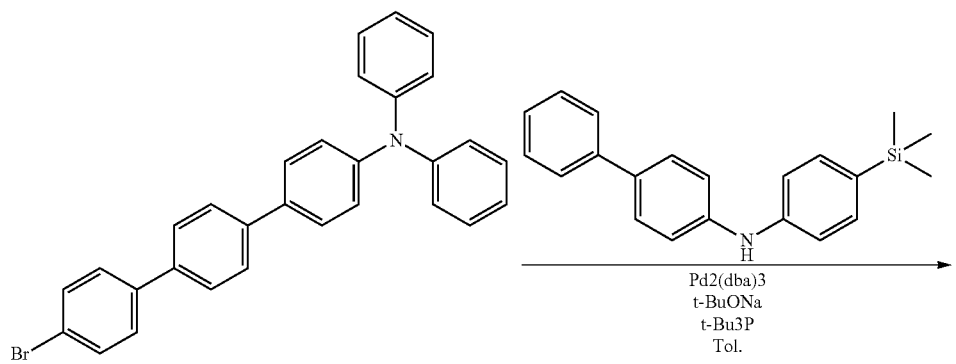

2-1

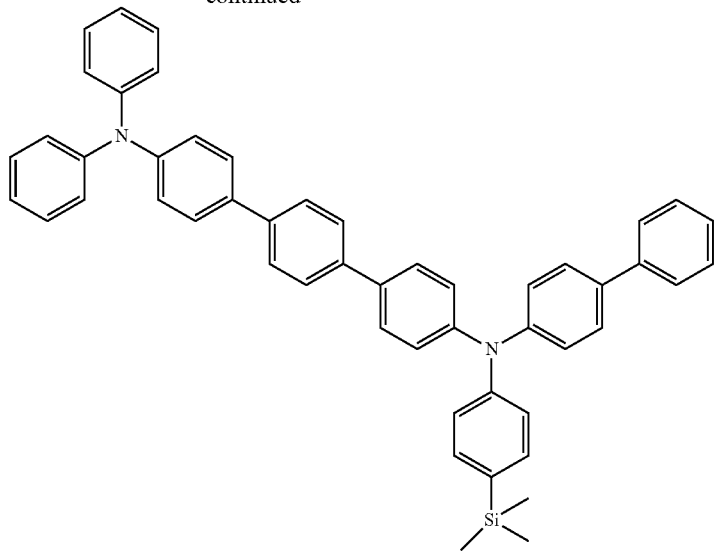

2

Synthesis of 2-1

Compound A (3.4 g), DPA (1.69 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.85 g is obtained (Yield=68%, Purity=99%).

Synthesis of 2

2-1 (2.85 g), N-(4-(trimethylsilyl)phenyl)-[1,1′-biphenyl]-4-amine (2.09 g), Pd$_2$(dba)$_3$ (0.27 g), t-BuONa (1.7 g), t-Bu$_3$P (0.04 ml), and Tol. (150 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 3.56 g is obtained (Yield=57%, Purity=98%). The resultant product is further purified through ether recrystallization, and thereafter, when the purity is 99.8% or higher, sublimation purification is performed. 3.0 g is obtained (Purity≥99.9%).

4. Synthesis of Compound 3

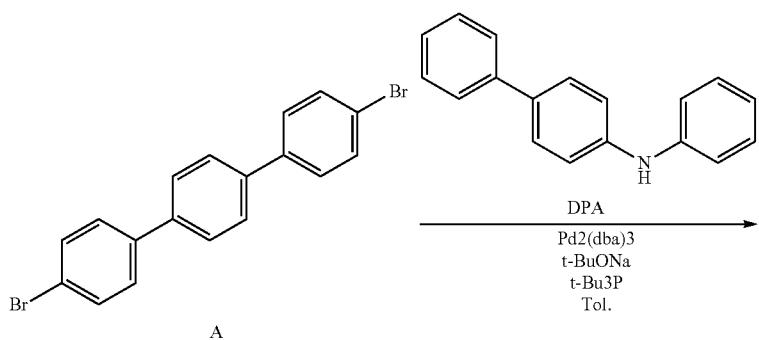

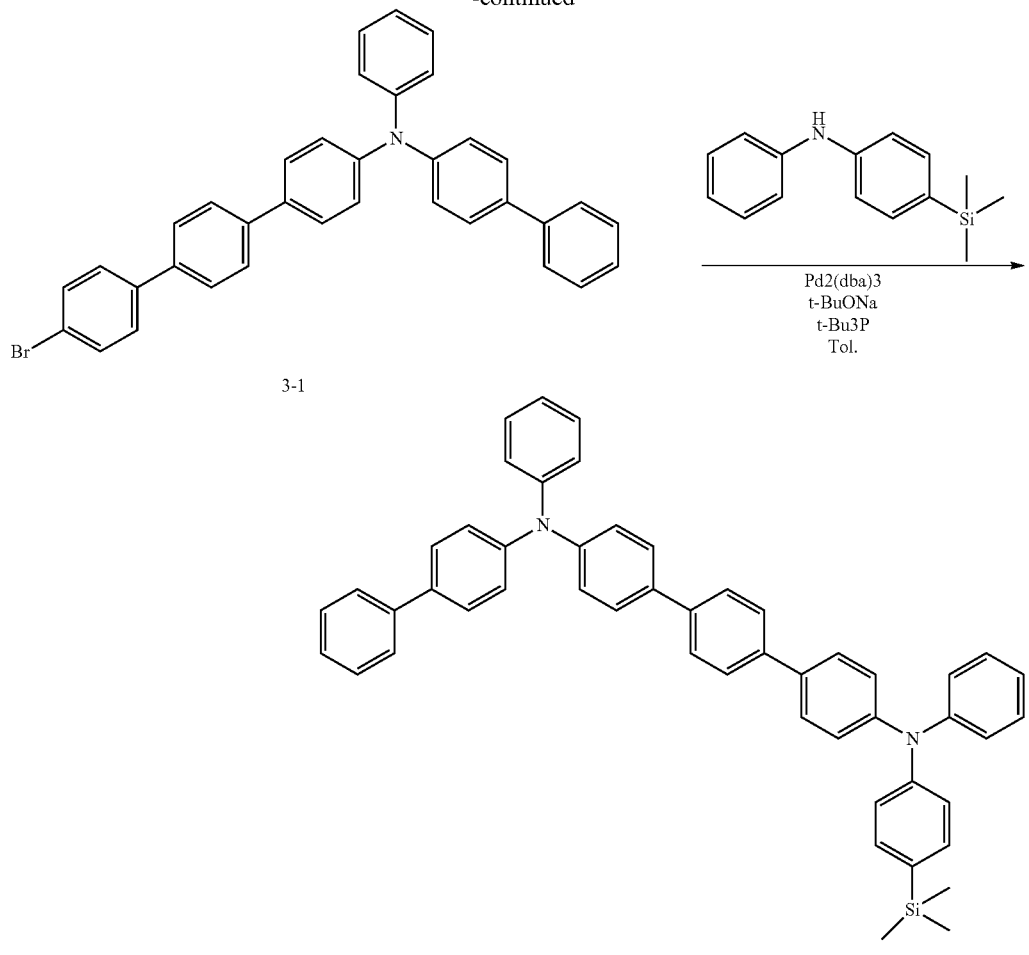

Synthesis of 3-1

Compound A (3.4 g), N-phenyl-[1,1'-biphenyl]-4-amine (2.20 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 3.3 g is obtained (Yield=68%, Purity=99%).

Synthesis of 3

3-1 (3.3 g), N-phenyl-4-(trimethylsilyl)aniline (1.4 g), Pd$_2$(dba)$_3$ (0.27 g), t-BuONa (1.7 g), t-Bu$_3$P (0.04 ml), and Tol. (150 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 3.01 g is obtained (Yield=70%, Purity=99%). The resultant product is further purified through ether recrystallization, and thereafter, when the purity is 99.8% or higher, sublimation purification is performed. 2.9 g is obtained (Purity≥99.9%).

5. Synthesis of Compound 19

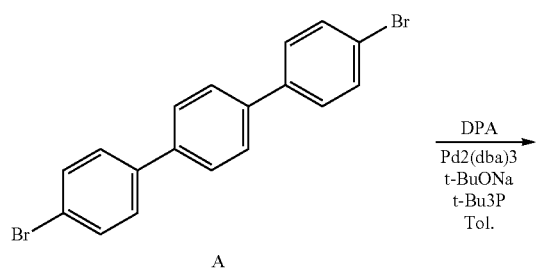

-continued

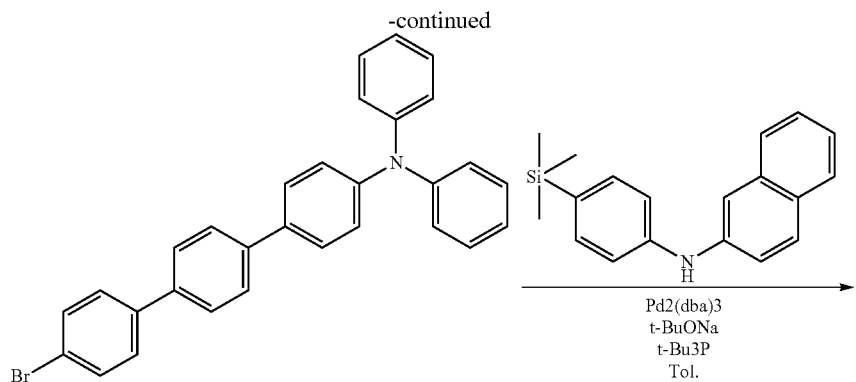

19-1

19

Synthesis of 19-1

Compound A (3.4 g), DPA (1.69 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.85 g is obtained (Yield=68%, Purity=99%).

Synthesis of 19

19-1 (2.86 g), N-(4-(trimethylsilyl)phenyl)naphthalen-2-amine (1.7 g), Pd$_2$(dba)$_3$ (0.27 g), t-BuONa (1.7 g), t-Bu$_3$P (0.04 ml), and Tol. (150 ml) are put into a 1-neck round flask and stirred (100° C., 2 h). For example, the mixture is stirred at 100° C. for two hours. The reaction product is worked up with EA/H$_2$O and separated utilizing (e.g., using) column chromatography. 2.6 g is obtained (Yield=65%, Purity=98%). The resultant product is further purified through ether recrystallization, and thereafter, when the purity is 99.8% or higher, sublimation purification is performed. 2.3 g is obtained (Purity≥99.9%).

6. Synthesis of Compound 20

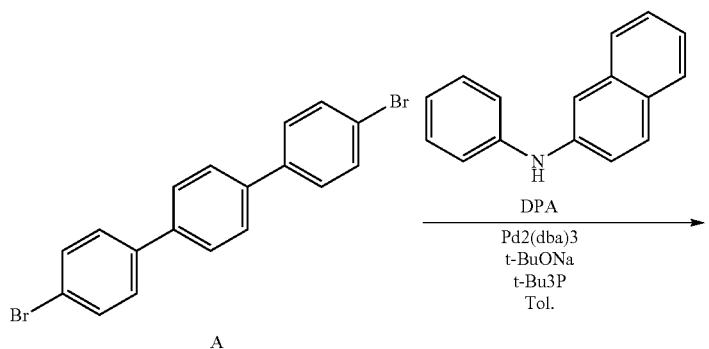

A

-continued

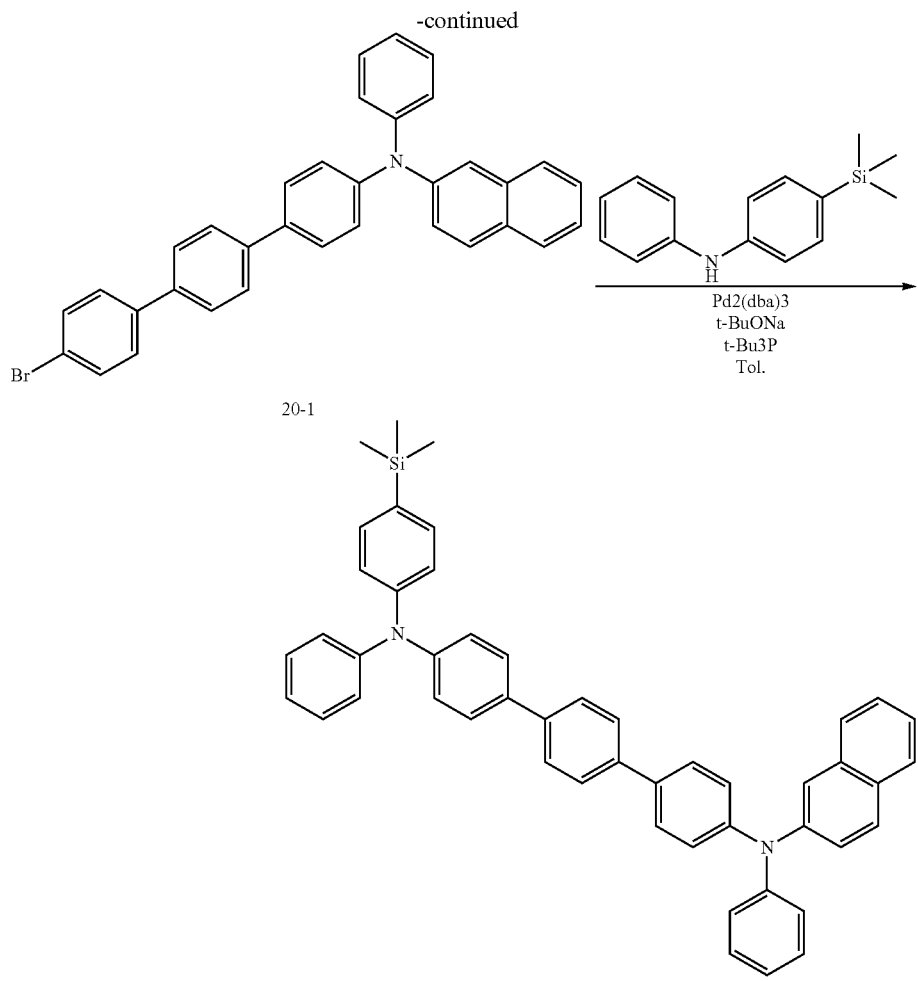

Synthesis of 20-1

Compound A (3.4 g), N-phenylnaphthalen-2-amine (1.9 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.97 g is obtained (Yield=65%, Purity=99%).

Synthesis of 20

20-1 (2.86 g), N-phenyl-4-(trimethylsilyl)aniline (1.3 g), Pd$_2$(dba)$_3$ (0.27 g), t-BuONa (1.7 g), t-Bu$_3$P (0.04 ml), and Tol. (100 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.3 g is obtained (Yield=60%, Purity=98%). The resultant product is further purified through ether recrystallization, and thereafter, when the purity is 99.8% or higher, sublimation purification is performed. 2.0 g is obtained (Purity≥99.9%).

7. Synthesis of Compound 45

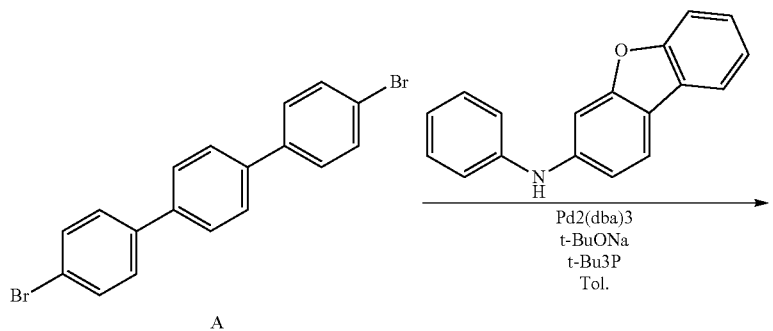

-continued

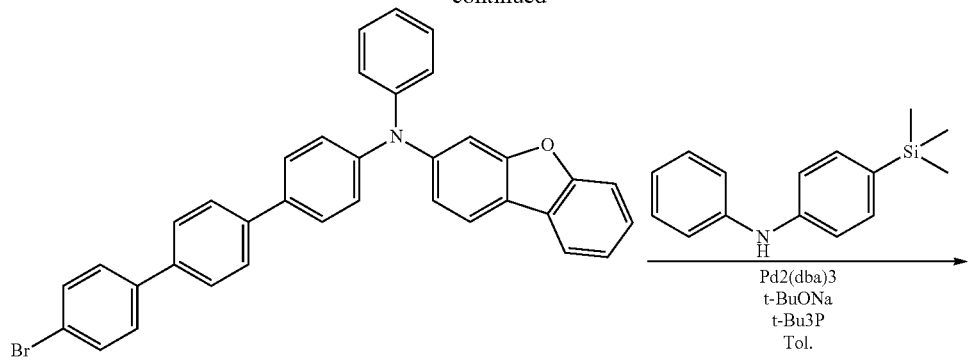

45-1

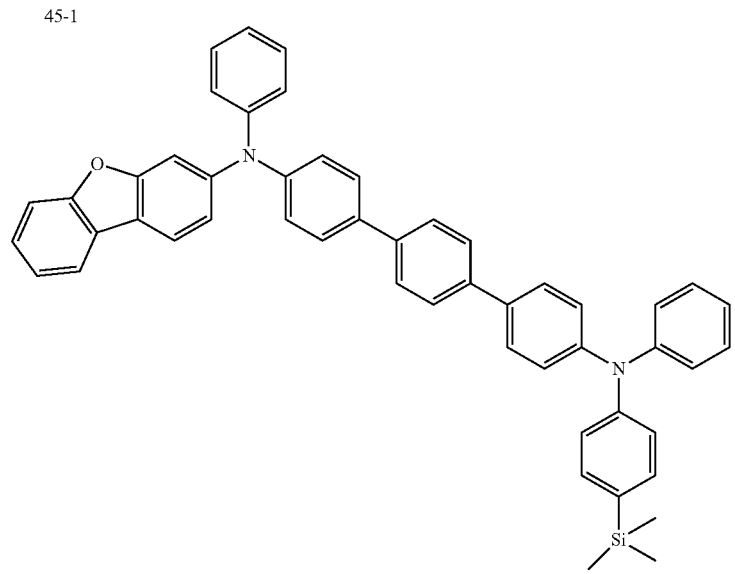

45

Synthesis of 45-1

Compound A (3.4 g), N-phenyldibenzo[b,d]furan-3-amine (2.28 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 3.14 g is obtained (Yield=65%, Purity=99%).

Synthesis of 45

45-1 (3.14 g), N-phenyl-4-(trimethylsilyl)aniline (1.3 g), Pd$_2$(dba)$_3$ (0.27 g), t-BuONa (1.7 g), t-Bu$_3$P (0.04 ml), and Tol. (100 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.4 g obtained (Yield=60%, Purity=98%). The resultant product is further purified through ether recrystallization, and thereafter, when the purity is 99.8% or higher, sublimation purification is performed. 2.2 g is obtained (Purity≥99.9%).

8. Synthesis of Compound 46

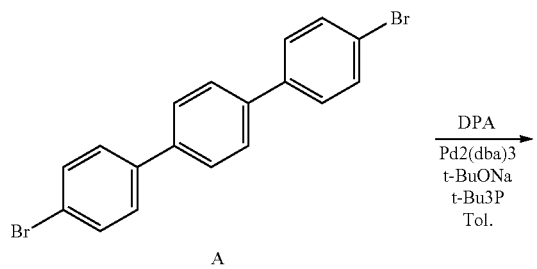

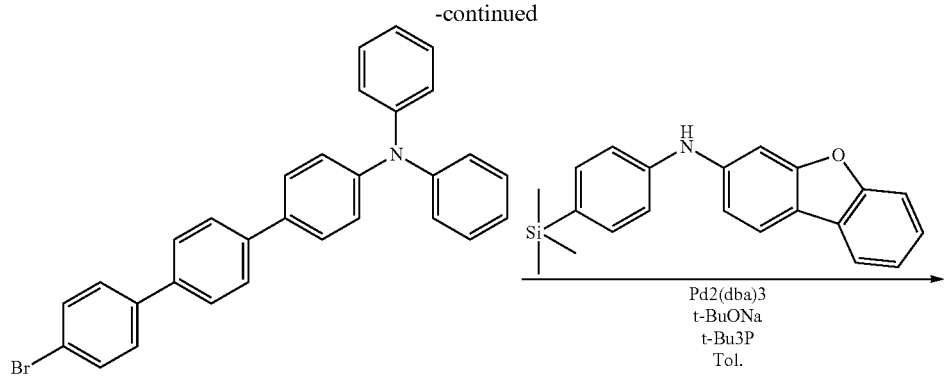

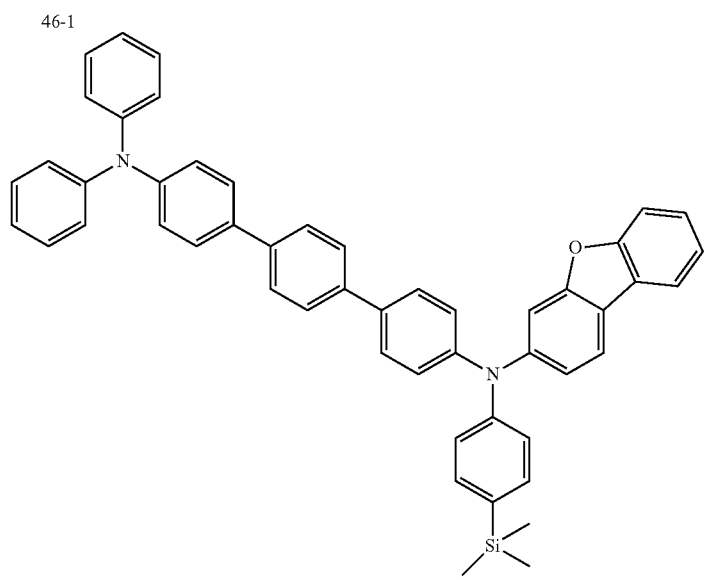

Synthesis of 46-1

Compound A (3.4 g), DPA (1.69 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.85 g is obtained (Yield=68%, Purity=99%).

Synthesis of 46

46-1 (2.85 g), N-(4(trimethylsilyl)phenyl)dibenzo[b,d]furan-3-amine (1.9 g), Pd$_2$(dba)$_3$ (0.27 g), t-BuONa (1.7 g), t-Bu$_3$P (0.04 ml), and Tol. (150 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.3 g is obtained (Yield=55%, Purity=98%). The resultant product is further purified through ether recrystallization, and thereafter, when the purity is 99.8% or higher, sublimation purification is performed. 2.0 g is obtained (Purity≥99.9%).

9. Synthesis of Compound 69

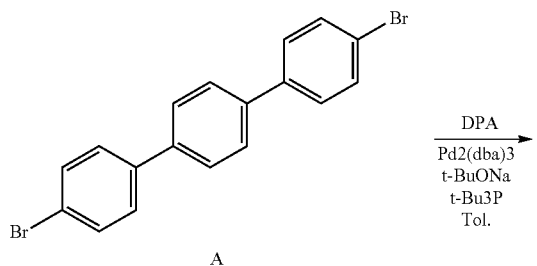

-continued

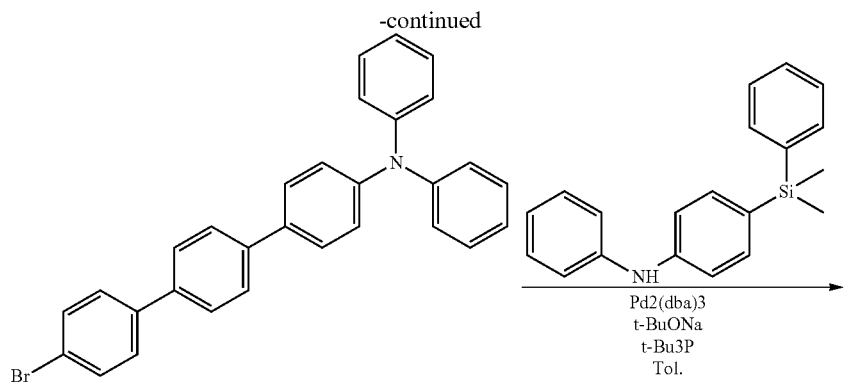
69-1

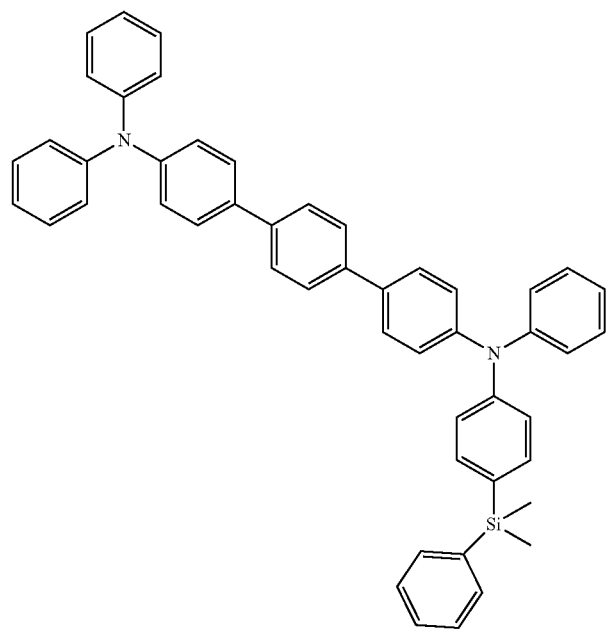
69

Synthesis of 69-1

Compound A (3.4 g), DPA (1.69 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.85 g is obtained (Yield=68%, Purity=99%).

Synthesis of 69

46-1 (2.85 g), 4-(dimethyl(phenyl)silyl)-N-phenylaniline (1.8 g), Pd$_2$(dba)$_3$ (0.27 g), t-BuONa (1.7 g), t-Bu$_3$P (0.04 ml), and Tol. (150 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.8 g is obtained (Yield=65%, Purity=98%). The resultant product is further purified through ether recrystallization, and thereafter, when the purity is 99.8% or higher, sublimation purification is performed. 2.3 g is obtained (Purity≥99.9%).

10. Synthesis of Compound 70

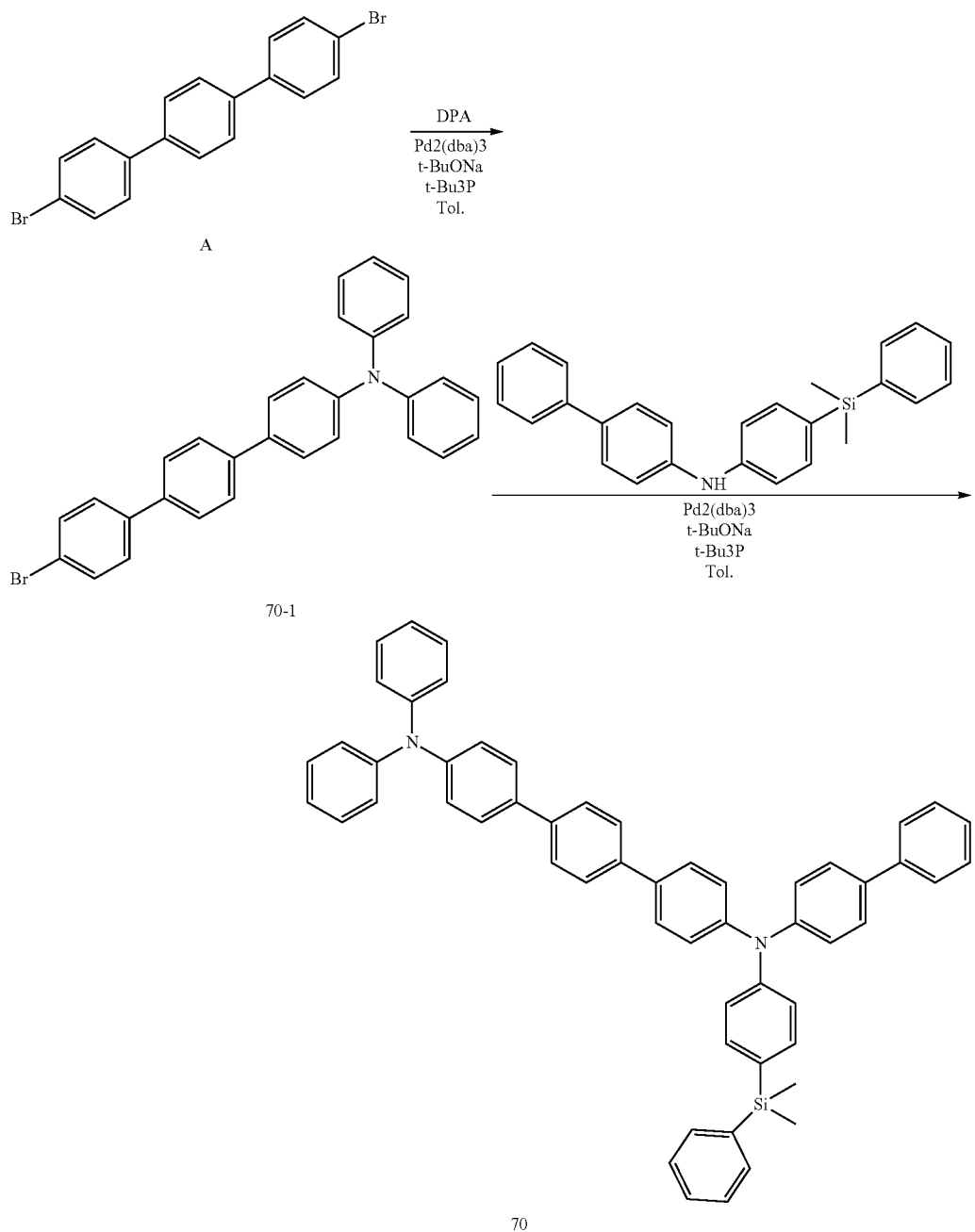

Synthesis of 70-1

Compound A (3.4 g), DPA (1.69 g), Pd$_2$(dba)$_3$ (0.24 g), t-BuONa (1.9 g), s-phos (0.17 g), and Tol. (200 ml) are put into a 1-neck round flask and stirred (100° C., 2 h). For example, the mixture may be stirred at 100° C. for two hours. The reaction product is worked up with EA/H$_2$O and then separated utilizing (e.g., using) column chromatography. 2.85 g is obtained (Yield=68%, Purity=99%).

Synthesis of 70

70-1 (2.85 g), N-(4-(dimethyl(phenyl)silyl)phenyl)-[1,1'-biphenyl]-4-amine (2.2 g), Pd$_2$(dba)$_3$ (0.27 g), t-BuONa (1.7 g), t-Bu$_3$P (0.04 ml), and Tol. (150 ml) are put into a 1-neck round flask and stirred (100° C., 2 h). For example, the mixture is stirred at 100° C. for two hours. The reaction product is worked up with EA/H$_2$O and then separated utilizing (e.g., using) column chromatography. 2.5 g is obtained (Yield=55%, Purity=98%). The resultant product is further purified through ether recrystallization, and thereafter, when the purity is 99.8% or higher, sublimation purification is performed. 2.1 g is obtained (Purity≥99.9%).
Device Production Example
An organic electroluminescence device was produced utilizing (e.g., using) the Example Compounds and Comparative Example Compounds as a material for a hole transport region material.
Example Compound
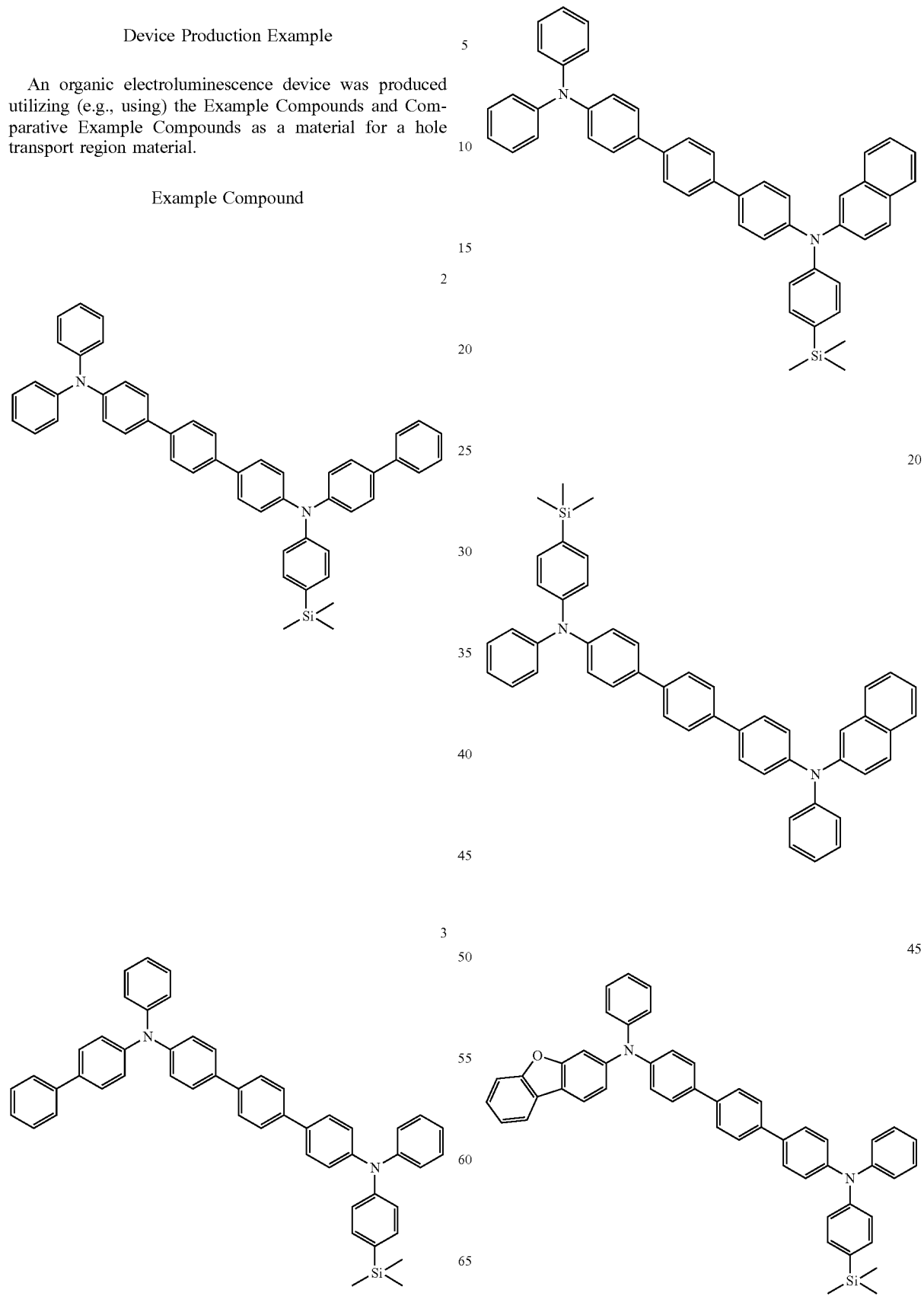

46
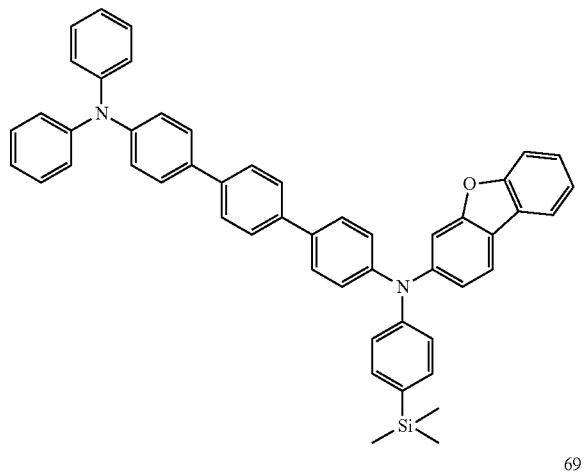
69
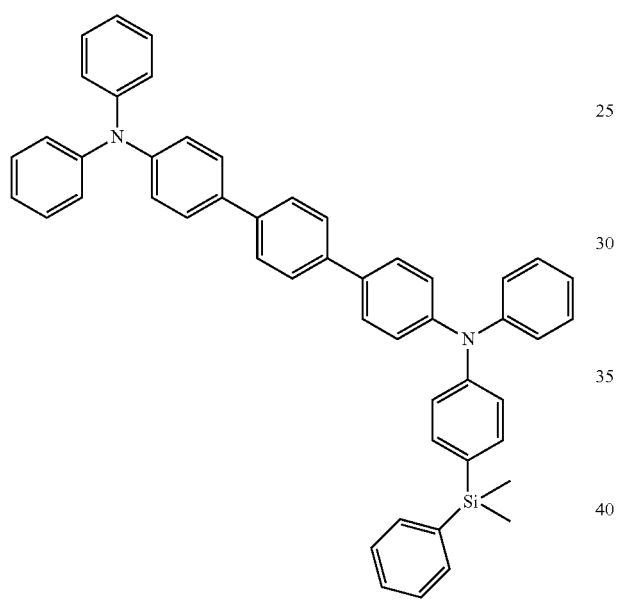
5
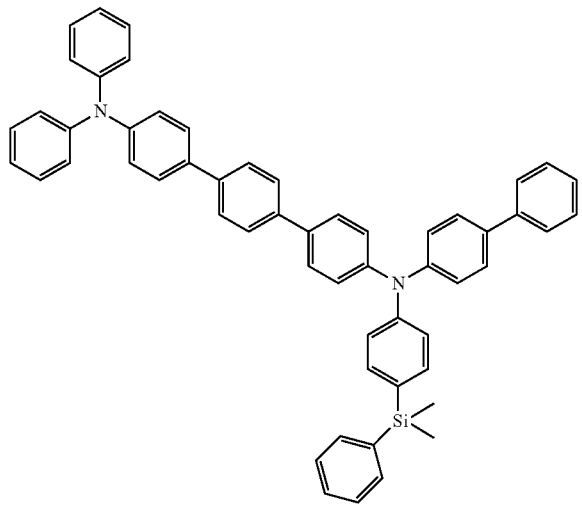
70
Comparative Example Compound
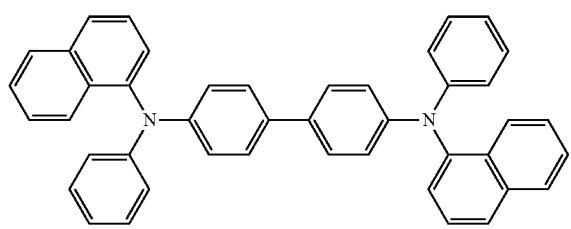
R1

-continued
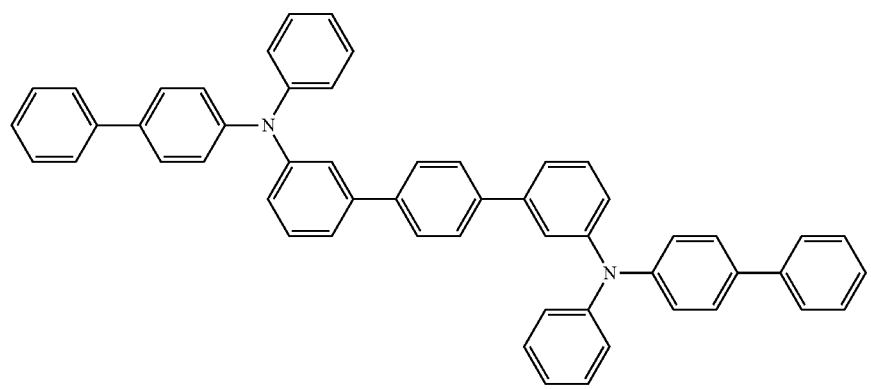
R2
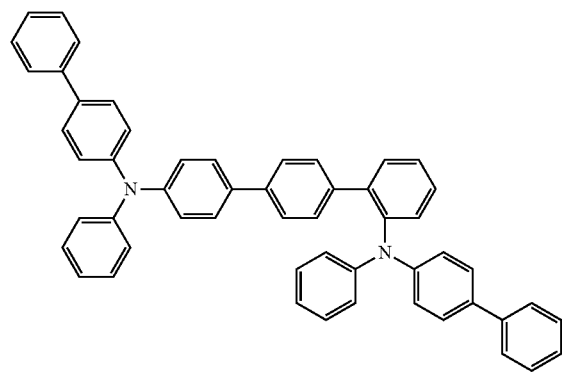
R3
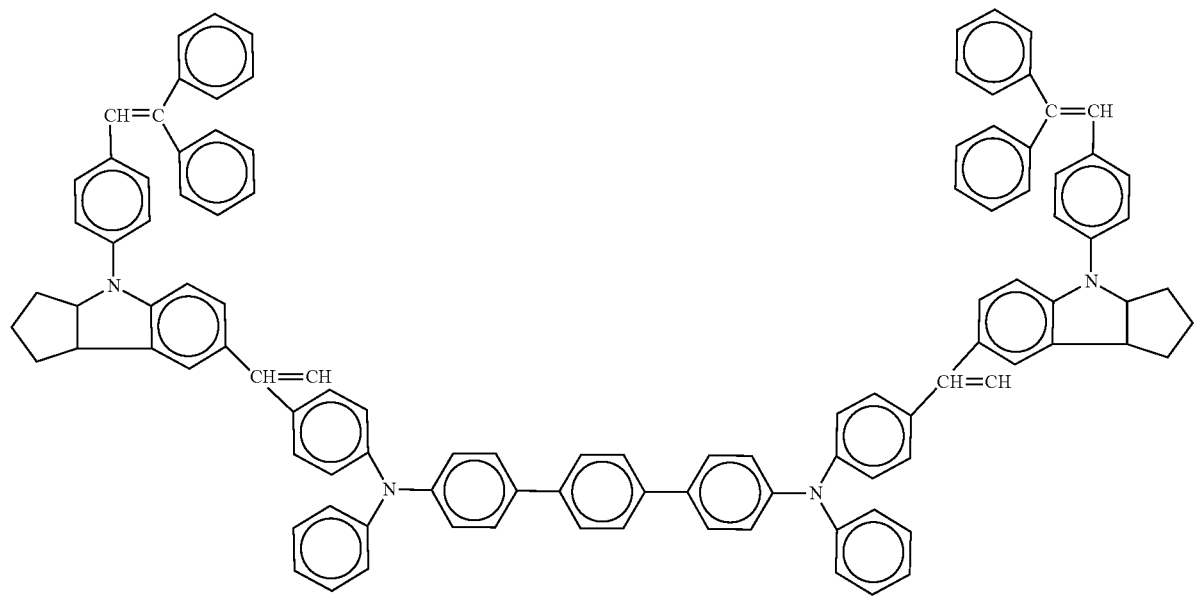
R4

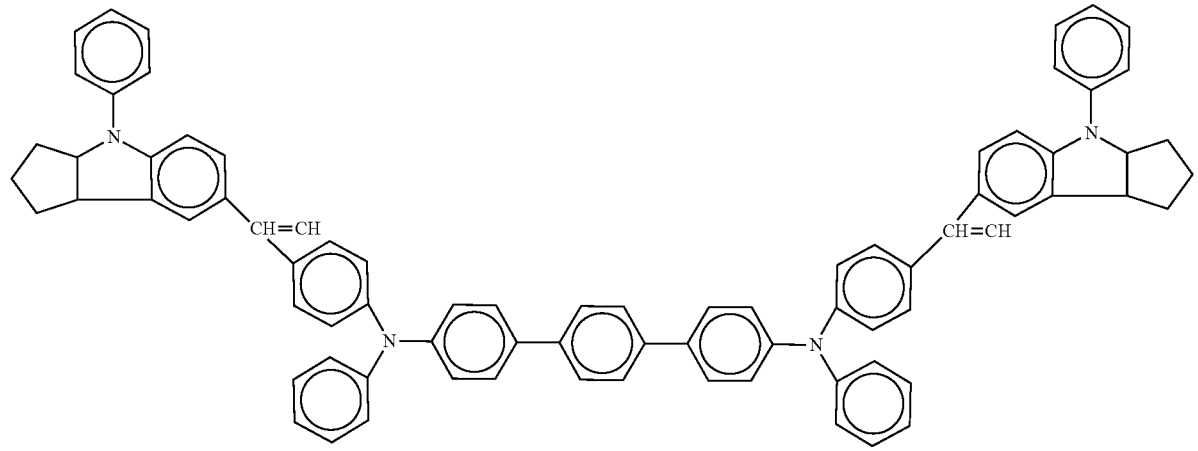

R5

Organic electroluminescence devices according to Examples and Comparative Examples were manufactured by the following method. An ITO having a thickness of about 120 nm was patterned on a glass substrate, washed with ultrapure water, and subjected to UV ozone treatment, thereby forming a first electrode EL1. Thereafter, 2-TNATA was deposited to a thickness of about 60 nm, and a hole transport layer having a thickness of about 30 nm was formed utilizing (e.g., using) one among the Example Compounds and Comparative Example Compounds. Next, a 30 nm-thick light-emitting layer EML, in which 9,10-di(2-naphthyl)anthracene (DNA, Compound a-2) was doped with 2% DPAVBi, was formed, a 30 nm thick layer of $Alq_3$ was formed on the light-emitting layer EML, and a 1 nm-thick layer of LiF was formed, thereby forming an electron transport region. Thereafter, a second electrode EL2 having a thickness of 300 nm was formed of aluminum (Al).

The luminous efficiencies of the organic electroluminescence device according to Examples 1 to 9 and Comparative Examples 1 to 5 was measured. The results are shown in Table 1 below.

TABLE 1

| | Hole transport layer | Driving voltage (V) | Current density (mA/cm$^2$) | Luminance (cd/m$^2$) | Efficiency (cd/A) | Half life (hr @100 mA/cm$^2$)) |
|---|---|---|---|---|---|---|
| Example 1 | Example Compound 1 | 4.21 | 50 | 3701 | 7.4 | 342 |
| Example 2 | Example Compound 2 | 4.19 | 50 | 3689 | 7.37 | 352 |
| Example 3 | Example Compound 3 | 4.22 | 50 | 3680 | 7.36 | 355 |
| Example 4 | Example Compound 19 | 4.23 | 50 | 3665 | 7.33 | 341 |
| Example 5 | Example Compound 20 | 4.18 | 50 | 3692 | 7.38 | 347 |
| Example 6 | Example Compound 45 | 4.15 | 50 | 3683 | 7.36 | 360 |
| Example 7 | Example Compound 46 | 4.24 | 50 | 3711 | 7.42 | 356 |
| Example 8 | Example Compound 69 | 4.23 | 50 | 3720 | 7.44 | 361 |
| Example 9 | Example Compound 70 | 4.2 | 50 | 3675 | 7.35 | 346 |
| Comparative Example 1 | Comparative Example Compound R1 | 4.29 | 50 | 3642 | 7.28 | 331 |
| Comparative Example 2 | Comparative Example Compound R2 | 4.35 | 50 | 3598 | 7.19 | 315 |
| Comparative Example 3 | Comparative Example Compound R3 | 4.36 | 50 | 3602 | 7.20 | 326 |
| Comparative Example 4 | Comparative Example Compound R4 | 4.33 | 50 | 3589 | 7.17 | 339 |

TABLE 1-continued

|  | Hole transport layer | Driving voltage (V) | Current density (mA/cm$^2$) | Luminance (cd/m$^2$) | Efficiency (cd/A) | Half life (hr @100 mA/ cm$^2$)) |
|---|---|---|---|---|---|---|
| Comparative Example 5 | Comparative Example Compound R5 | 4.31 | 50 | 3612 | 7.2 | 341 |

Referring to Table 1, it may be seen that the organic electroluminescence device according to Examples 1 to 9 all achieve high efficiency, low-voltage characteristics, high luminance, and long service life compared to Comparative Examples 1 to 5.

The organic electroluminescence device according to an embodiment of the present disclosure may achieve low driving voltage, high efficiency, and long service life by utilizing (e.g., using) the amine compound according to the embodiment.

The amine compound according to an embodiment of the present disclosure may improve characteristics in hole injection processes and hole transport processes by improving orientation due to three-dimensional factors and electronic improvement due to delocalization.

The organic electroluminescence device according to an embodiment of the present disclosure has excellent efficiency.

The amine compound according to an embodiment of the present disclosure may be utilized (e.g., used) as a material for a hole transport region of an organic electroluminescence device, and utilizing (e.g., using) the amine compound may improve the efficiency of the organic electroluminescence device.

Although the embodiments of the present disclosure have been described, those of ordinary skill in the art to which the present disclosure pertains will be able to understand that the present disclosure may be implemented in other suitable forms without changing the technical idea or essential features. Therefore, the Examples are illustrative in all respects and examples should not be understood as limiting the present disclosure.

What is claimed is:

1. An organic electroluminescence device comprising:
   a first electrode;
   a hole transport region on the first electrode;
   a light-emitting layer on the hole transport region;
   an electron transport region on the light-emitting layer; and
   a second electrode on the electron transport region,
   wherein the hole transport region comprises an amine compound represented by Formula 1 below:

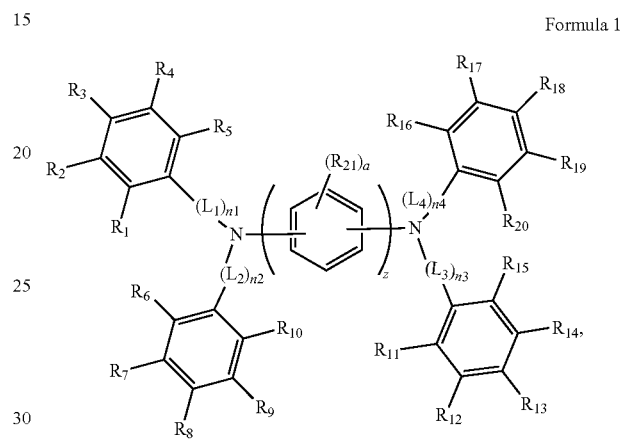

Formula 1 and
   wherein, in Formula 1,
   $L_1$ to $L_4$ are each independently a direct bond, a substituted or unsubstituted arylene group having 6 to 30 ring-forming carbon atoms, or a substituted or unsubstituted heteroarylene group having 2 to 30 ring-forming carbon atoms,
   n1 to n4 are each independently an integer of 0 to 3,
   z is an integer of 1 to 5,
   a is an integer of 0 to 4, and
   $R_1$ to $R_{21}$ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
   where at least one among $R_1$ to $R_{20}$ is a substituted silyl group or an aryl group having 6 to 30 ring-forming carbon atoms in which a silyl group is substituted.

2. The organic electroluminescence device of claim 1, wherein the hole transport region comprises:
   a hole injection layer on the first electrode; and
   a hole transport layer on the hole injection layer,
   the hole transport layer comprising an amine compound represented by Formula 1 above.

3. The organic electroluminescence device of claim 1, wherein Formula 1 is represented by Formula 2 below:

Formula 2

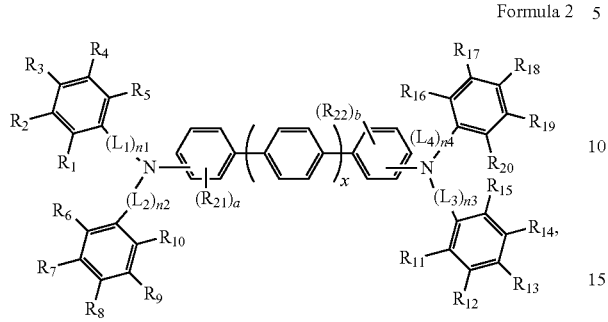

and
wherein, in Formula 2,
$R_{22}$ is a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted ring heteroaryl group having 2 to 30 ring-forming carbon atoms,
b is an integer of 0 to 4,
x is an integer of 0 to 2, and
$L_1$ to $L_4$, n1 to n4, a, and $R_1$ to $R_{21}$ are the same as defined in Formula 1.

4. The organic electroluminescence device of claim 3, wherein any one among $R_1$ to $R_5$ is a substituted silyl group or an aryl group having 6 to 30 ring-forming carbon atoms in which a silyl group is substituted.

5. The organic electroluminescence device of claim 3, wherein any one among $R_6$ to $R_{10}$ is a substituted silyl group or an aryl group having 6 to 30 ring-forming carbon atoms in which a silyl group is substituted.

6. The organic electroluminescence device of claim 3, wherein any one among $R_{11}$ to $R_{15}$ is a substituted silyl group or an aryl group having 6 to 30 ring-forming carbon atoms in which a silyl group is substituted.

7. The organic electroluminescence device of claim 3, wherein any one among $R_{16}$ to $R_{20}$ is a substituted silyl group or an aryl group having 6 to 30 ring-forming carbon atoms in which a silyl group is substituted.

8. The organic electroluminescence device of claim 3, wherein Formula 2 is represented by Formula 3 below:

Formula 3

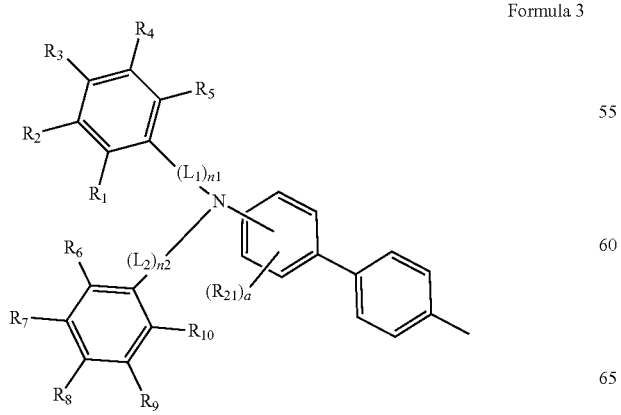

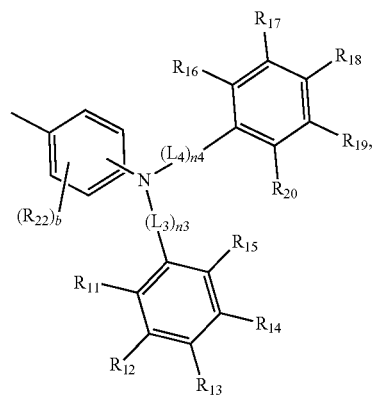

and
wherein, in Formula 3,
$L_1$ to $L_4$, n1 to n4, a, b, and $R_1$ to $R_{22}$ are the same as defined in Formula 2.

9. The organic electroluminescence device of claim 8, wherein Formula 3 is represented by Formula 4 below:

Formula 4

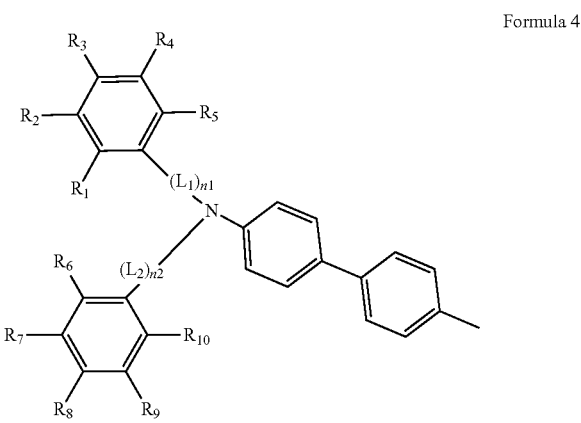

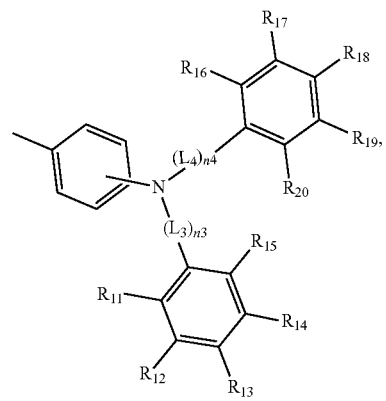

and
wherein, in Formula 4,
$L_1$ to $L_4$, n1 to n4, and $R_1$ to $R_{20}$ are the same as defined in Formula 3.

10. The organic electroluminescence device of claim 9, wherein Formula 4 is represented by Formula 4-1 below:

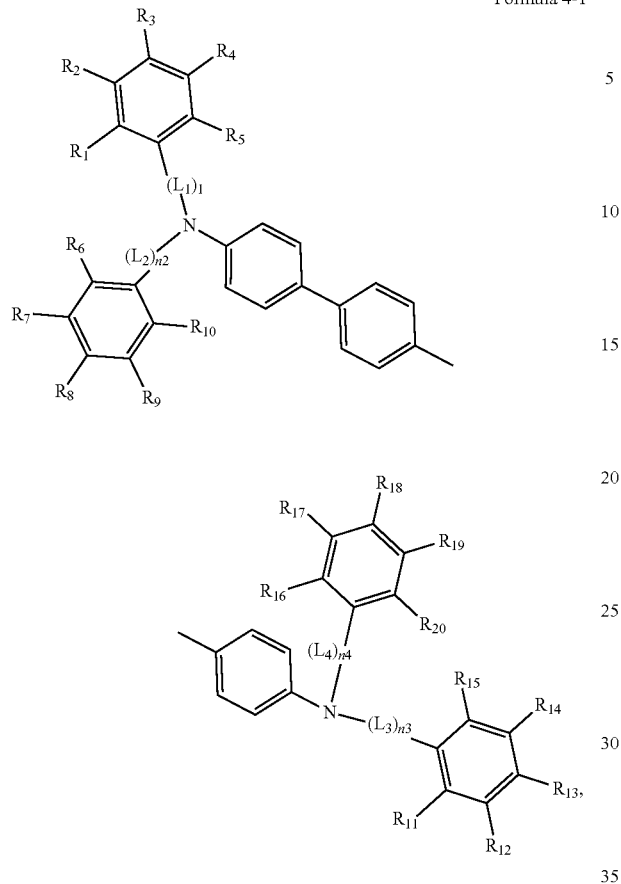
Formula 4-1
and
wherein, in Formula 4-1,
$L_1$ to $L_4$, n1 to n4, and $R_1$ to $R_{20}$ are the same as defined in Formula 4.
11. The organic electroluminescence device of claim 9, wherein Formula 4 is represented by Formula 4-2 below:
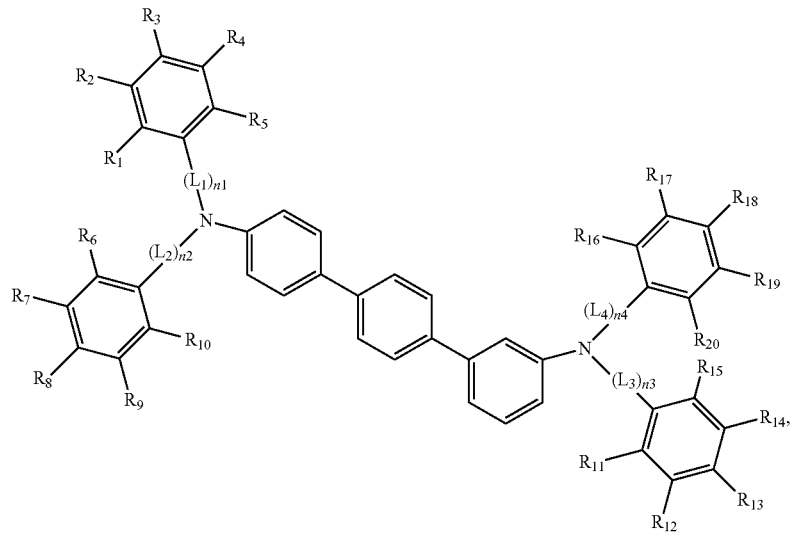
Formula 4-2 and
wherein, in Formula 4-2,

L$_1$ to L$_4$, n1 to n4, and R$_1$ to R$_{20}$ are the same as defined in Formula 4.

12. The organic electroluminescence device of claim 9, wherein Formula 4 is represented by Formula 4-3 below:

Formula 4-3

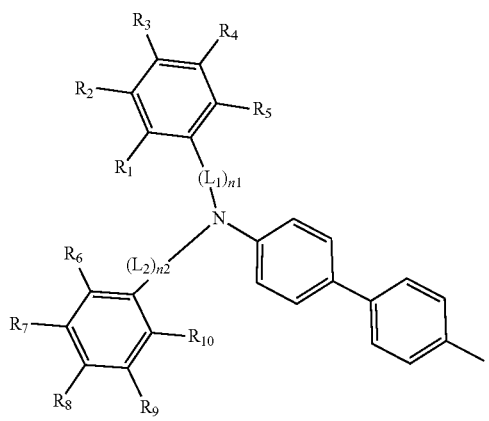

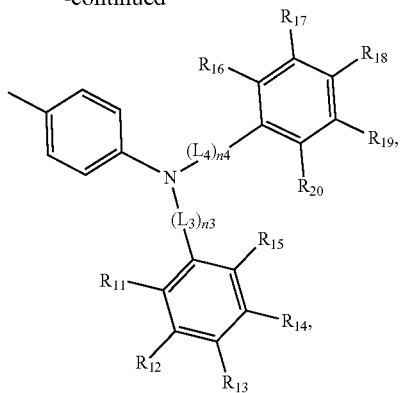

and
wherein, in Formula 4-3,

L$_1$ to L$_4$, n1 to n4, and R$_1$ to R$_{20}$ are the same as defined in Formula 4.

13. The organic electroluminescence device of claim 1, wherein L$_1$ to L$_4$ in Formula 1 are each independently a direct bond, a substituted or unsubstituted phenylene group, or a substituted or unsubstituted biphenylene group.

14. The organic electroluminescence device of claim 1, wherein, the amine compound represented by Formula 1 is one selected from compounds represented by Compound Group 1 below:

Compound Group 1

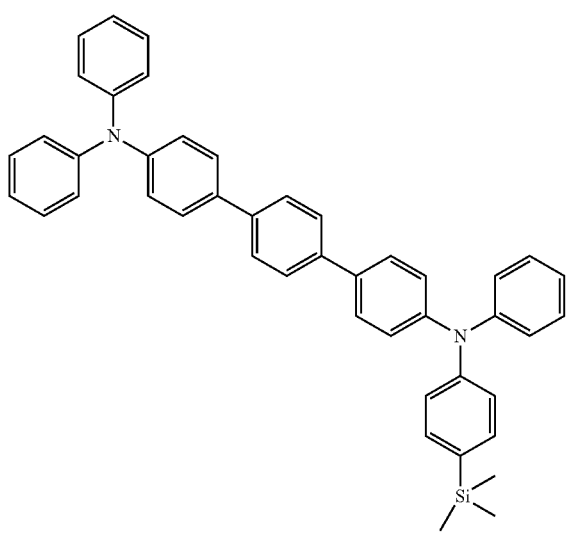

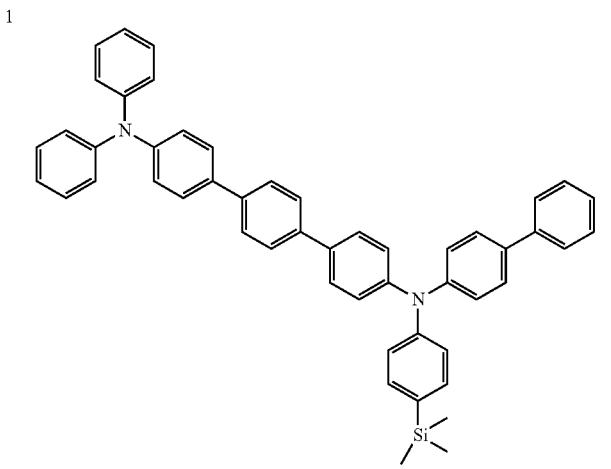

-continued
3
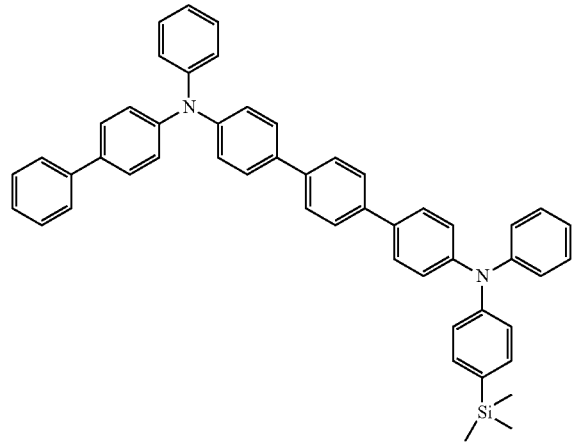
4
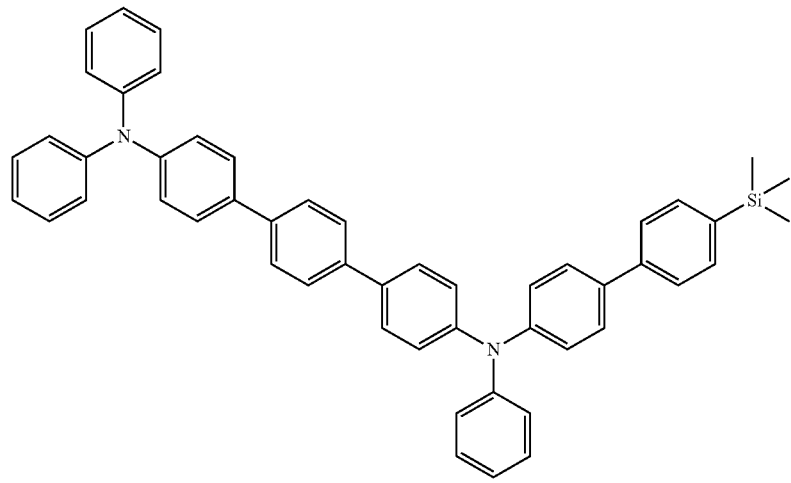
5
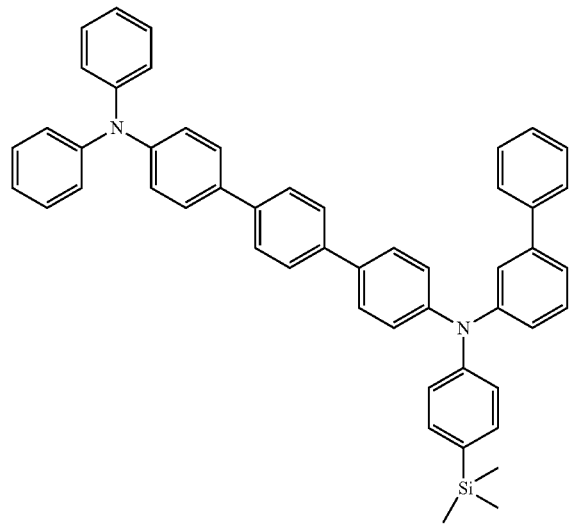
6
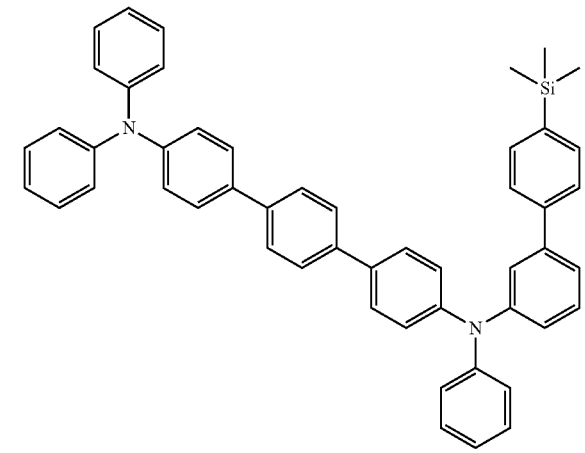

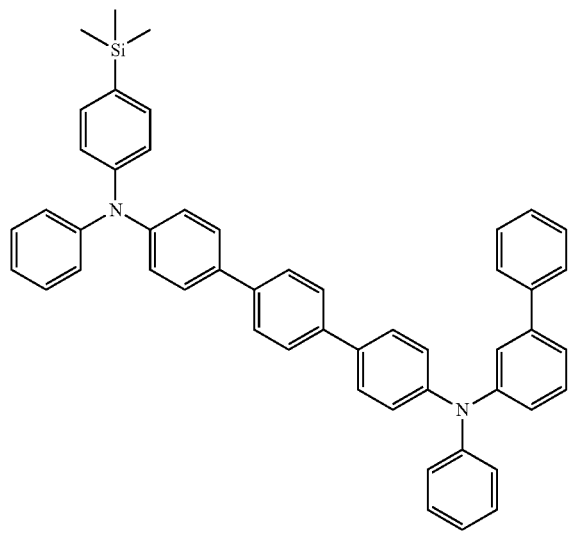
7
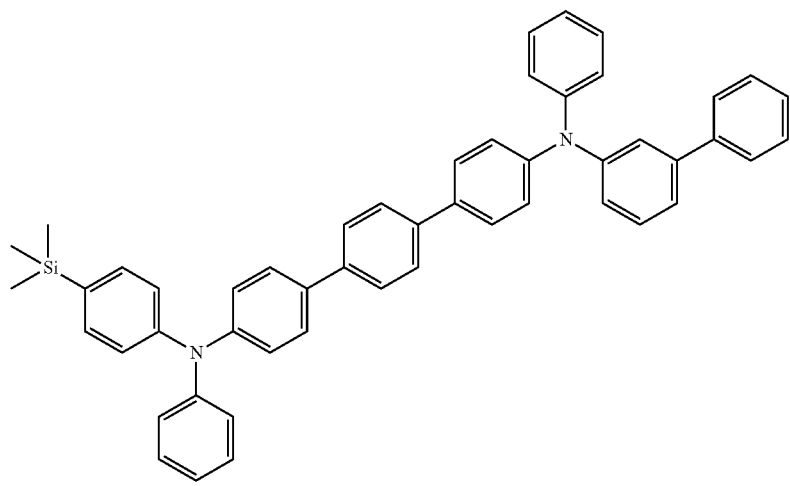
8
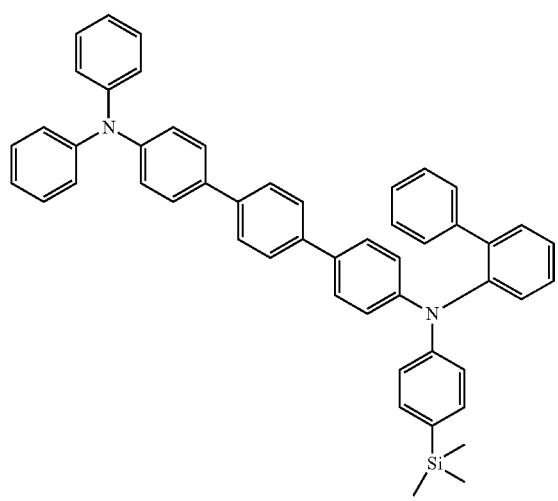
8-1
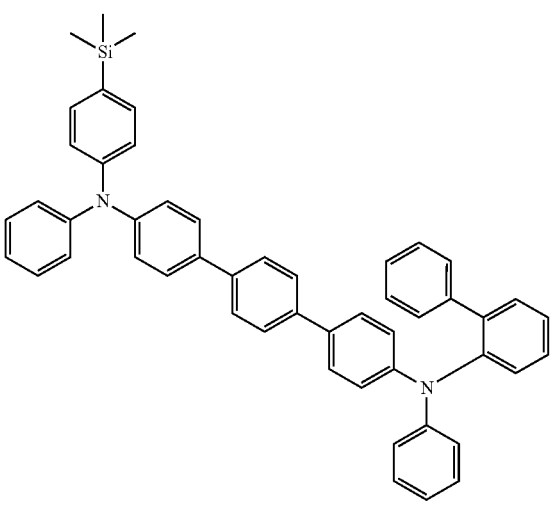
9

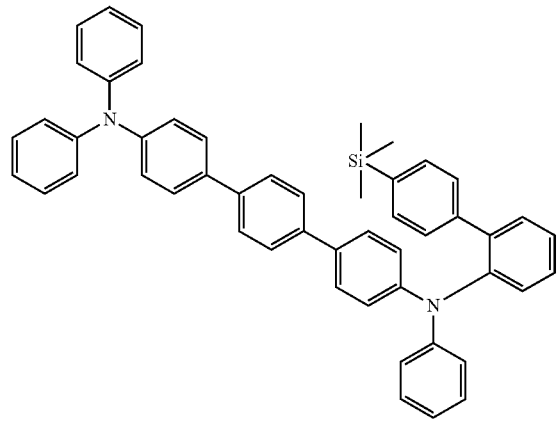
10
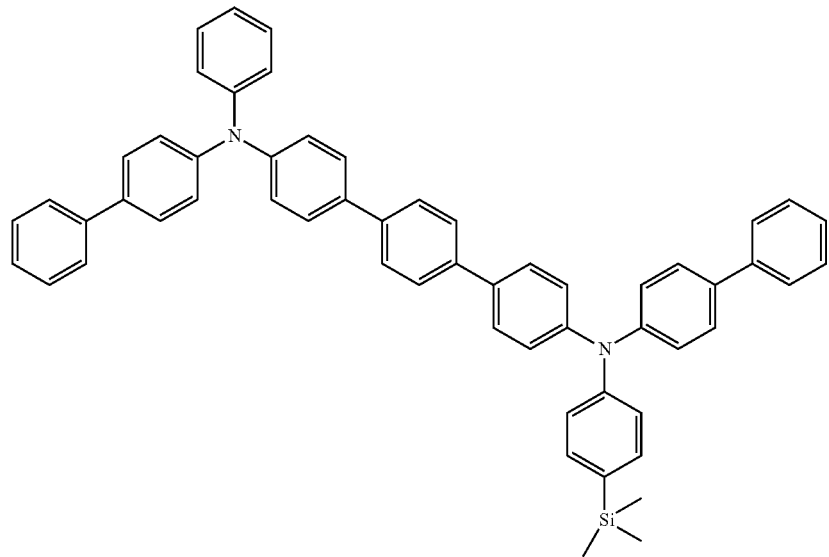
11
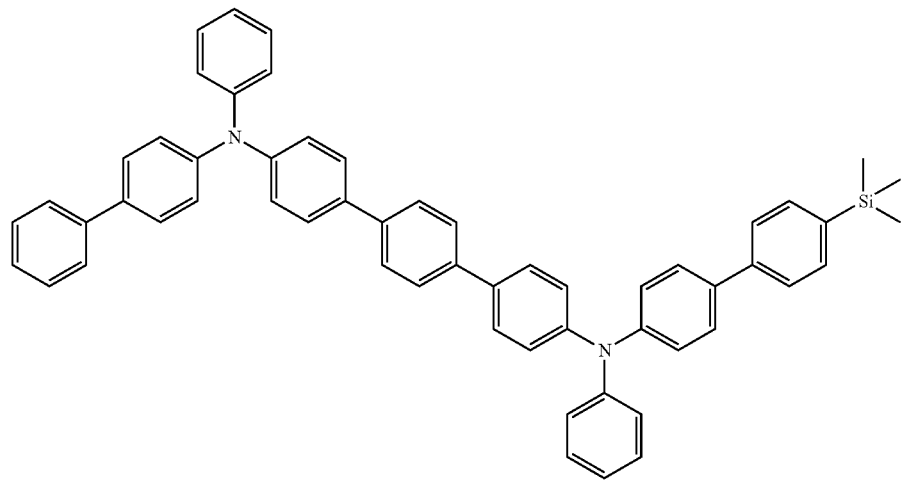
12

13
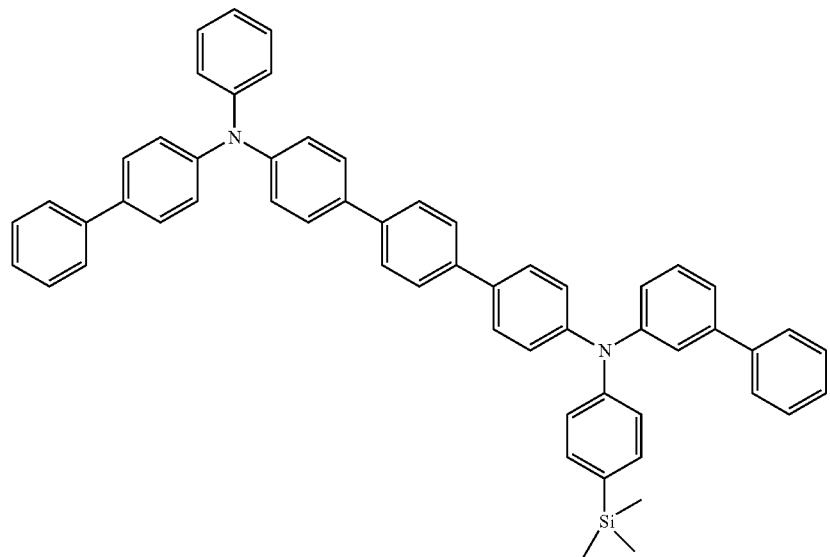
14
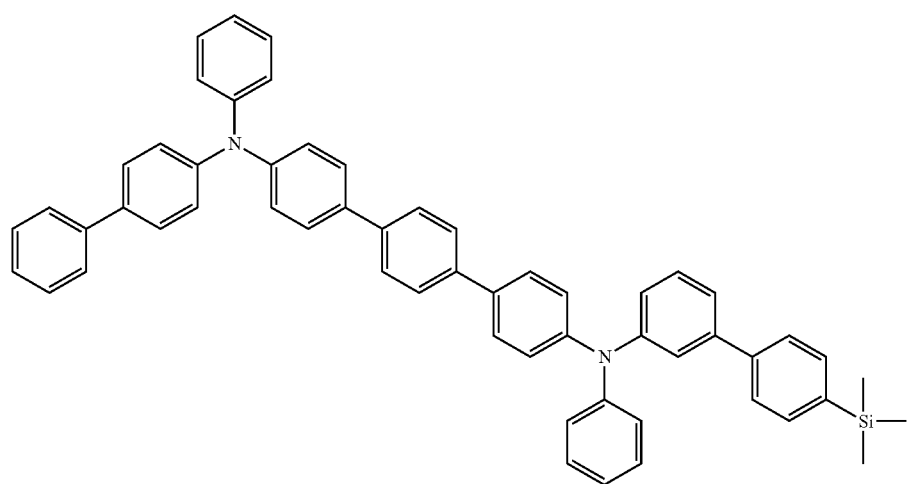
15
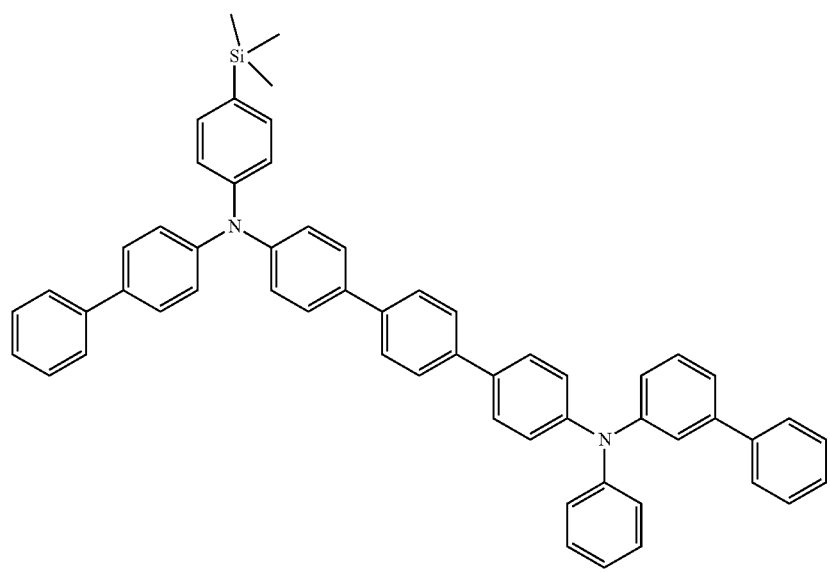

16
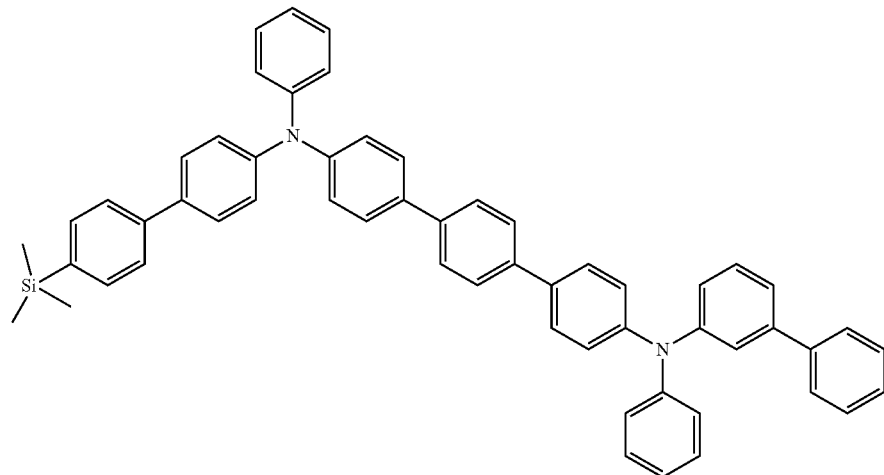
17
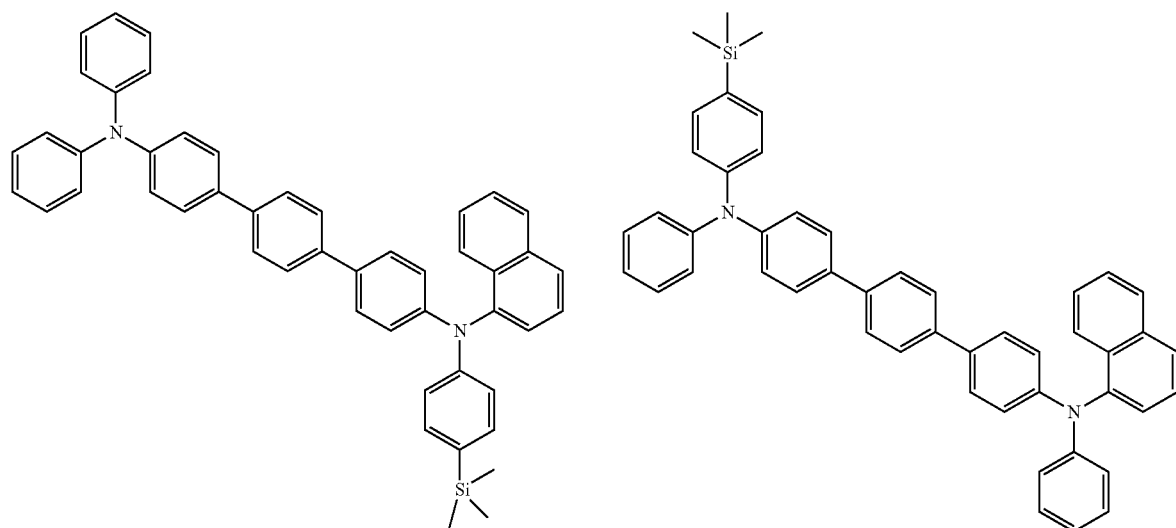
18
19
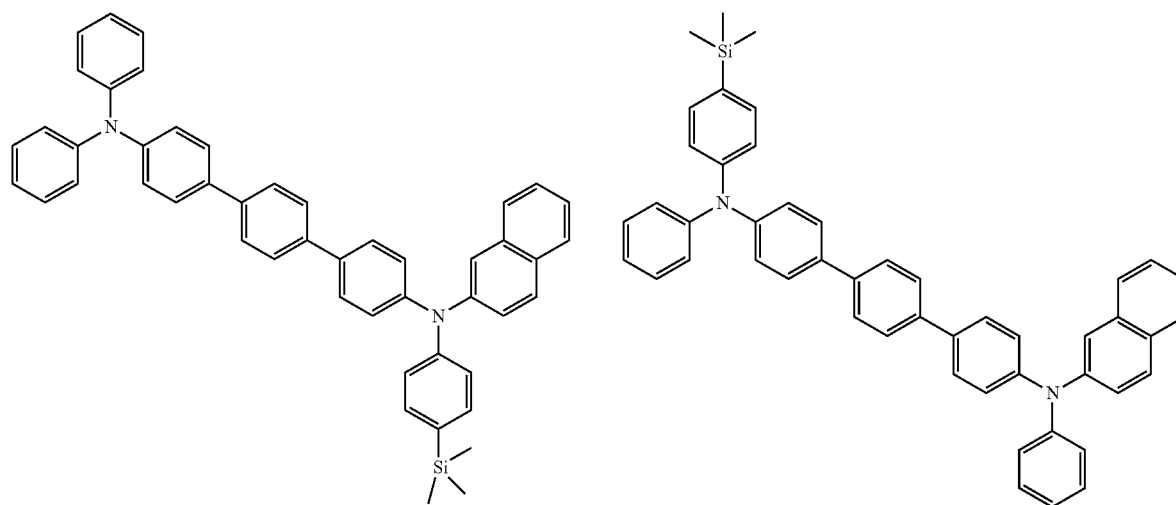
20

-continued
21
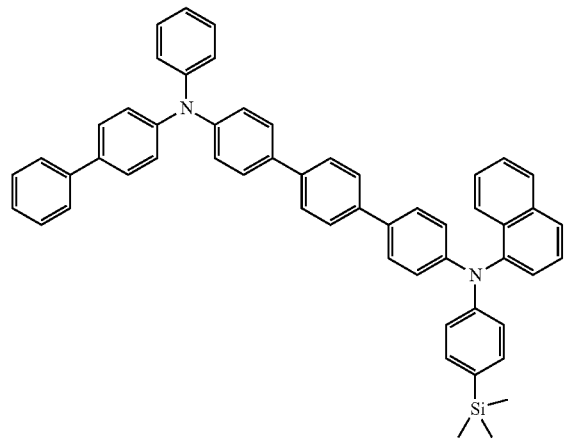
22
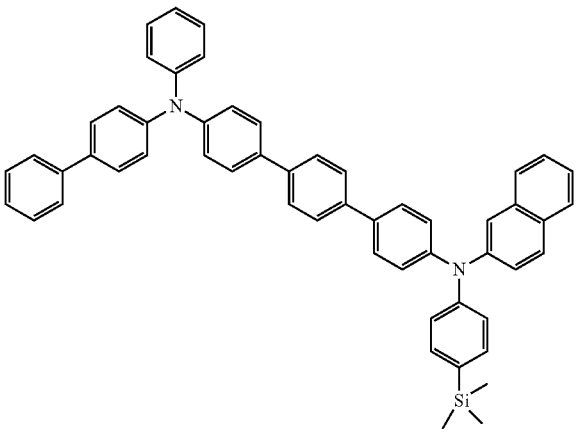
23
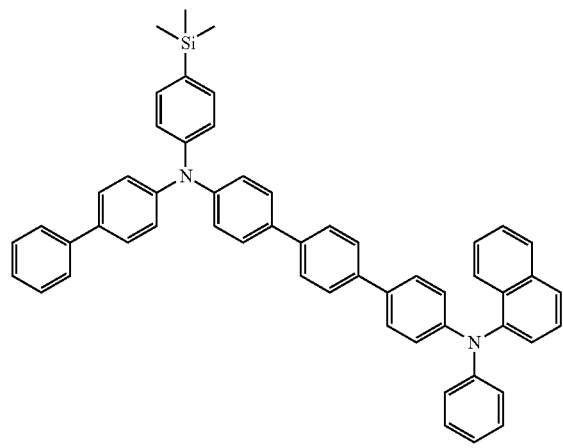
24
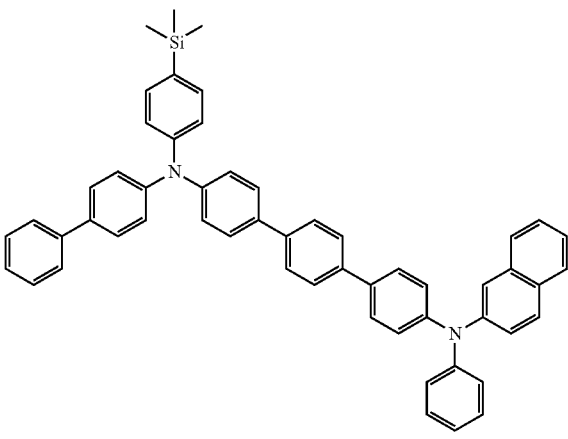
25
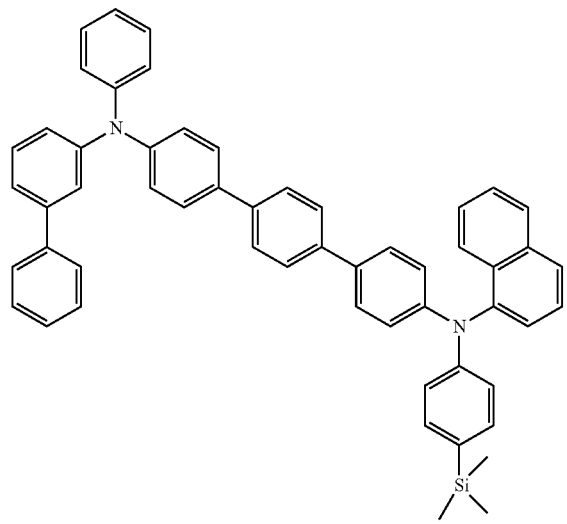
26
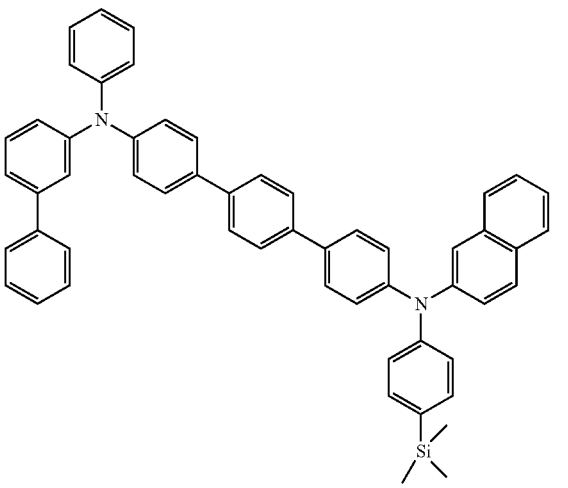

-continued
27
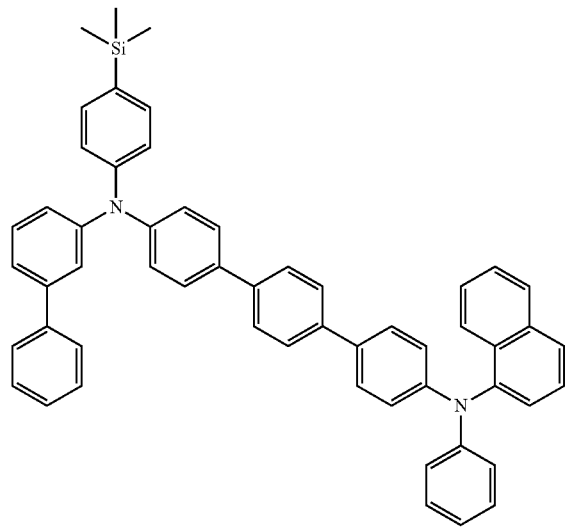
28
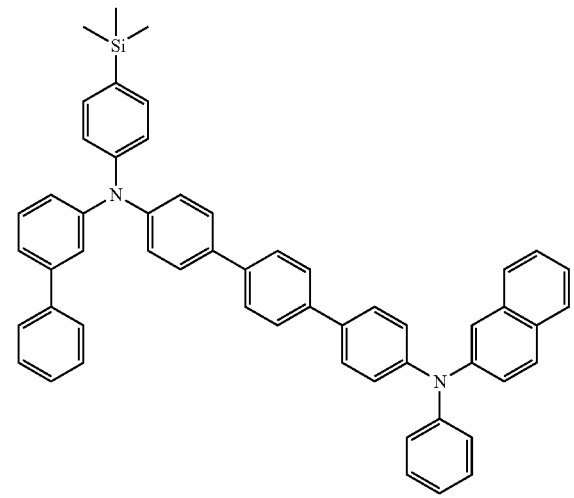
29
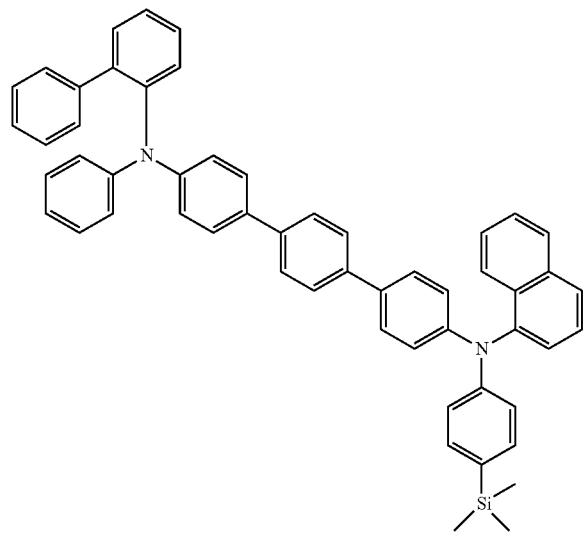
30
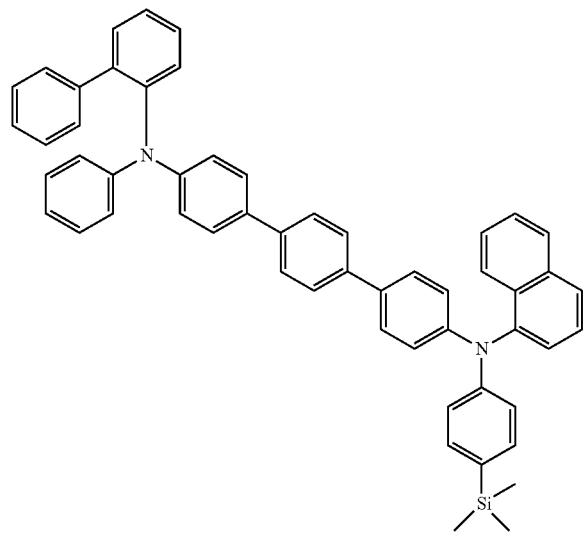
31
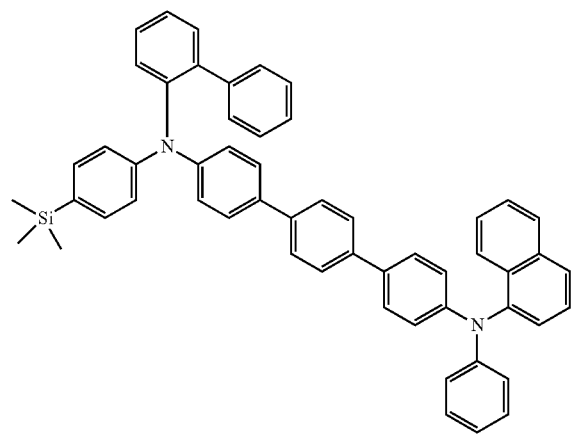
32
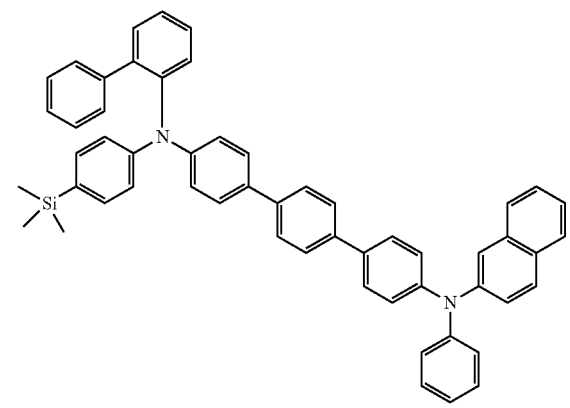

-continued
33
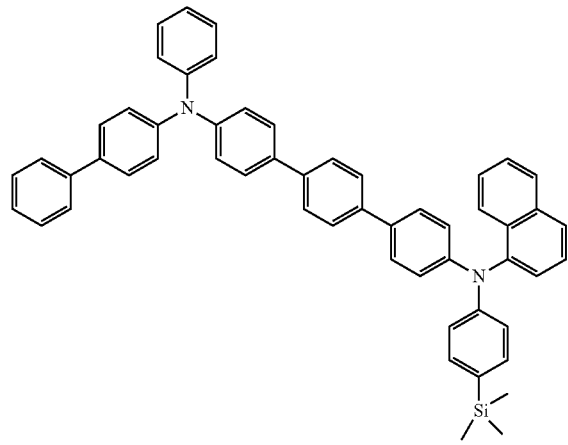
34
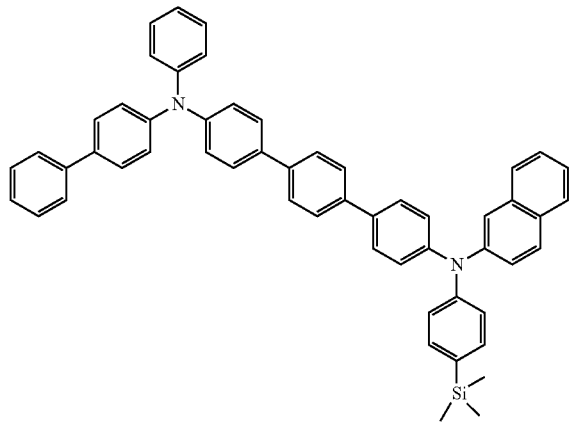
35
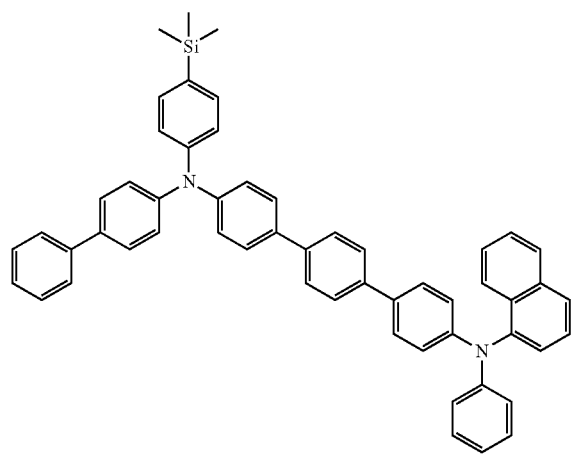
36
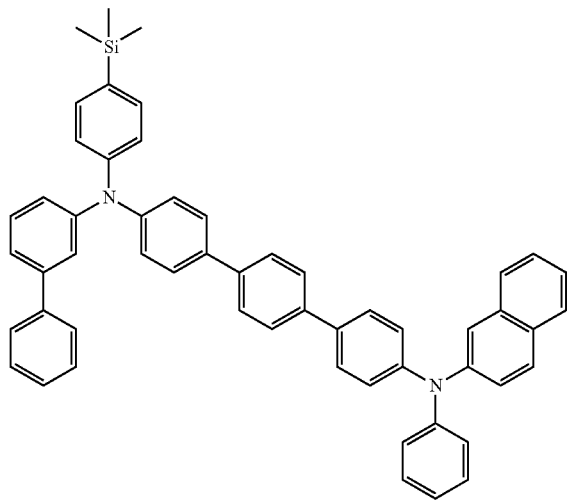
37
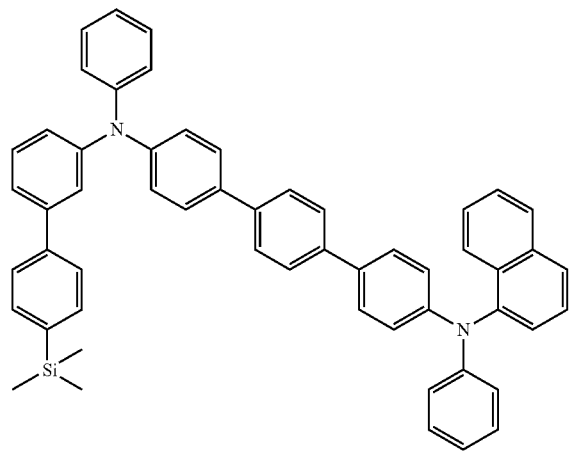
38
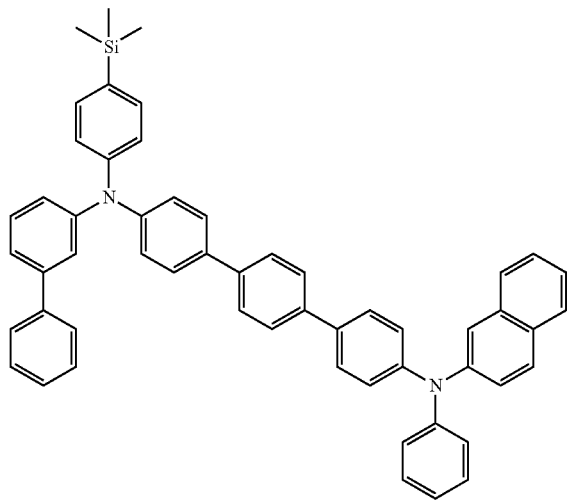

-continued
39
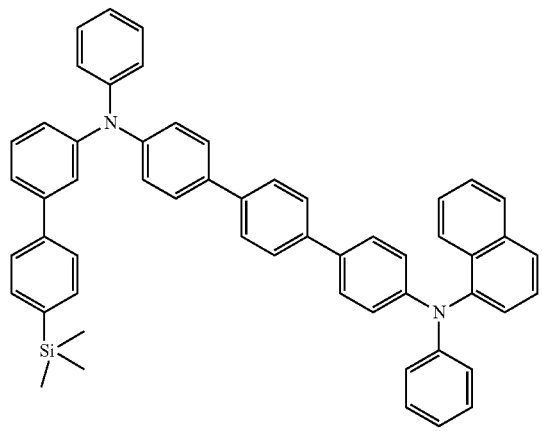
40
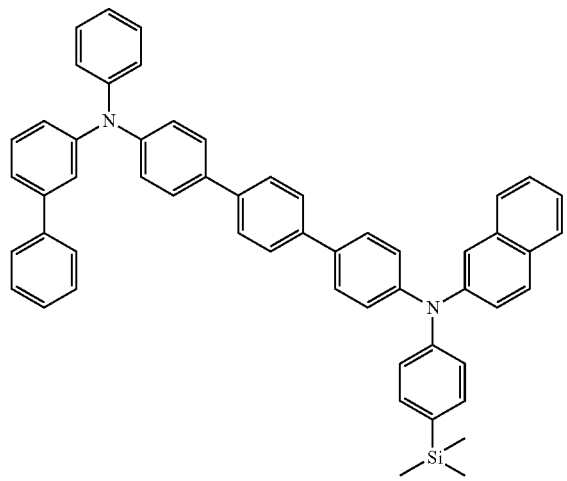
41
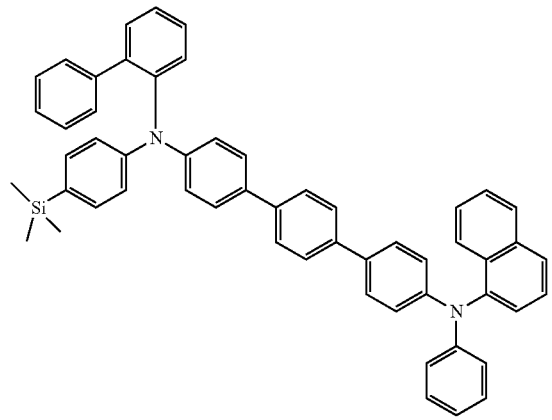
42
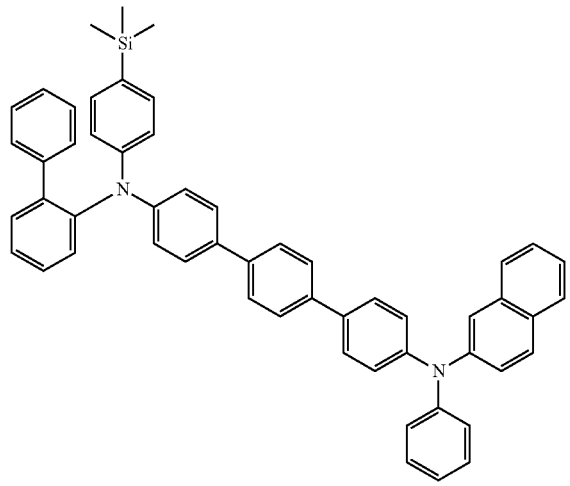
43
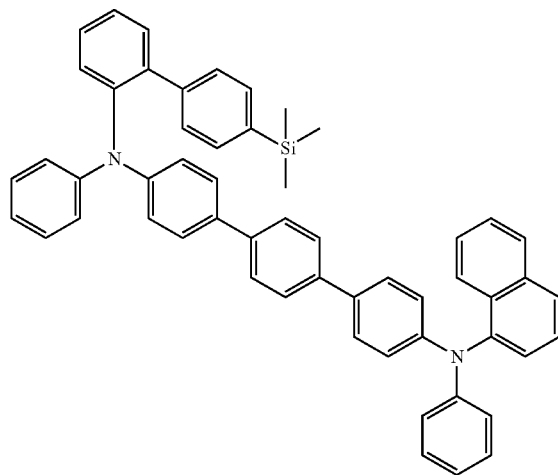
44
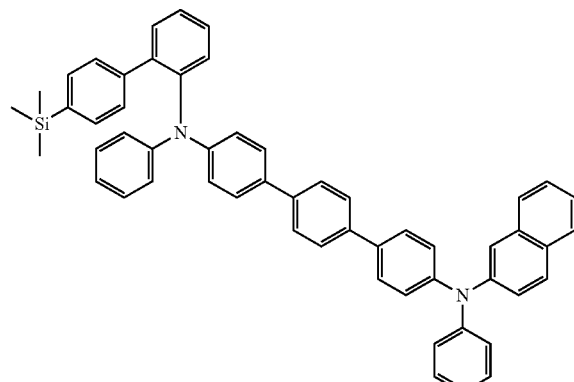

-continued
45
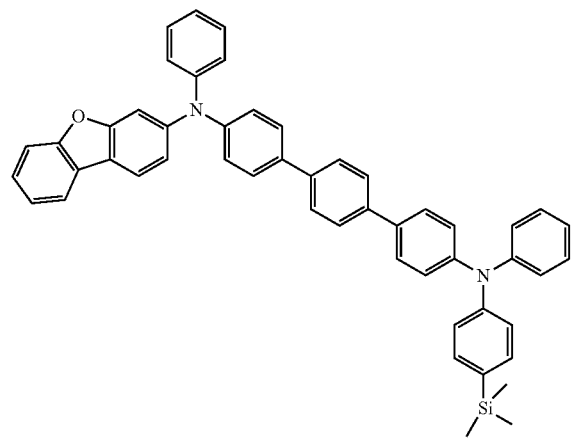
46
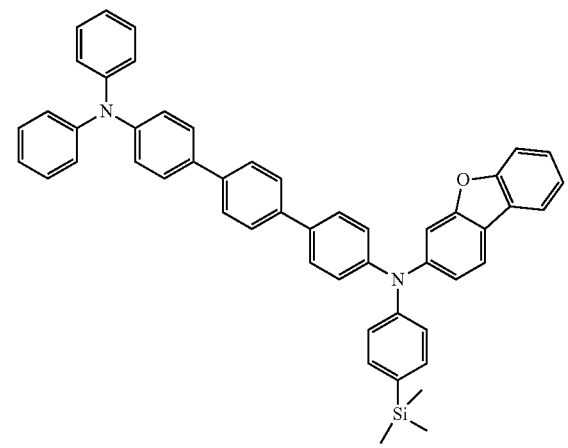
47
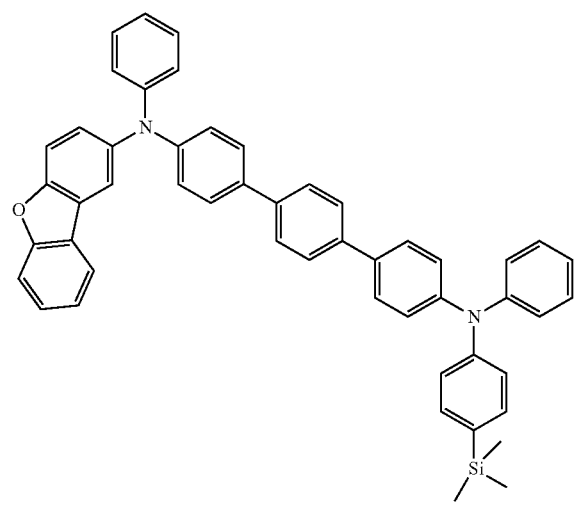
48
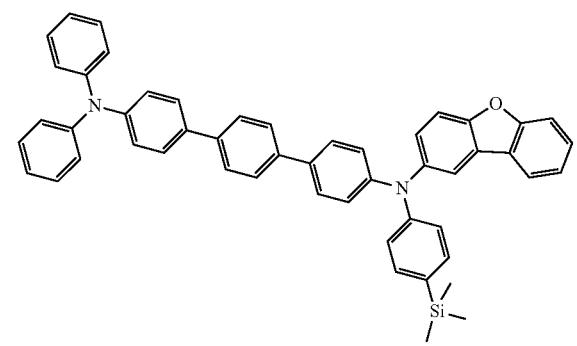
49
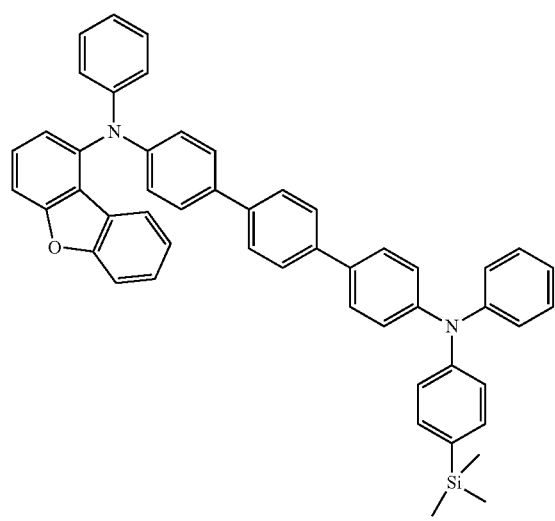
50
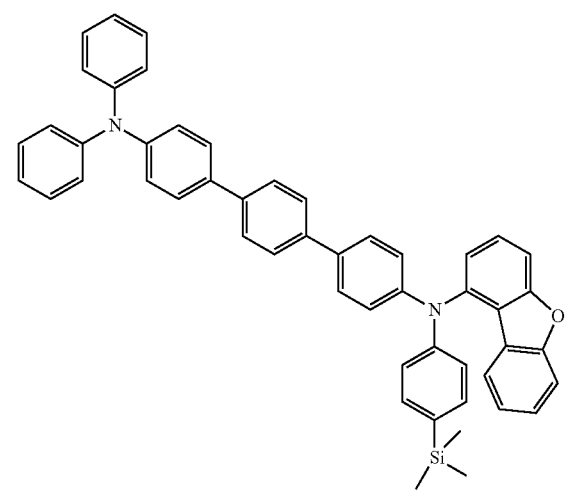

-continued
51
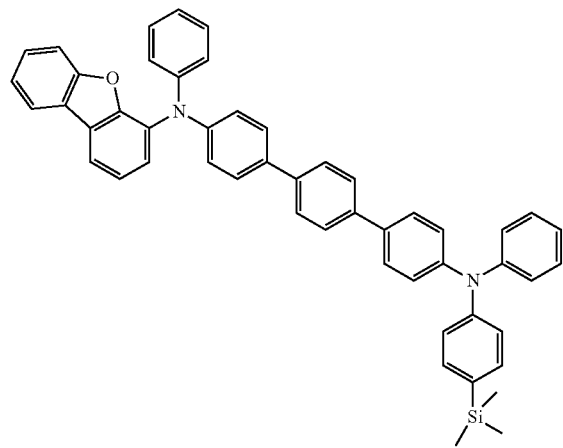
52
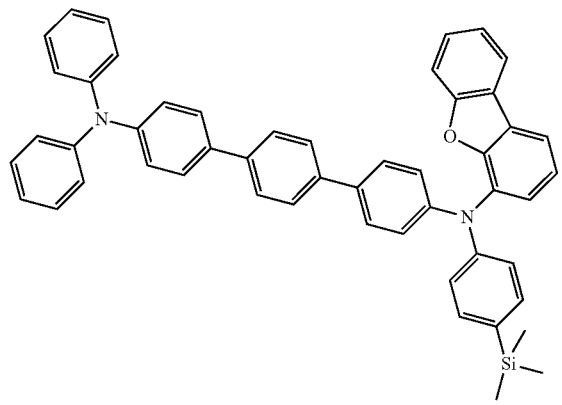
53
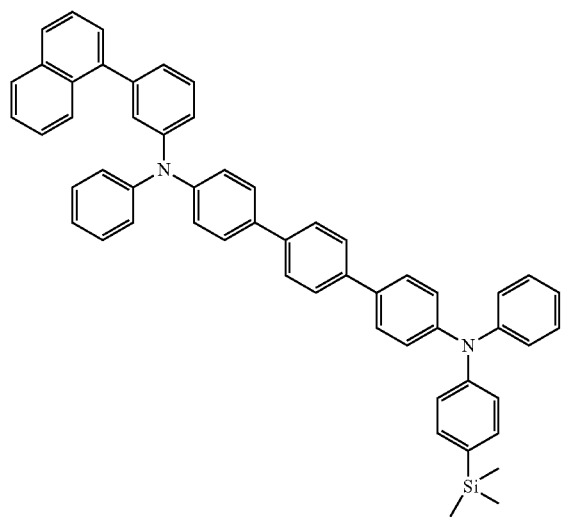
54
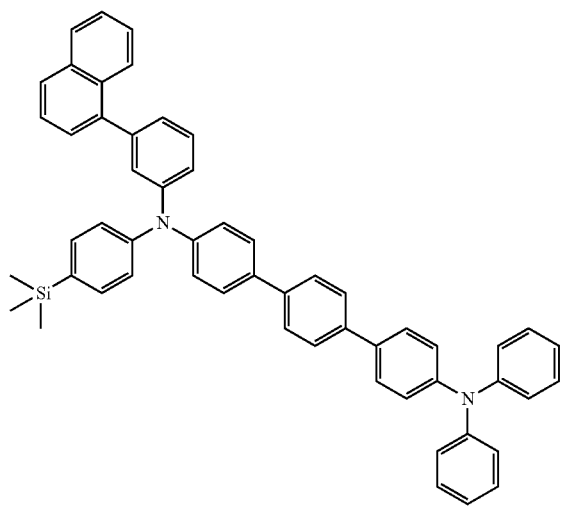
55
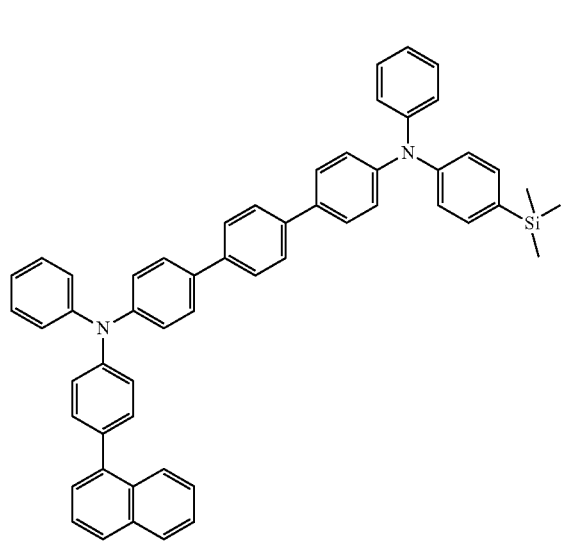
56
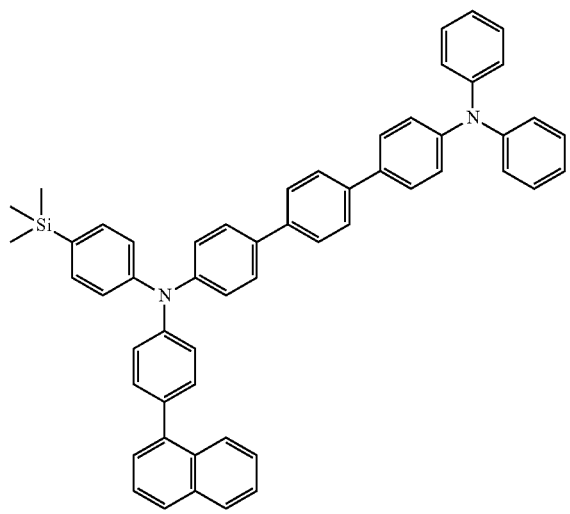

-continued
57
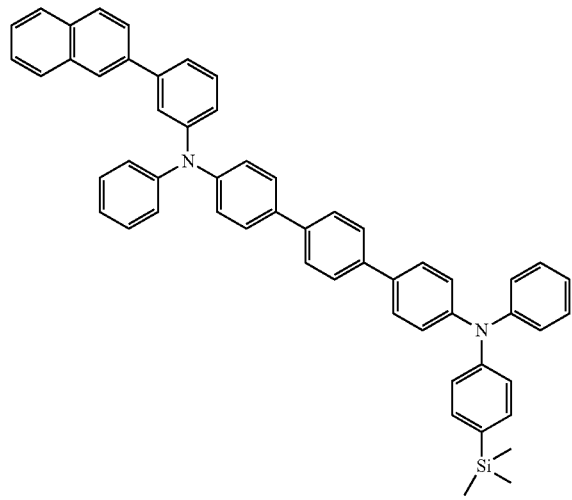
58
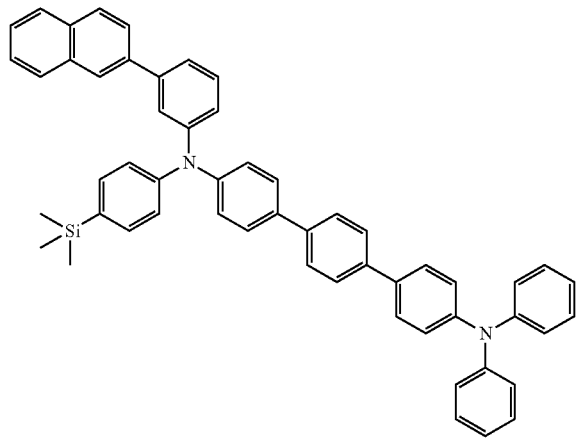
59
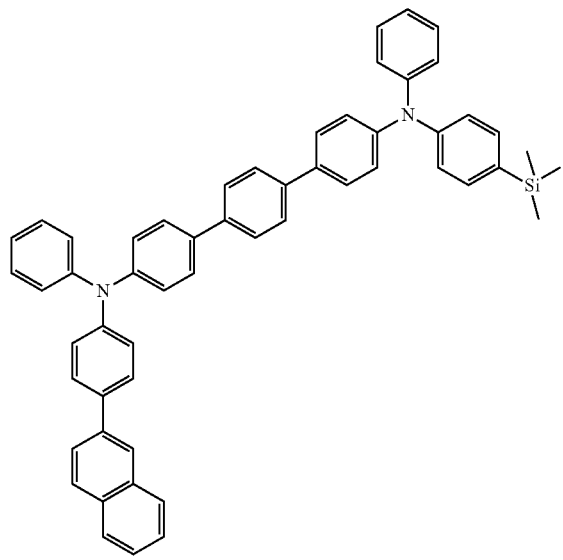
60
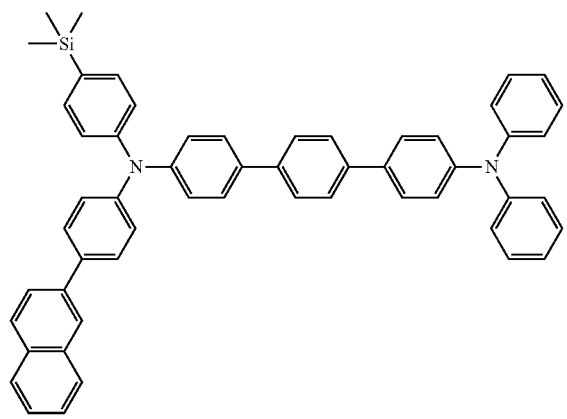
61
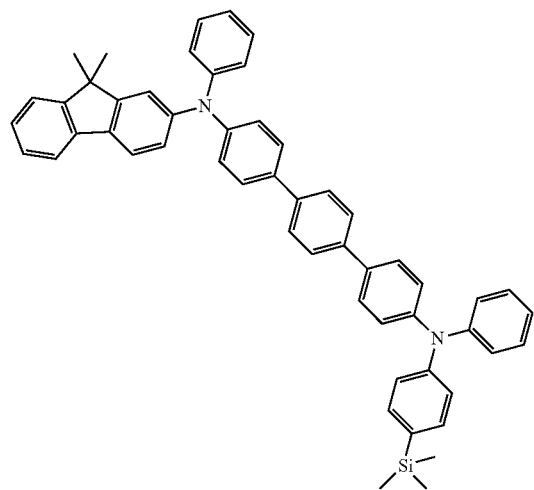
62
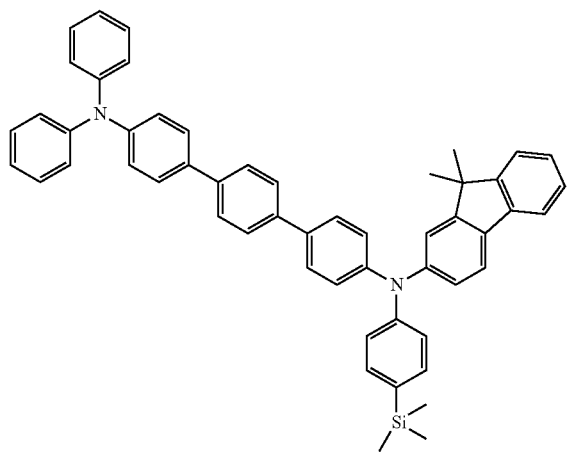

63
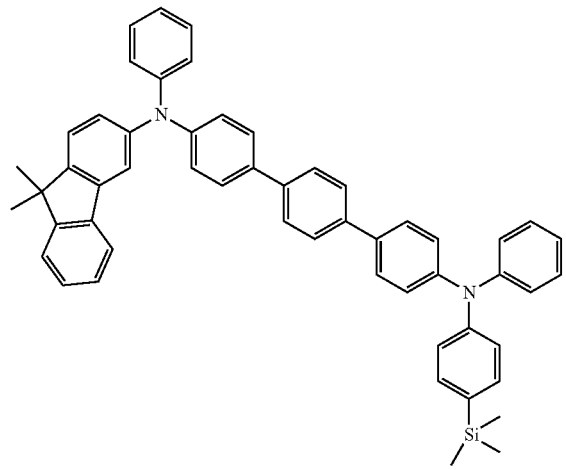
64
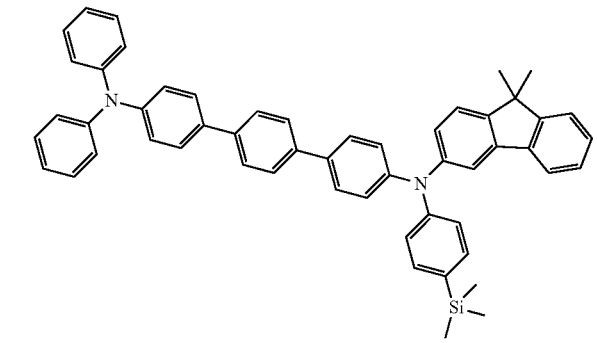
65
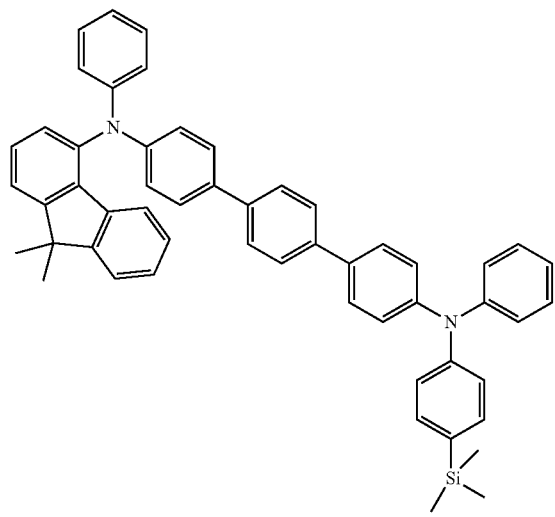
66
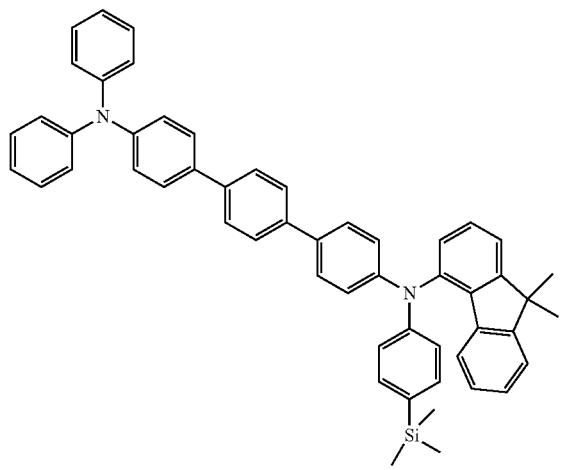
67
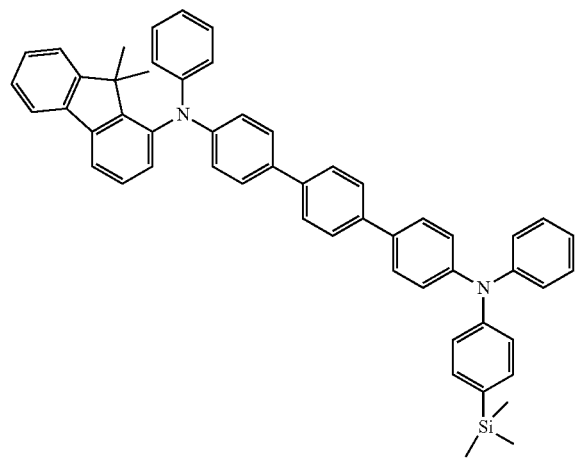
68
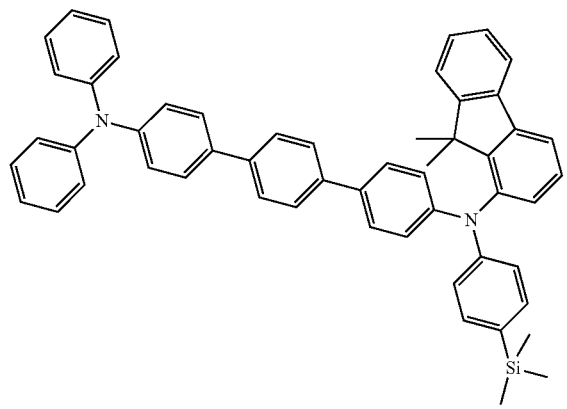

69
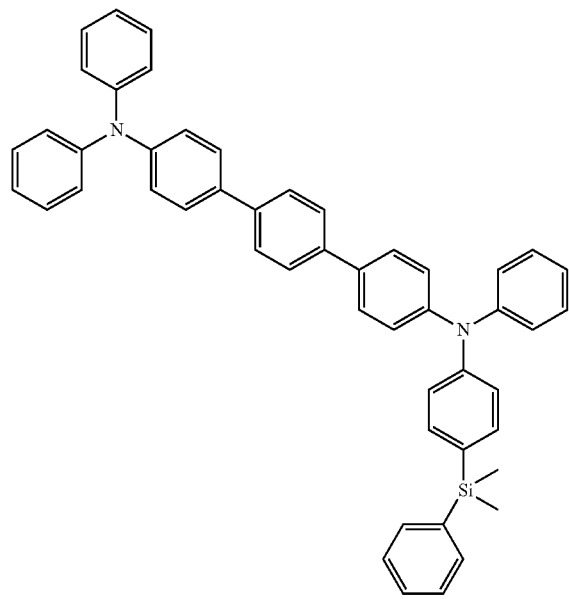
70
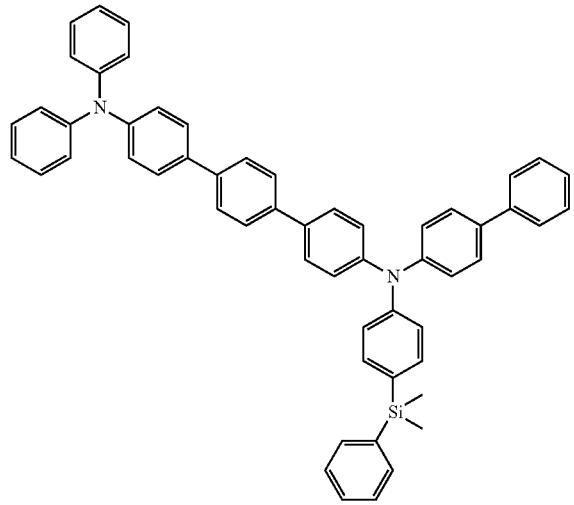
71
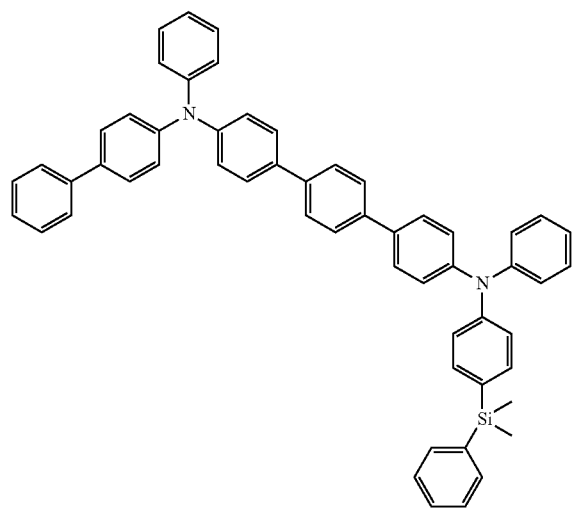
72
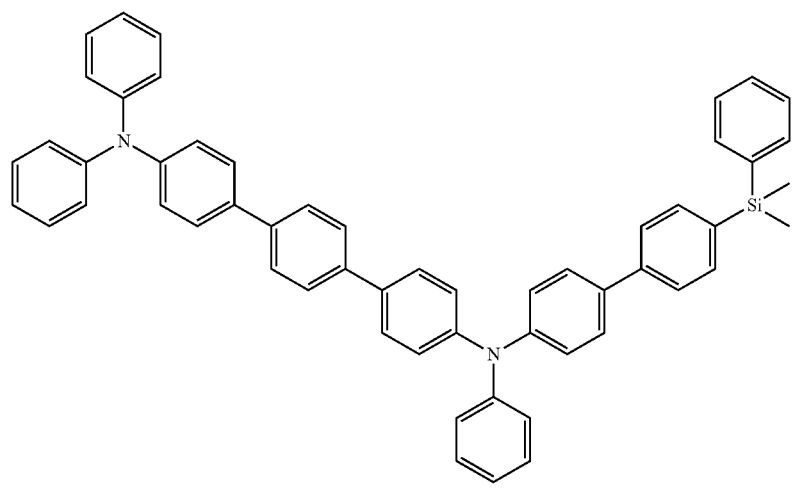

-continued
73
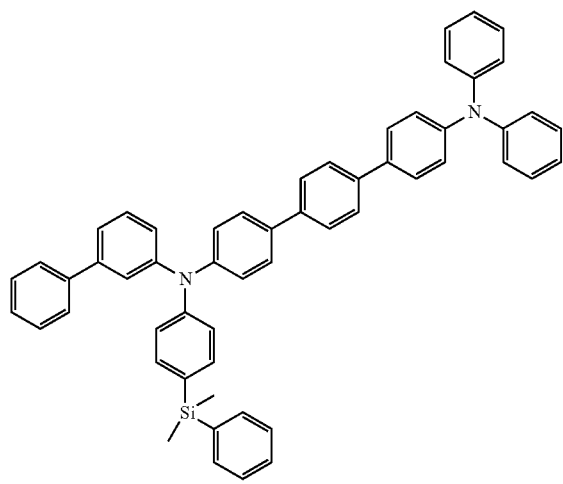
74
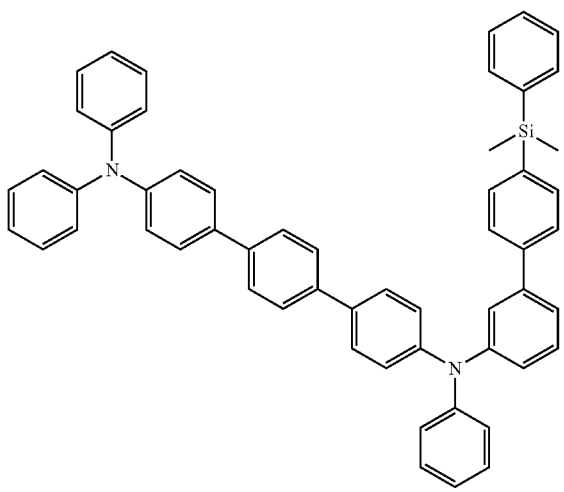
75
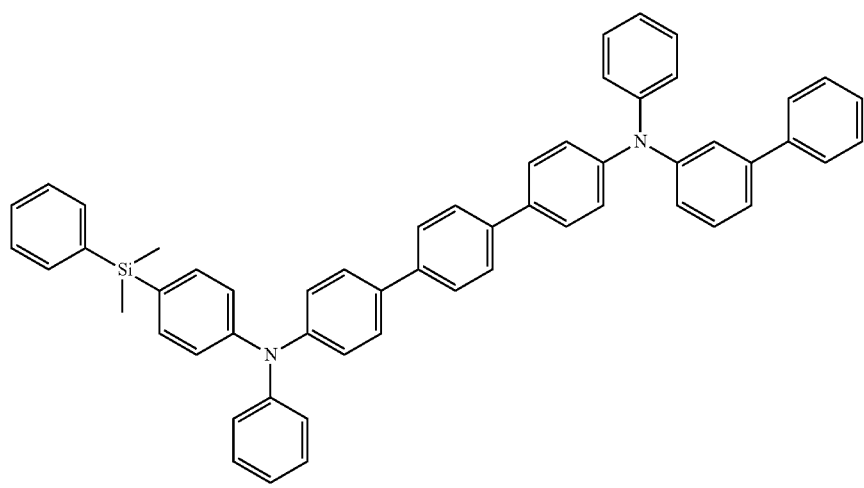
76
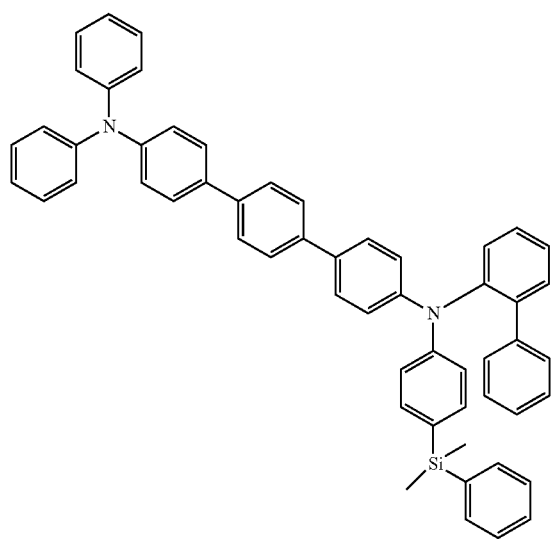
77
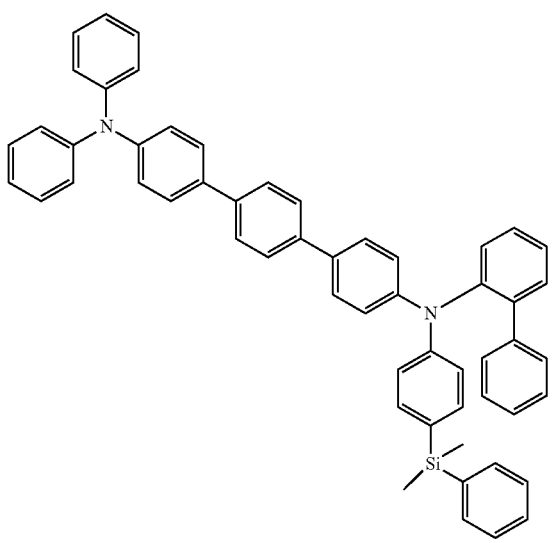

78
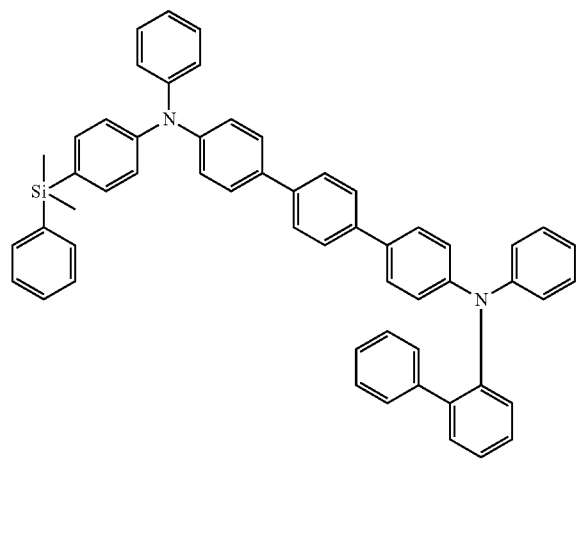
79
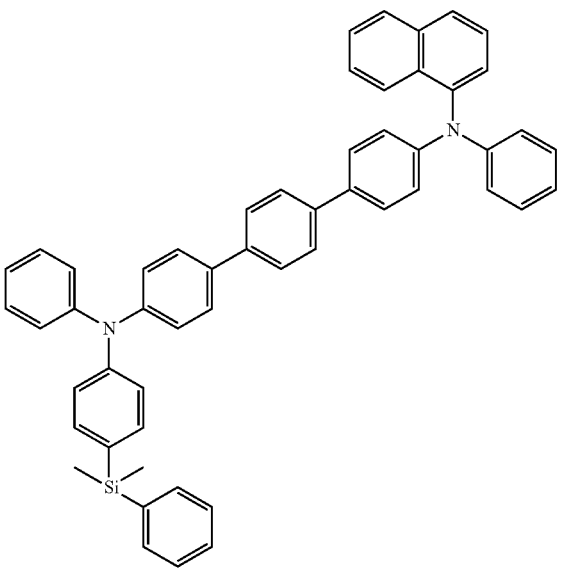
80
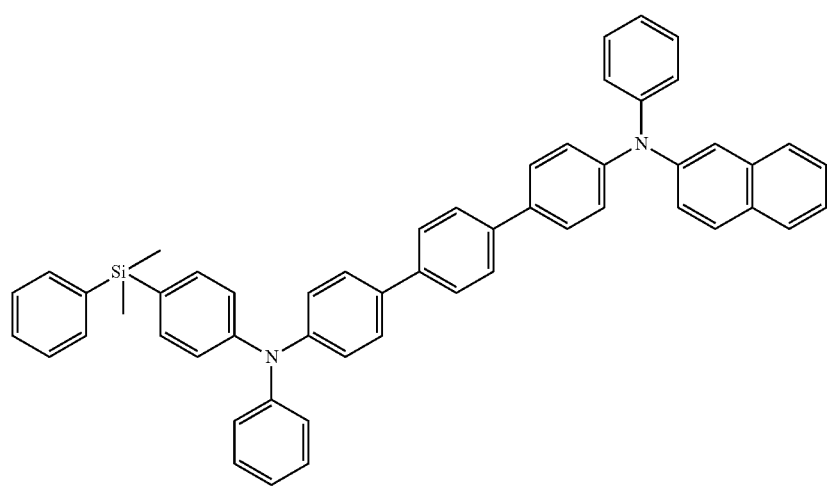
81
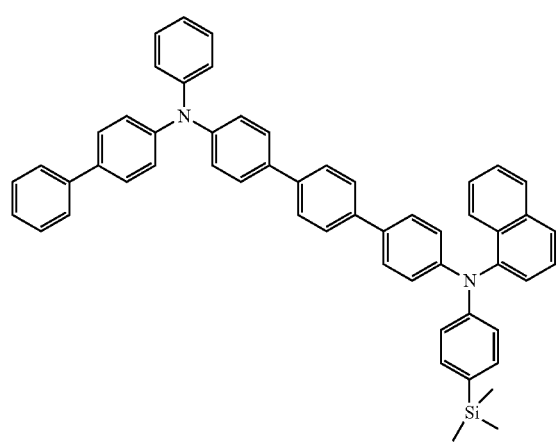
82
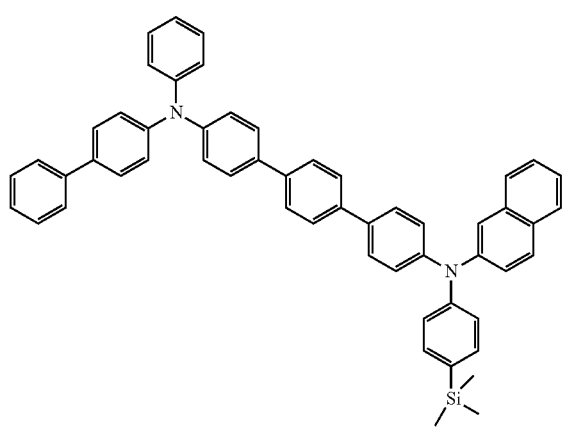

-continued
83
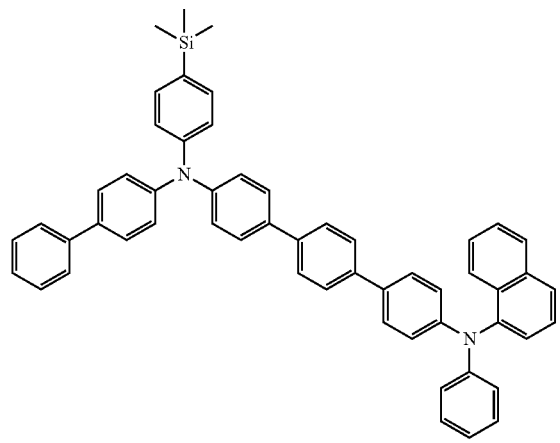
84
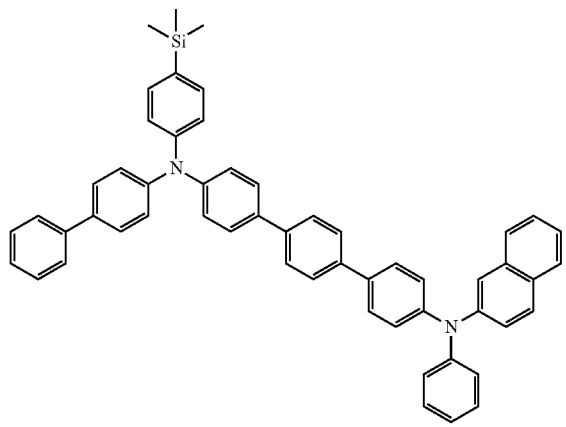
85
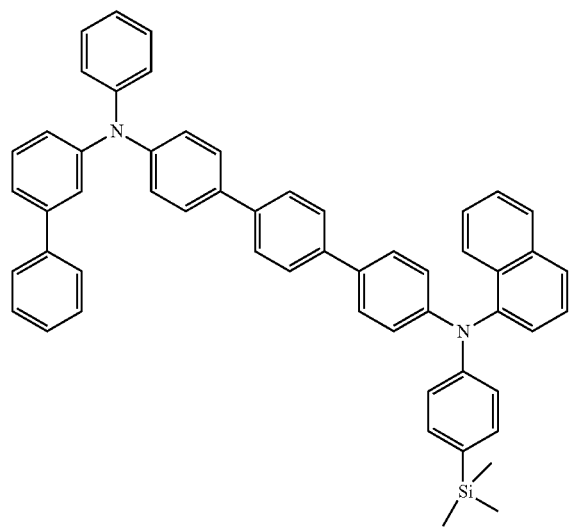
86
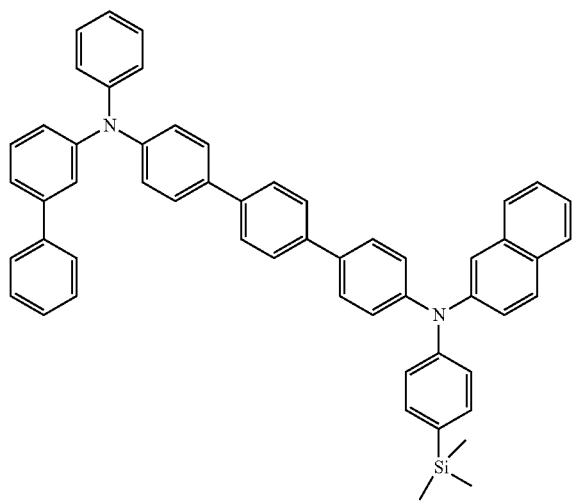
87
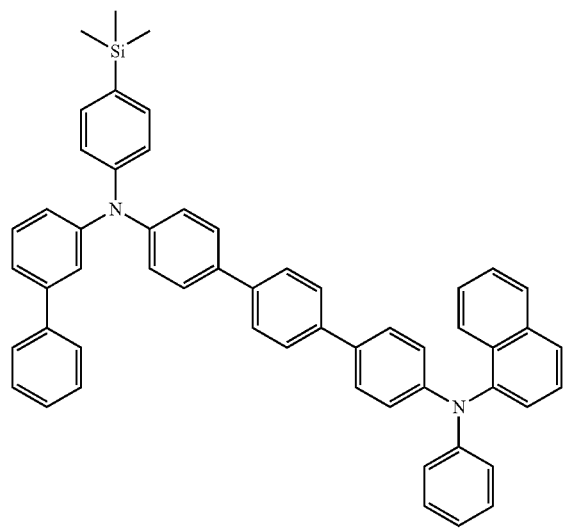
88
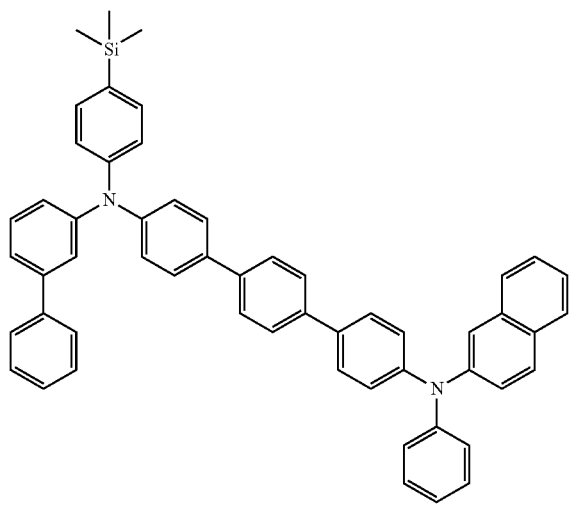

15. An amine compound represented by formula 1 below:

Formula 4-3

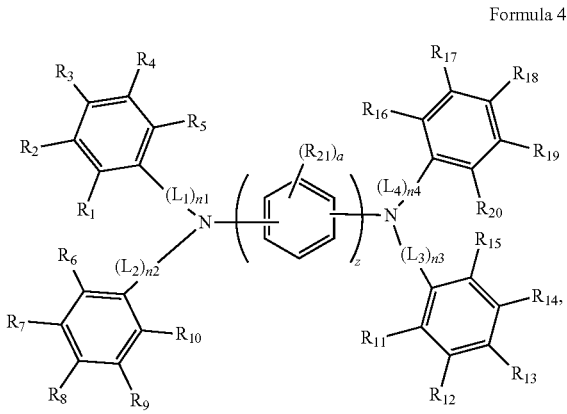

wherein, in Formula 1,
$L_1$ to $L_4$ are each independently a direct bond, a substituted or unsubstituted arylene group having 6 to 30 ring-forming carbon atoms or a substituted or unsubstituted heteroarylene group having 2 to 30 ring-forming carbon atoms,
n1 to n4 are each independently an integer of 0 or more and 3 or less,
z is an integer of 1 to 5,
a is an integer of 0 to 4, and
$R_1$ to $R_{21}$ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted ring heteroaryl group having 2 to 30 ring-forming carbon atoms,
where at least one among $R_1$ to $R_{20}$ is a substituted silyl group or an aryl group having 6 to 30 ring-forming carbon atoms in which a silyl group is substituted.

16. The amine compound of claim 15, wherein Formula 1 is represented by Formula 2 below:

Formula 2

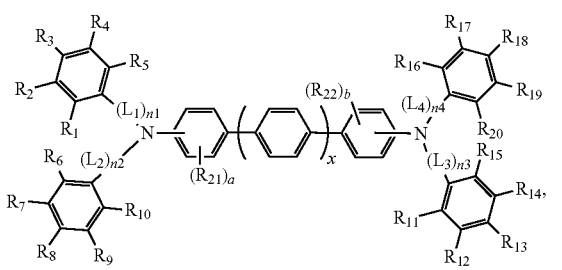

and
wherein, in Formula 2,
$R_{22}$ is a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, b is an integer of 0 to 4,
x is an integer of 0 to 2, and
$L_1$ to $L_4$, n1 to n4, a, and $R_1$ to $R_{21}$ are the same as defined in Formula 1.

17. The amine compound of claim 16, wherein Formula 2 is represented by Formula 3 below:

Formula 3

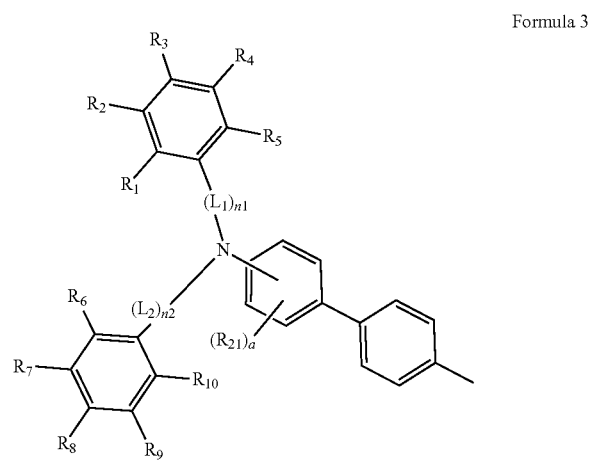

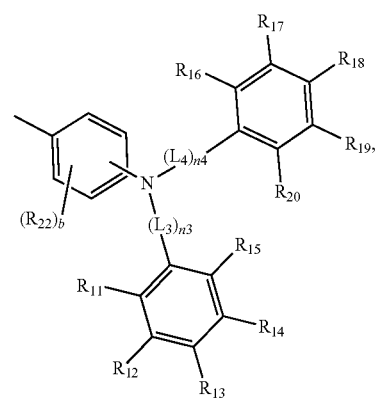

and
wherein, in Formula 3,
L1 to L4, n1 to n4, a, b, and $R_1$ to $R_{22}$ are the same as defined in Formula 2.

18. The amine compound of claim 17, wherein Formula 3 is represented by Formula 4 below:

Formula 4

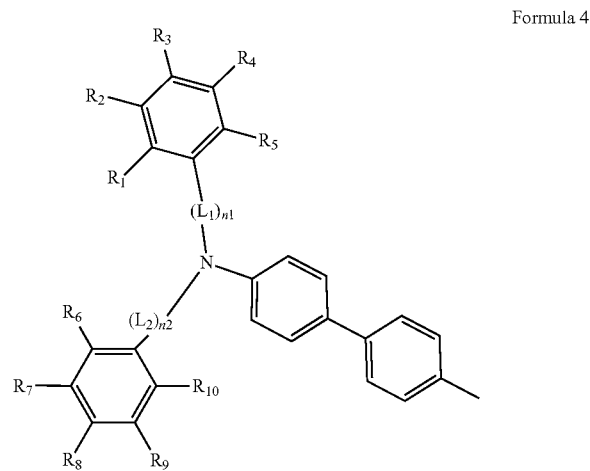

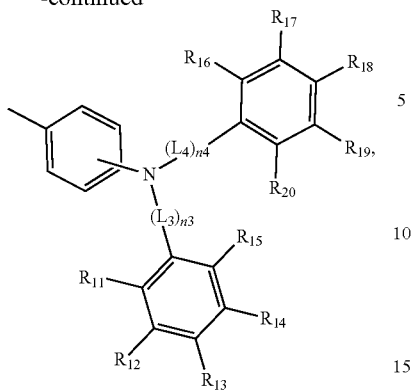
and
wherein, in Formula 4,
$L_1$ to $L_4$, n1 to n4, a, b, and $R_1$ to $R_{20}$ are the same as defined in Formula 3.
19. The amine compound of claim 18, wherein Formula 4 is represented by any one of Formulae 4-1 to 4-3 below:
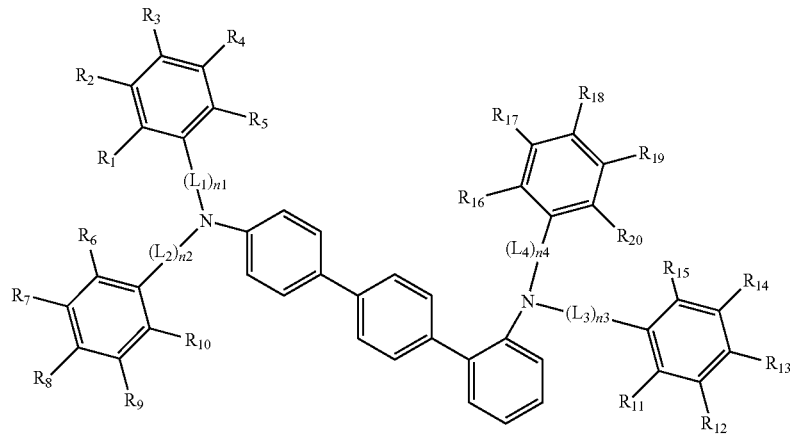
Formula 4-1
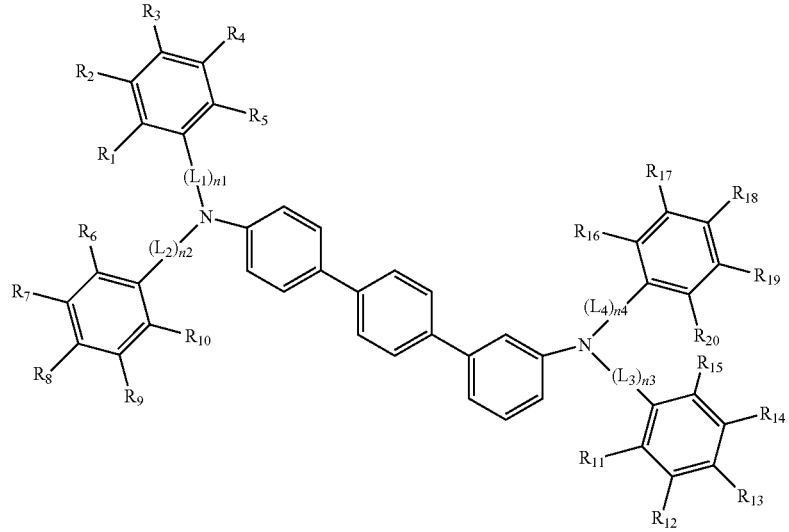
Formula 4-2

-continued
Formula 4-3
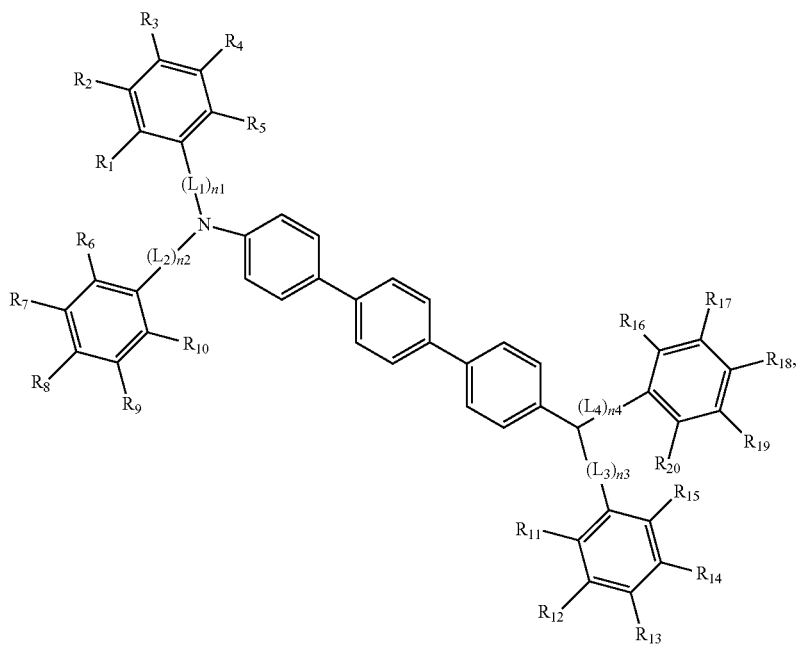
and
wherein, in Formulae 4-1 to 4-3,
L$_1$ to L$_4$, n1 to n4, and R$_1$ to R$_{20}$ are the same as defined in Formula 4.
20. The amine compound of claim 15, wherein the amine compound represented by Formula 1 is one among the compounds represented by Compound Group 1 below
Compound Group 1
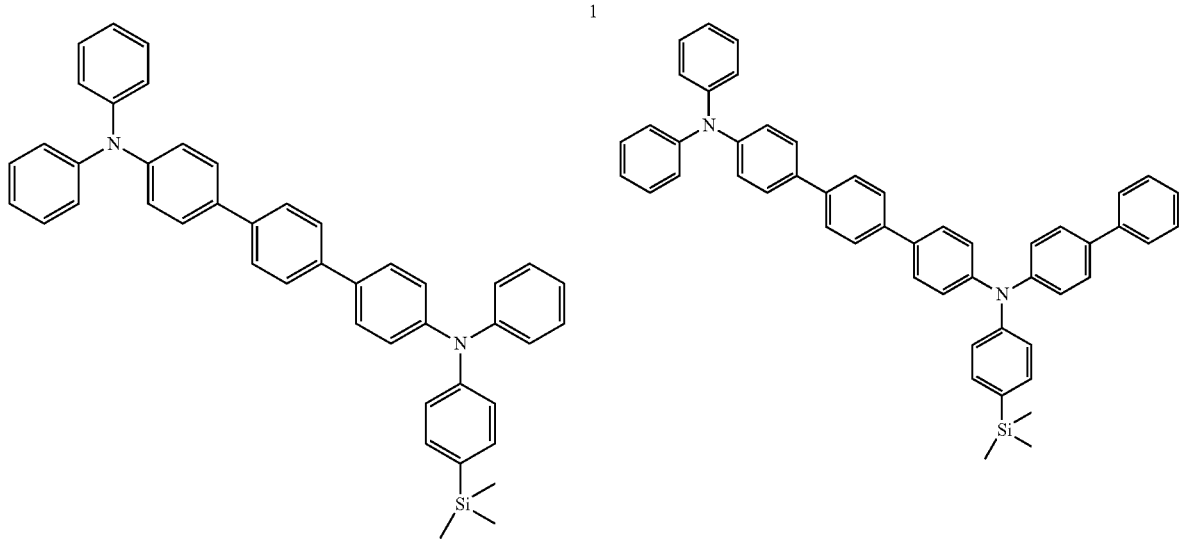

3
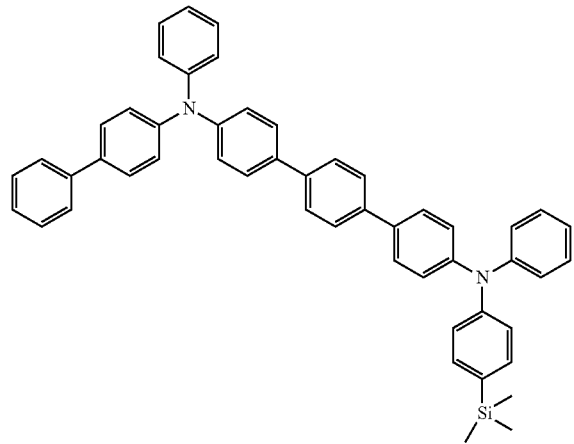
4
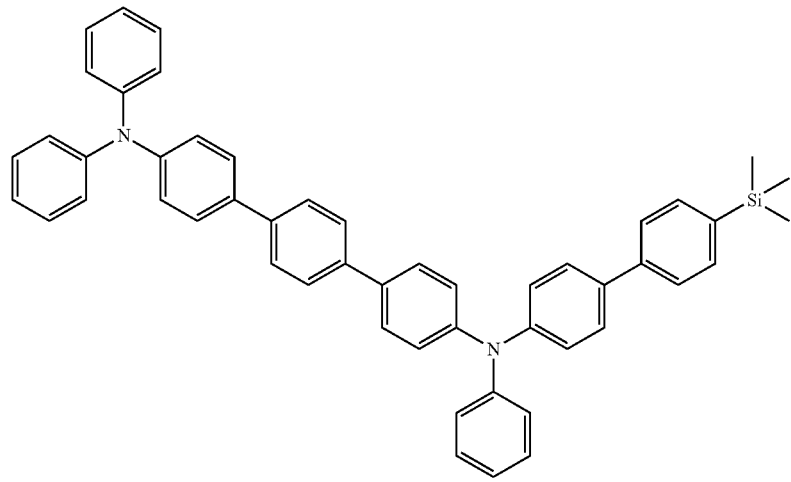
5
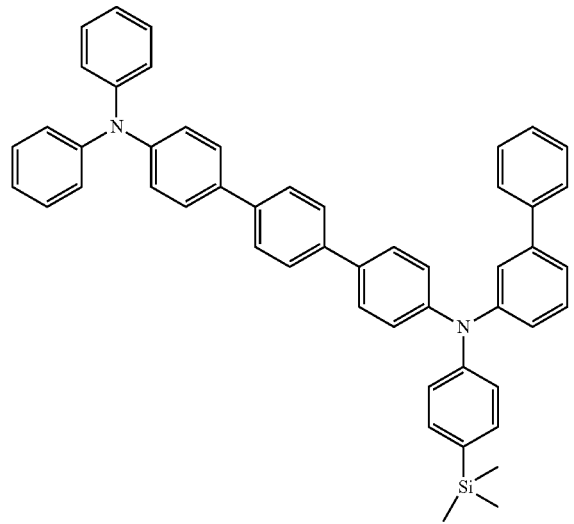
6
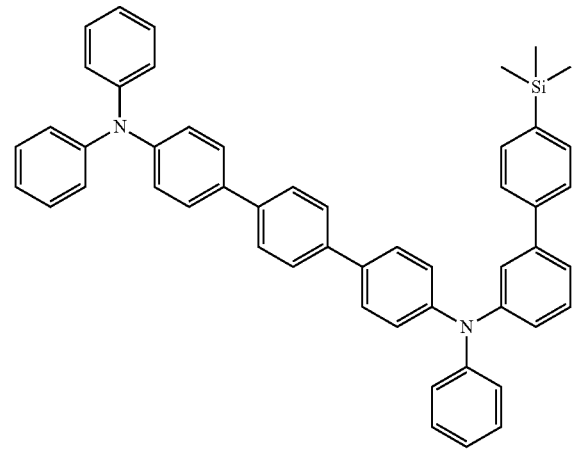

-continued
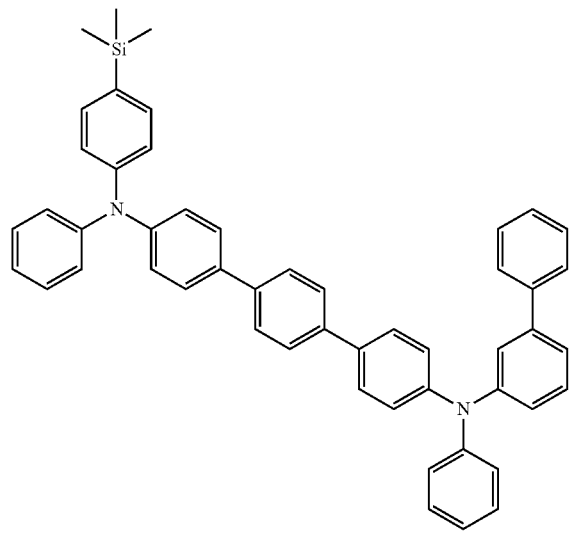
7
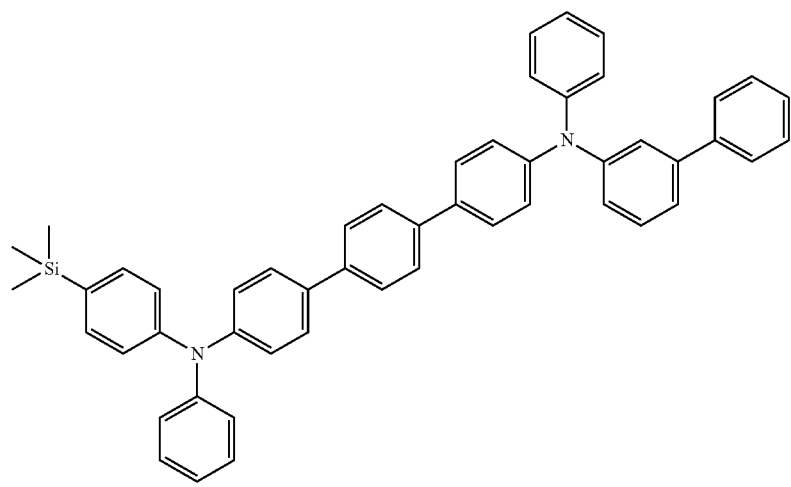
8
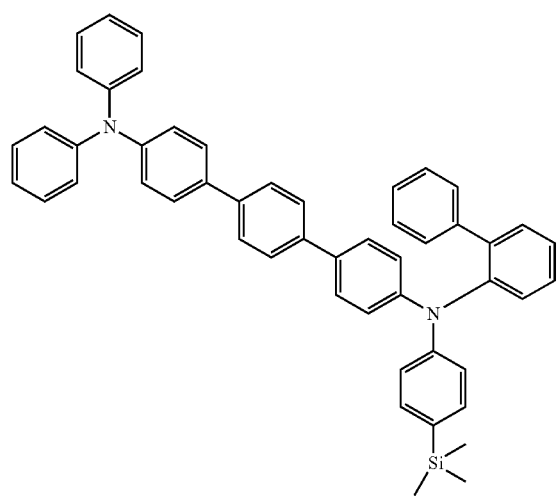
8-1
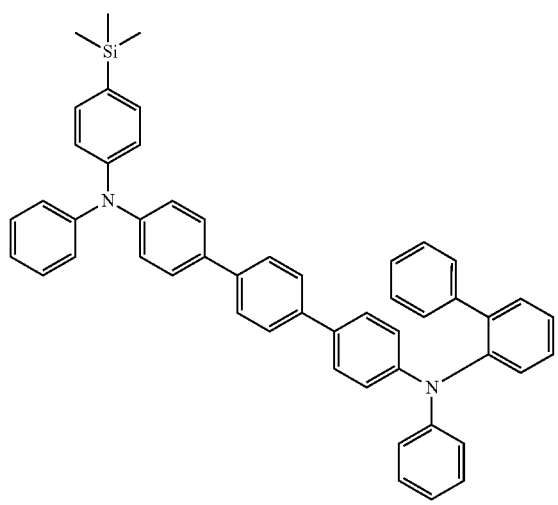
9

10
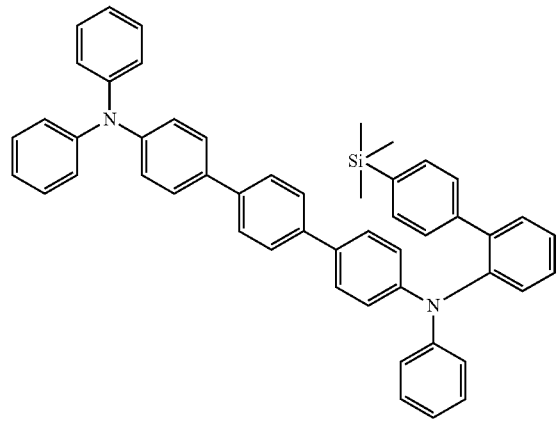
11
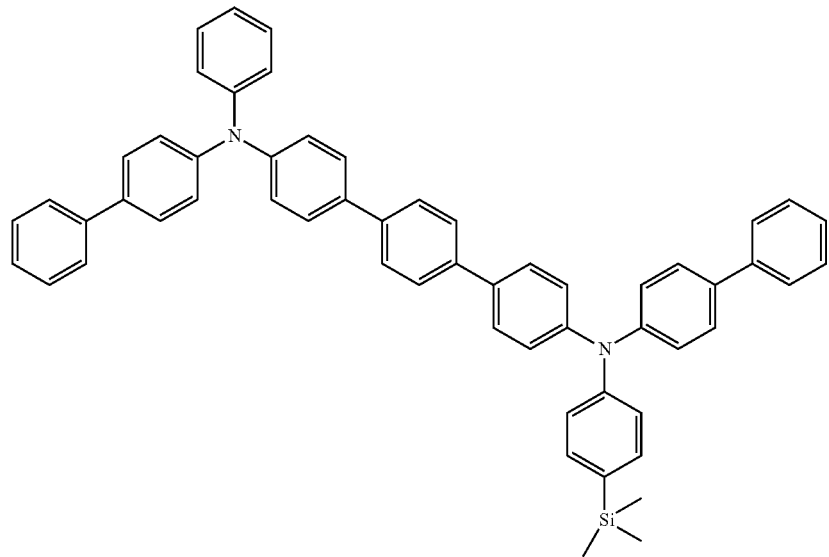
12
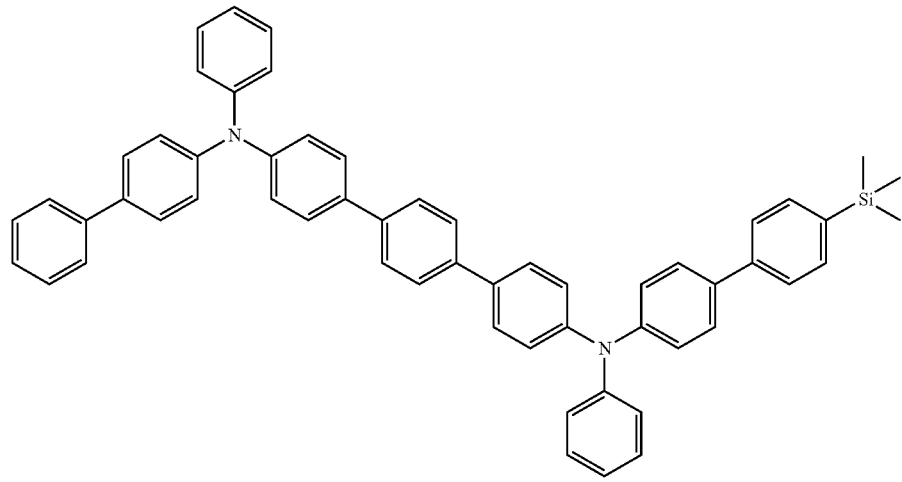

-continued
13
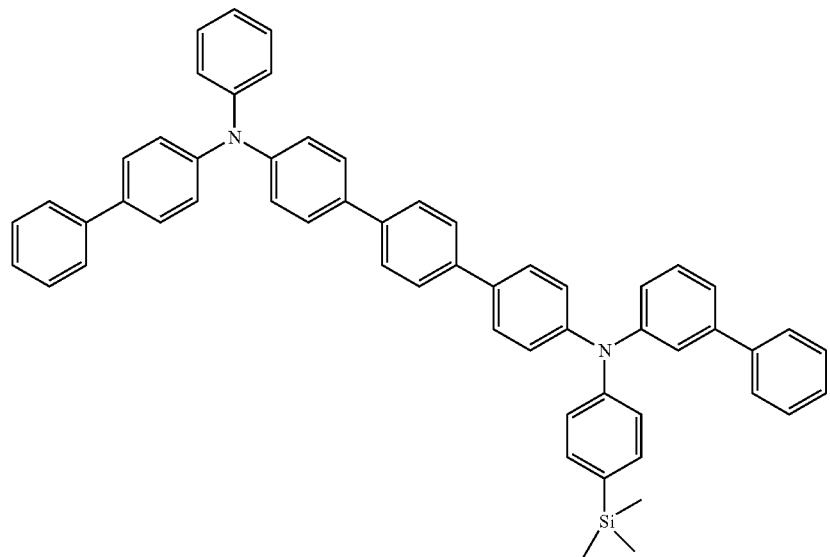
14
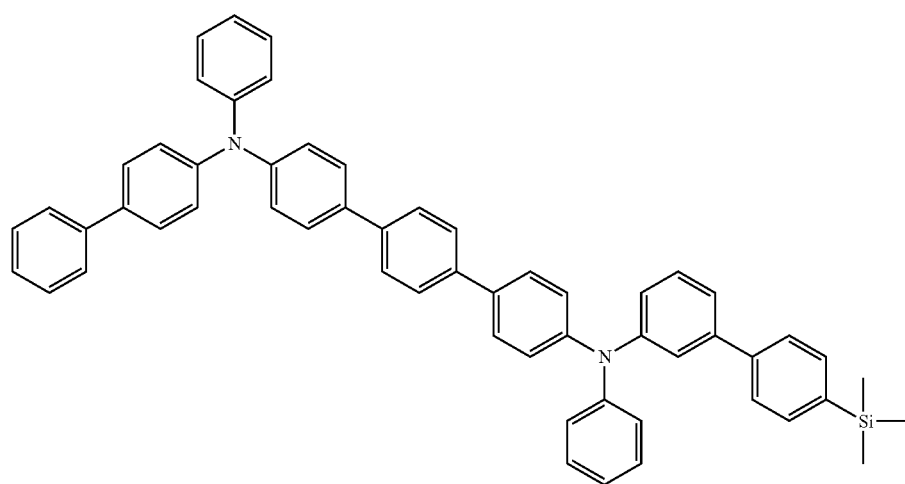
15
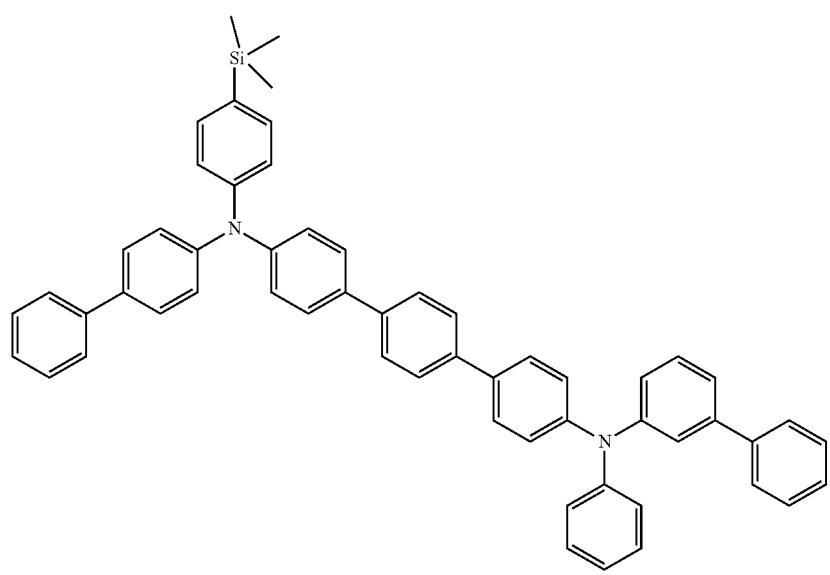

16
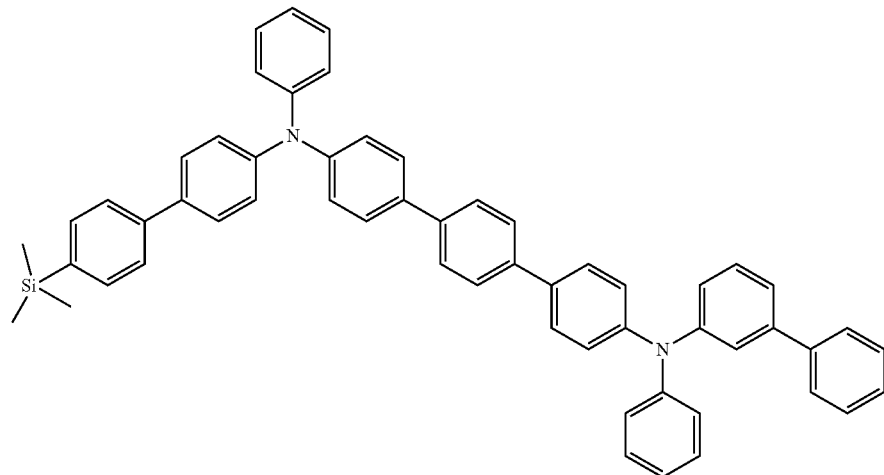
17
18
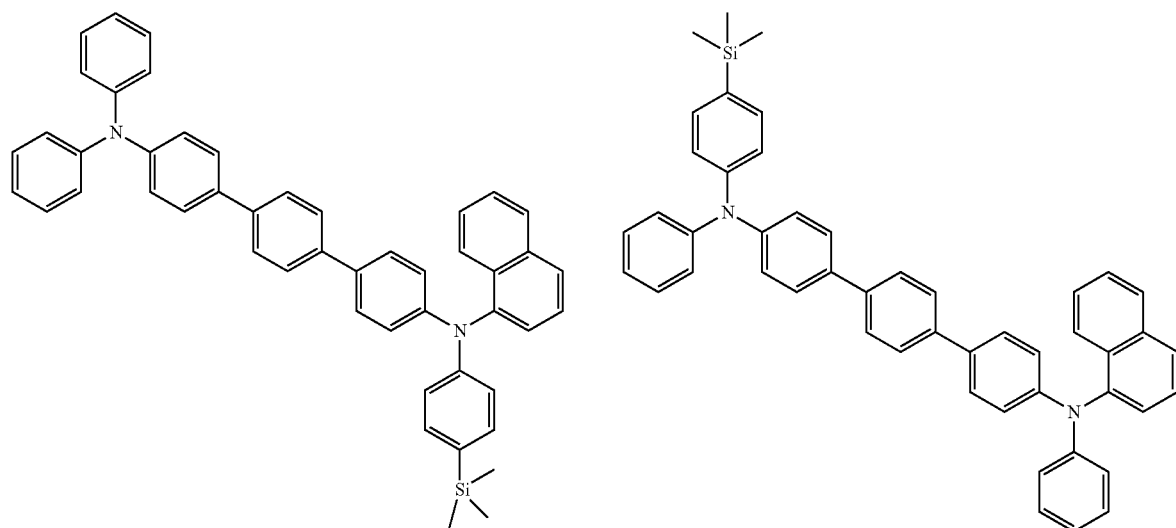
19
20
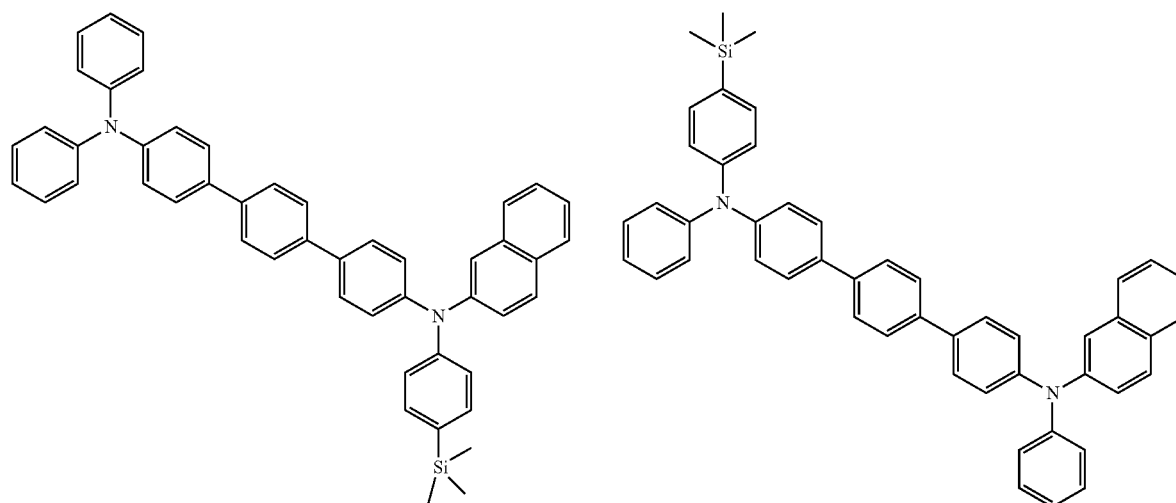

21
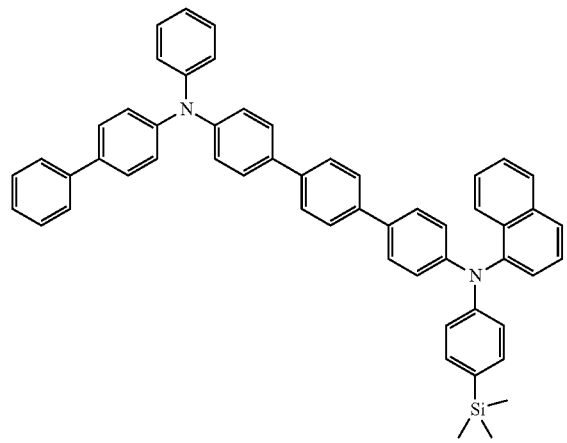
22
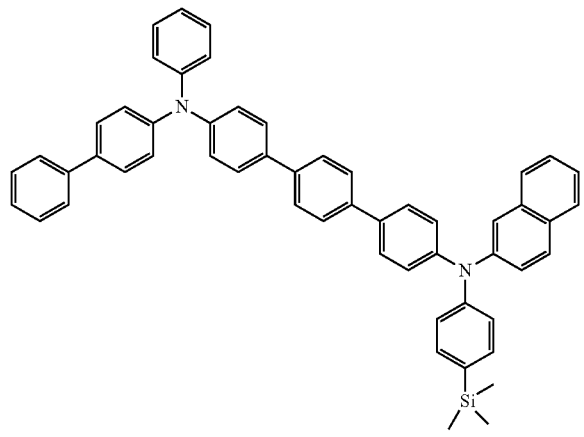
23
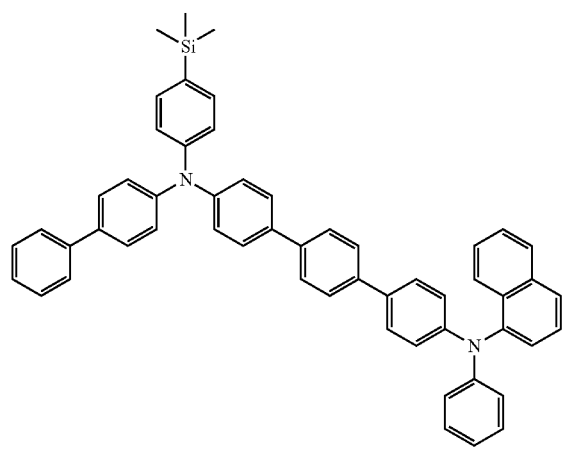
24
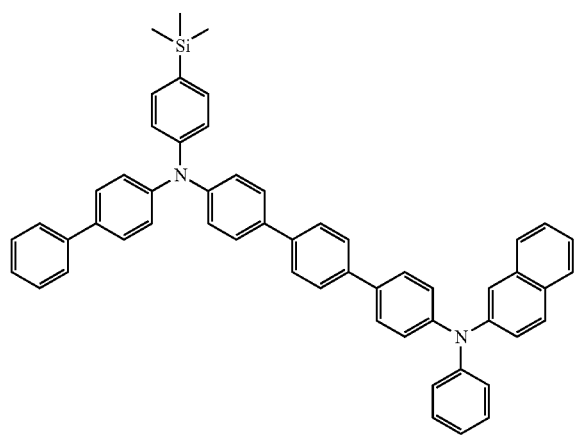
25
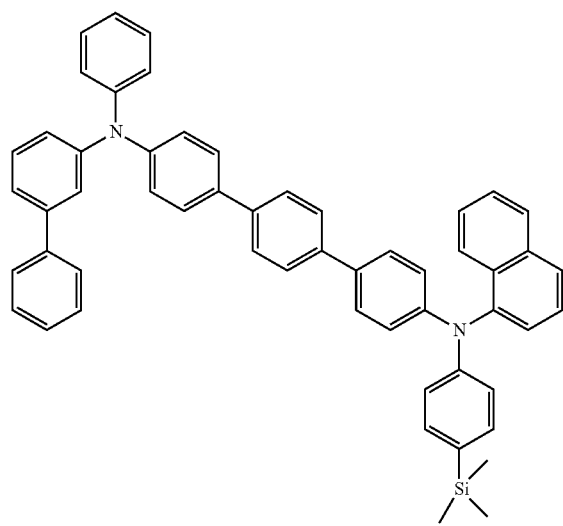
26
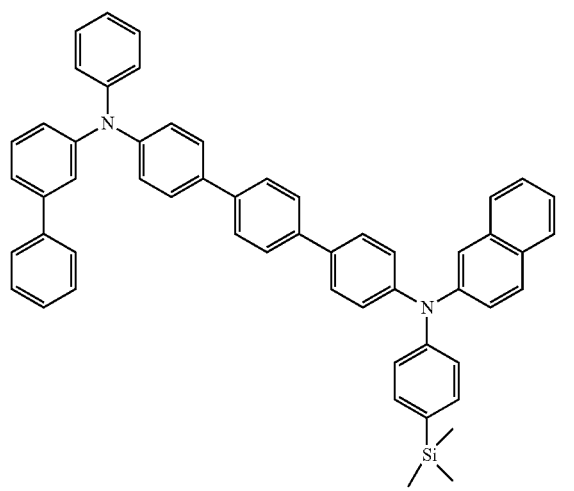

27
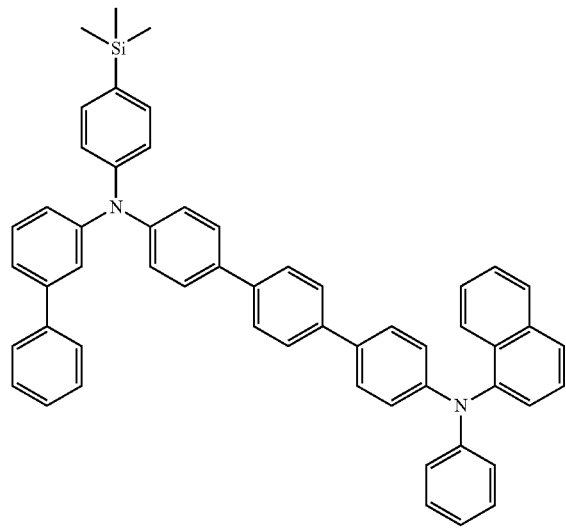
28
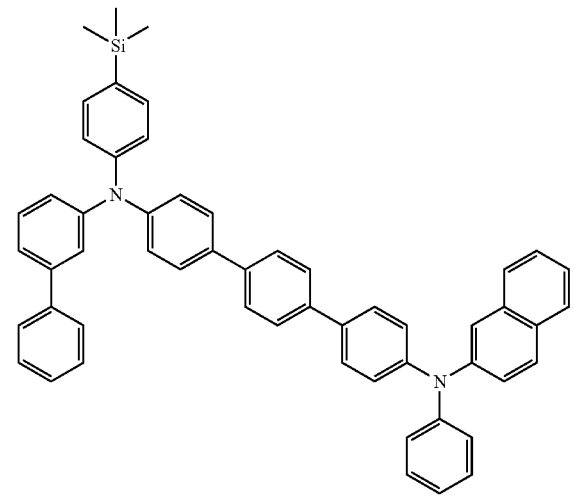
29
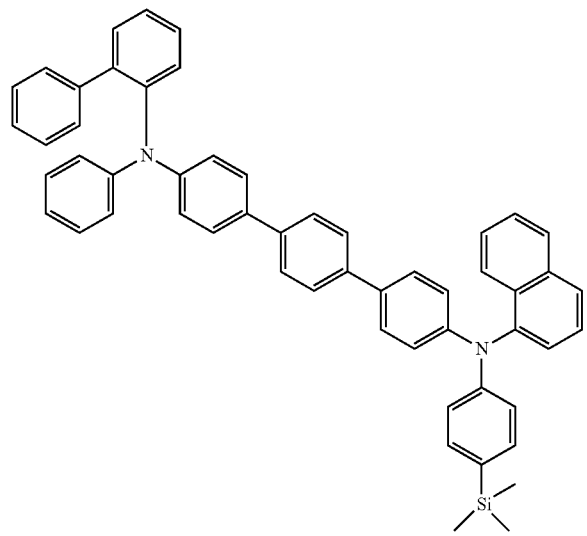
30
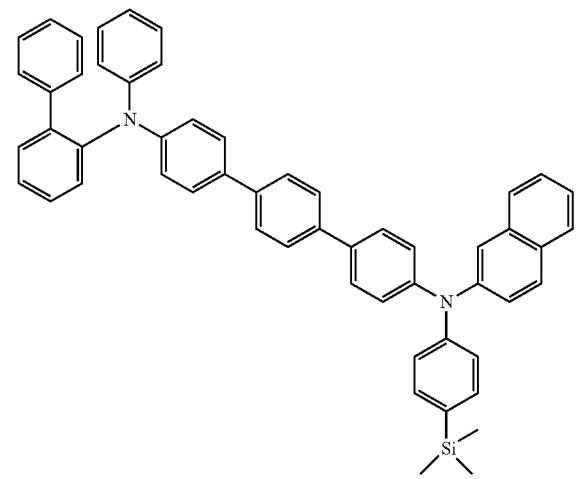
31
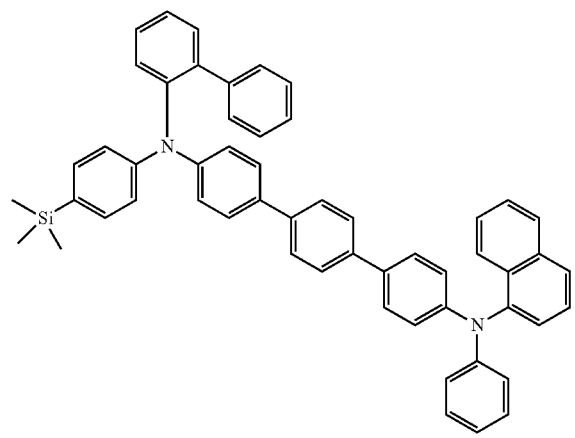
32
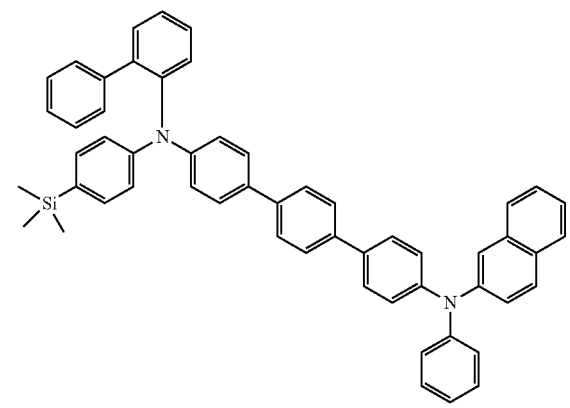

33
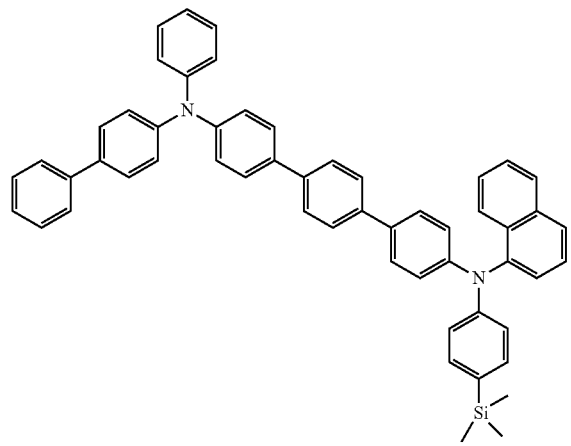
34
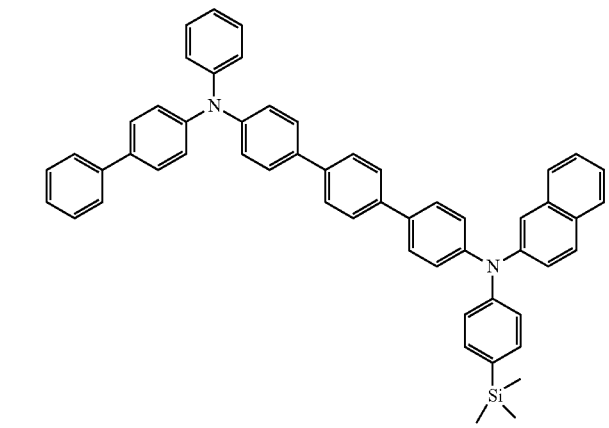
35
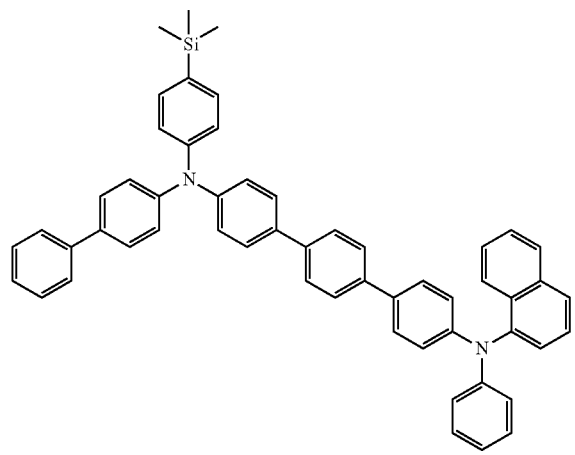
36
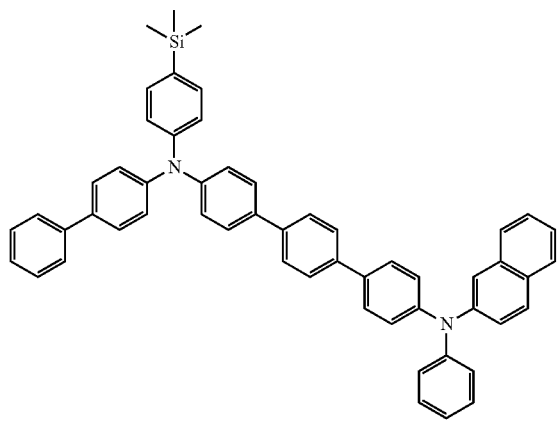
37
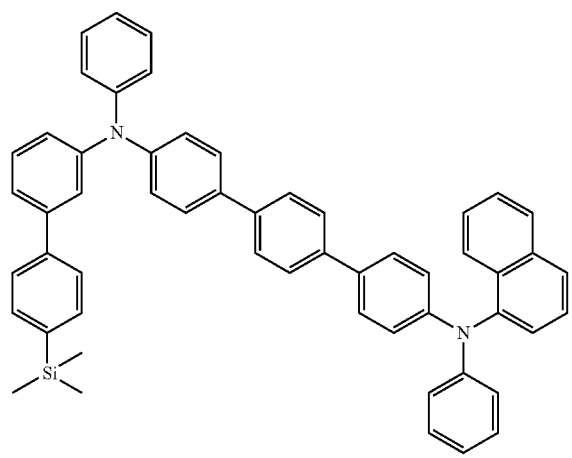
38
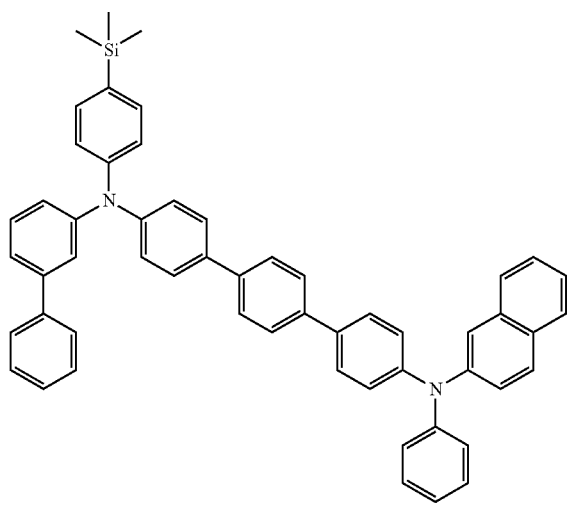

-continued
39
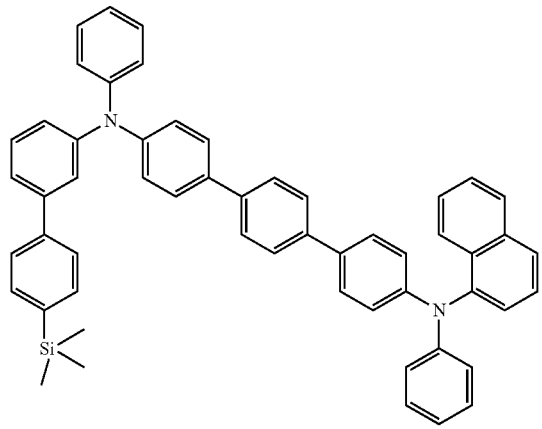
40
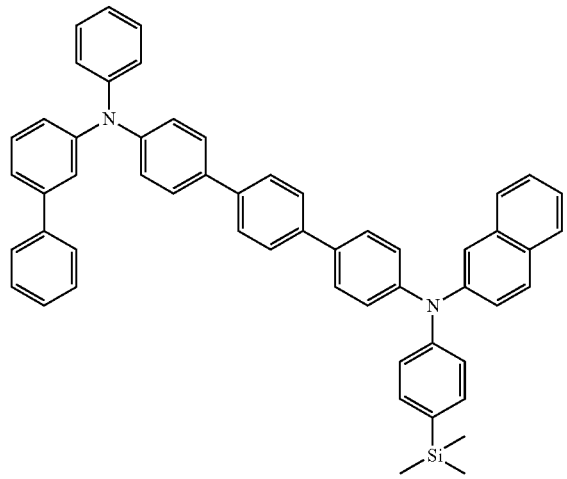
41
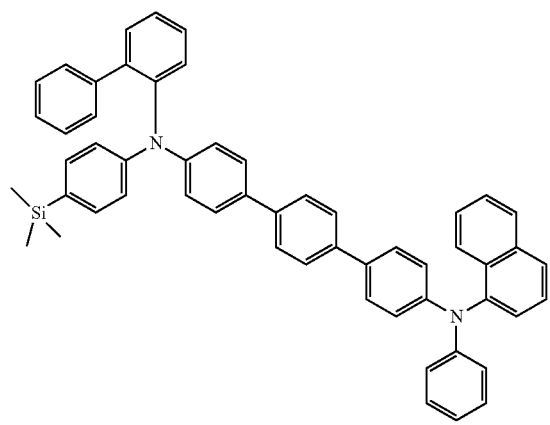
42
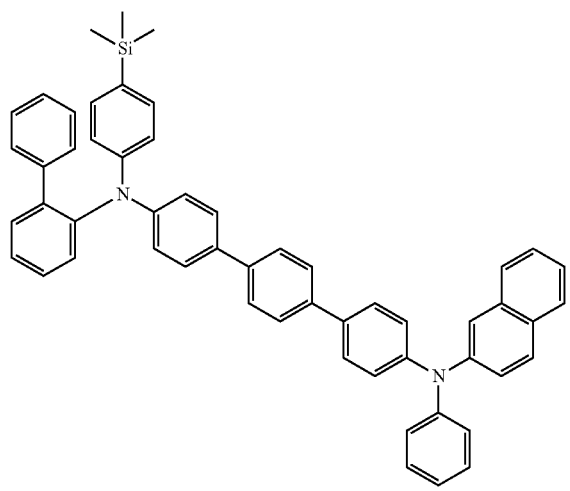
43
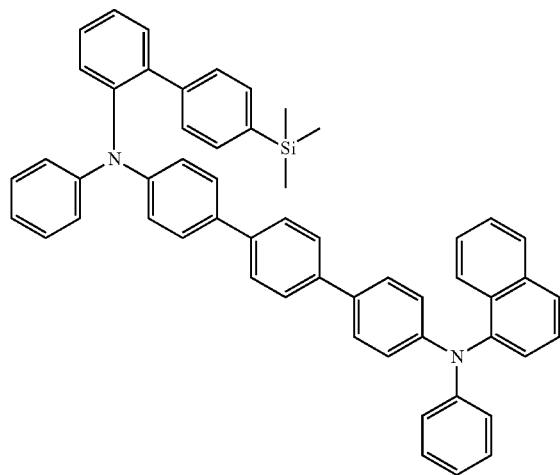
44
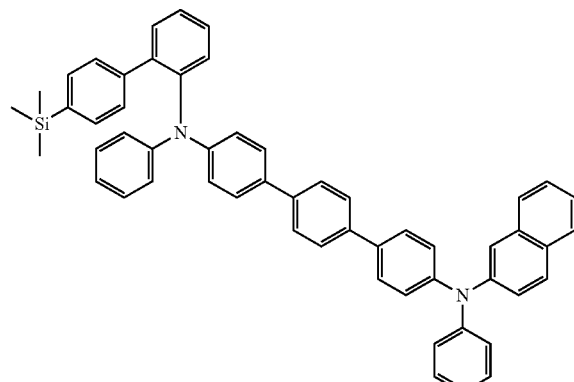

-continued
45
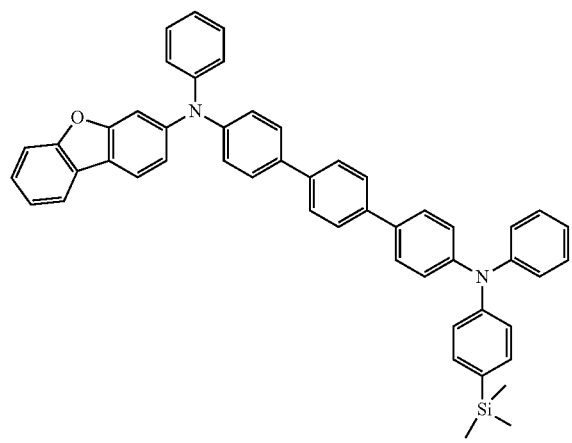
46
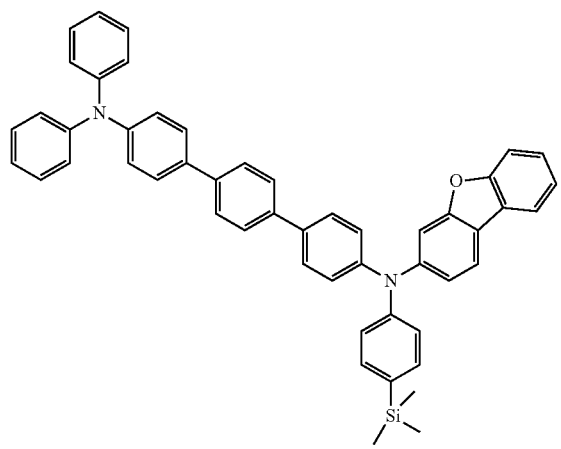
47
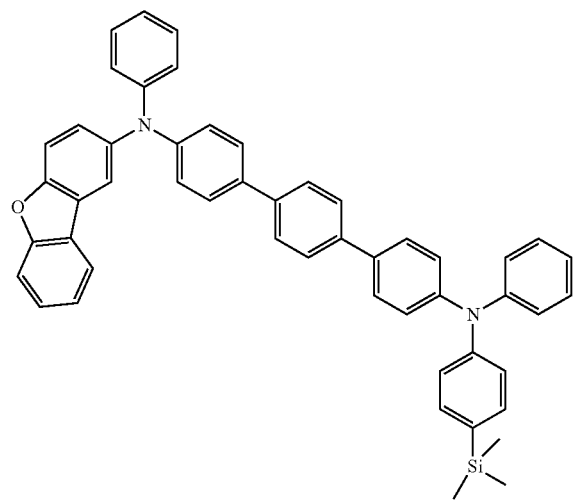
48
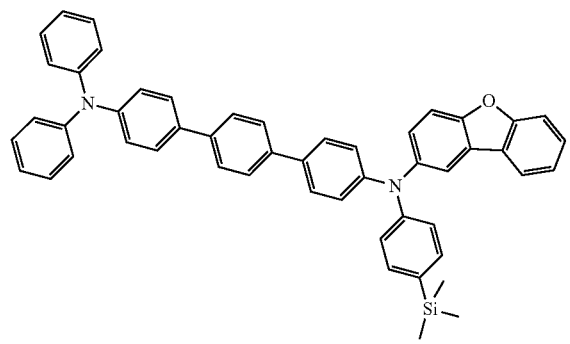
49
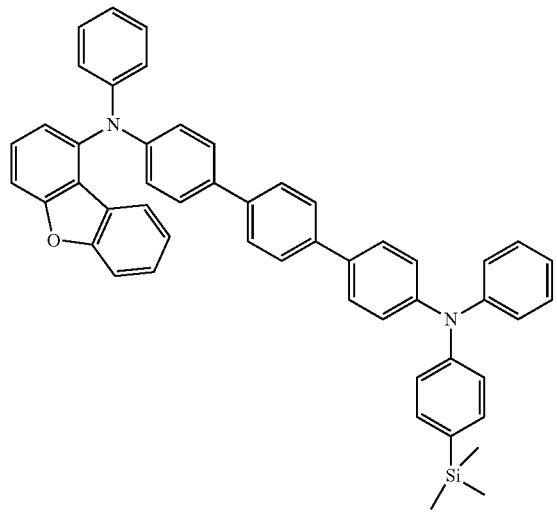
50
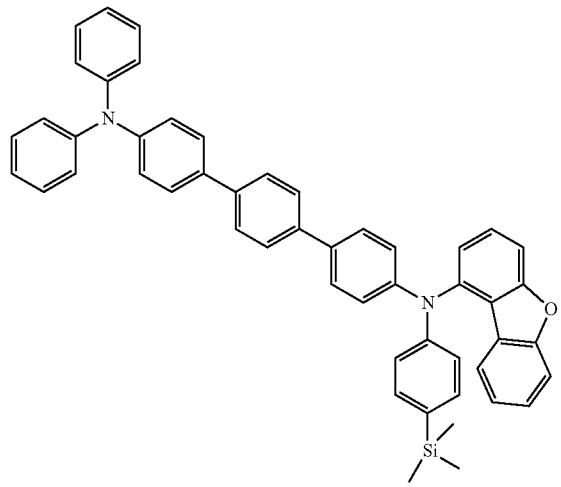

-continued
51
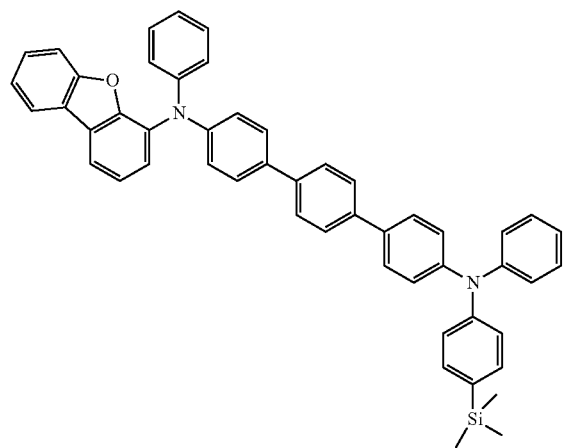
52
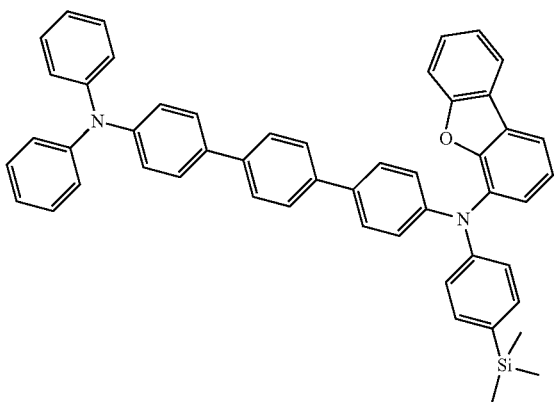
53
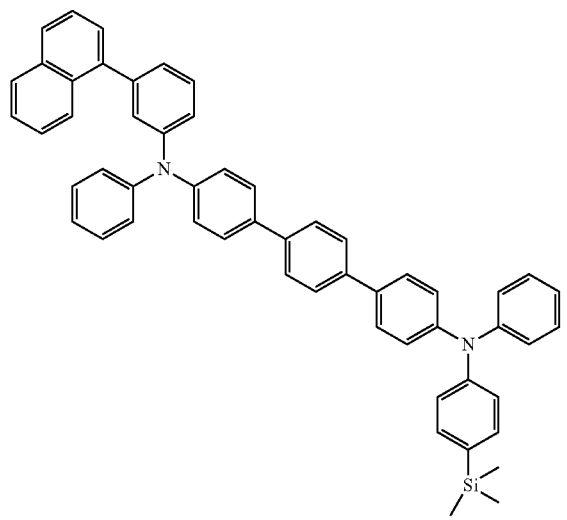
54
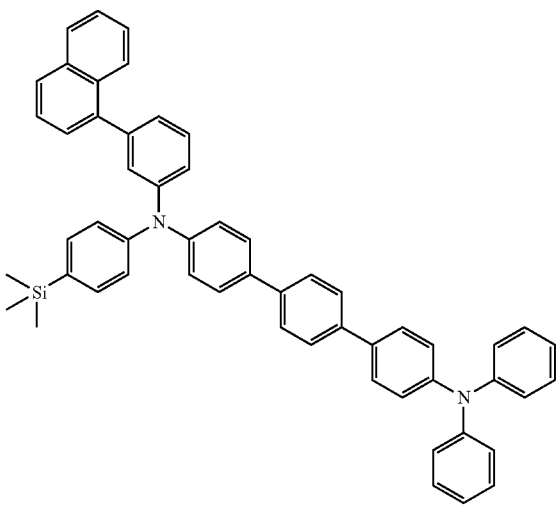
55
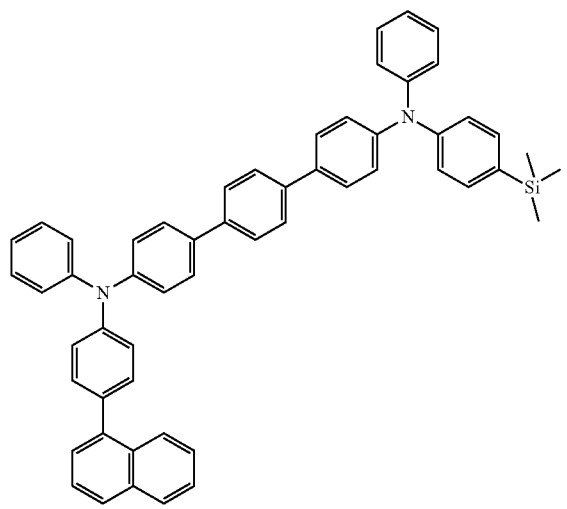
56
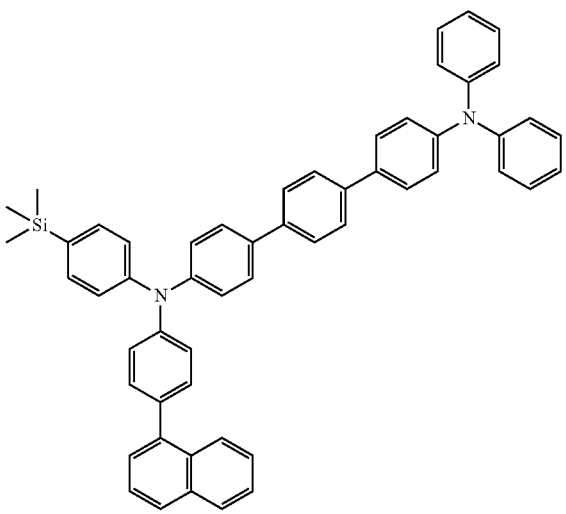

57
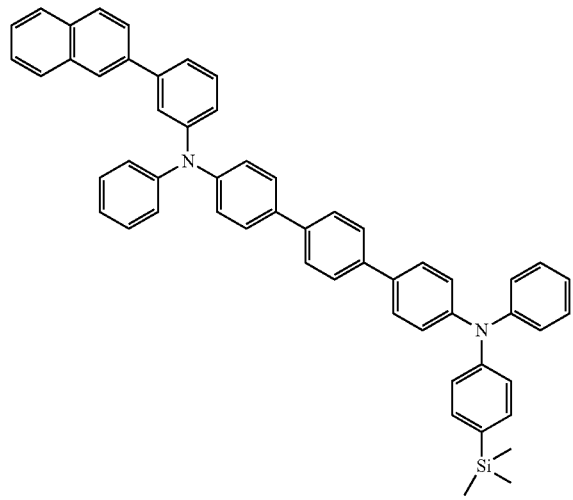
58
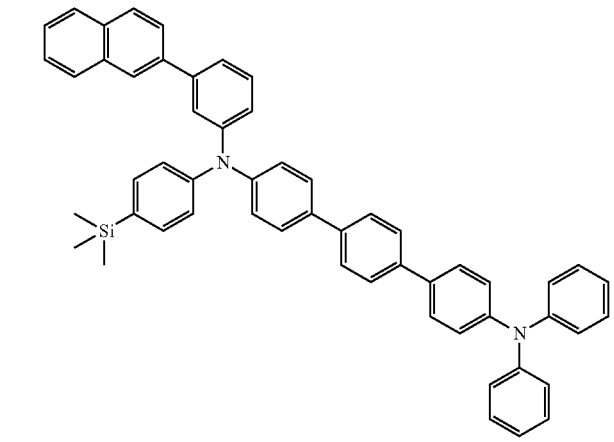
59
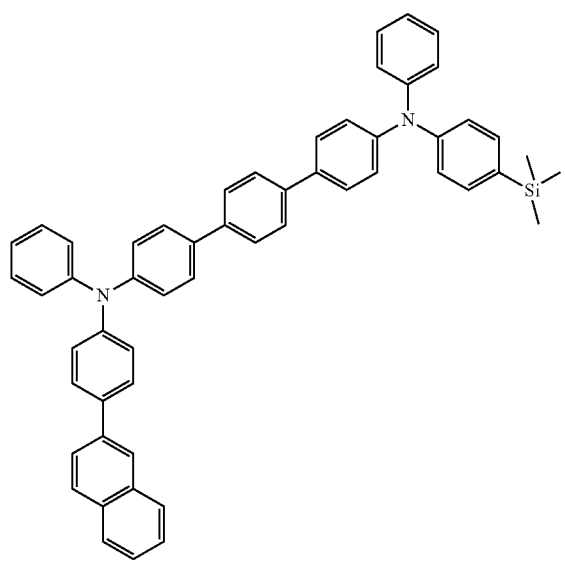
60
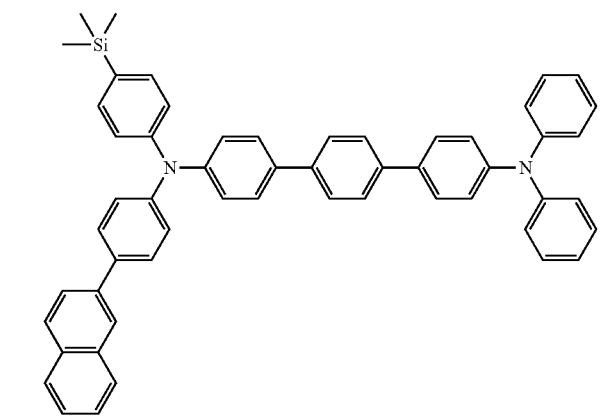
61
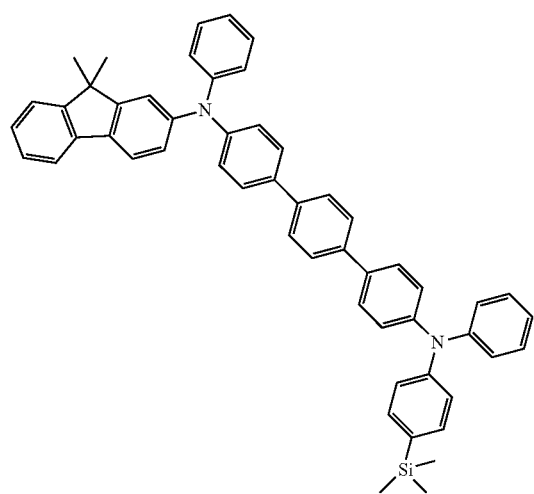
62
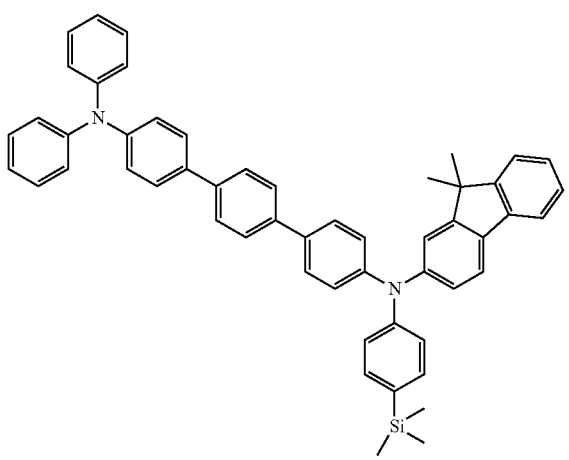

63
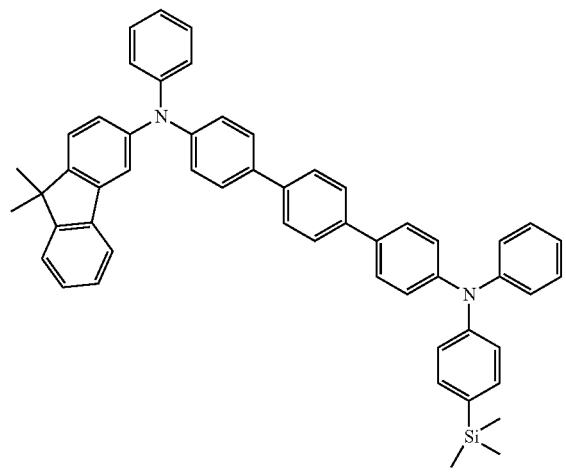
64
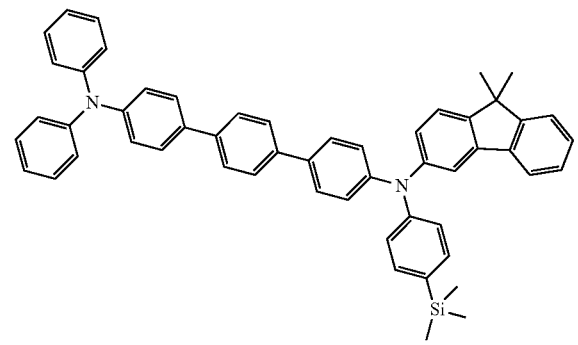
65
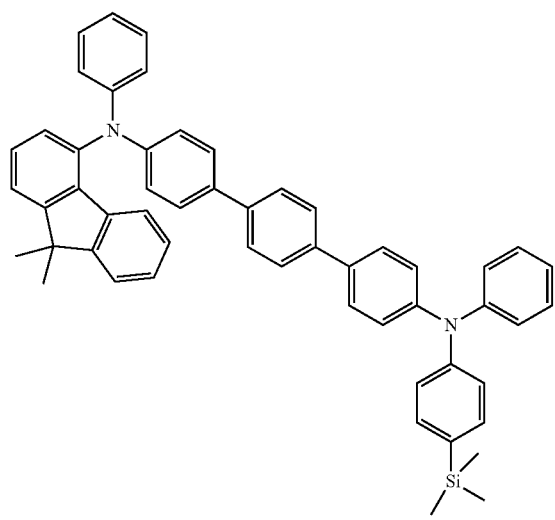
66
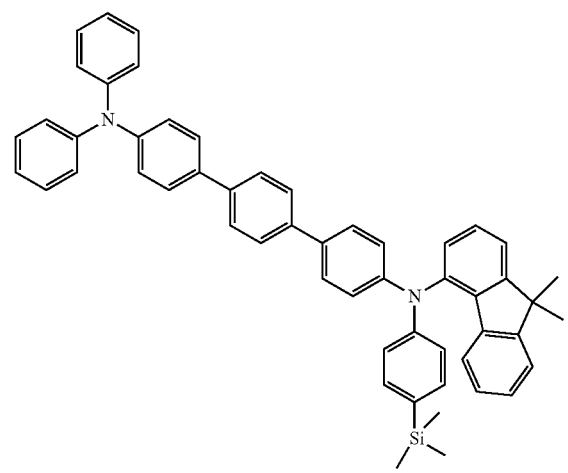
67
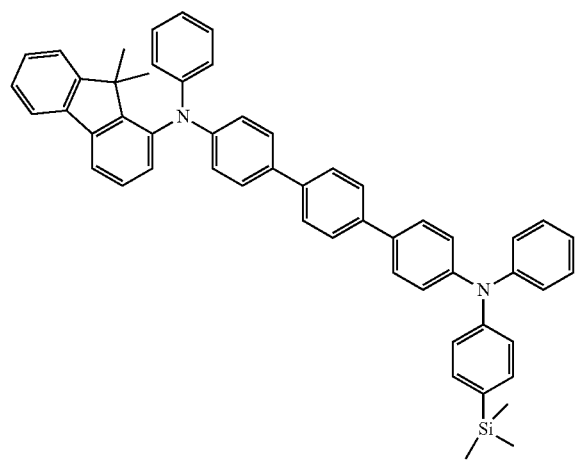
68
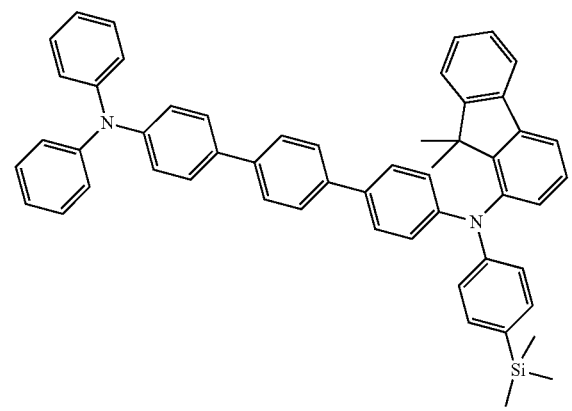

69
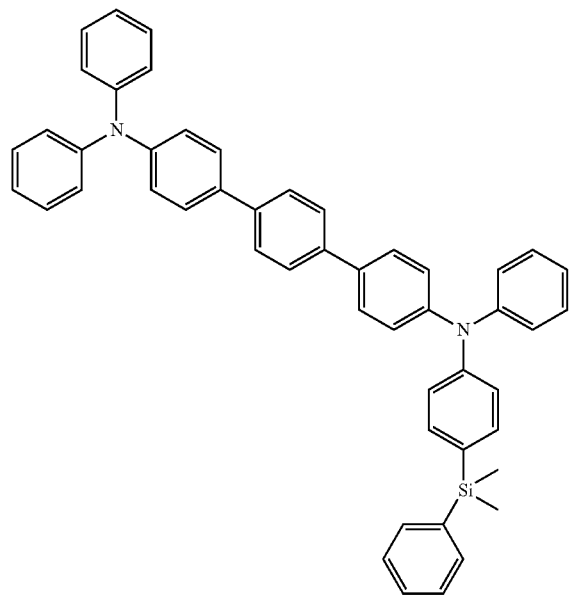
70
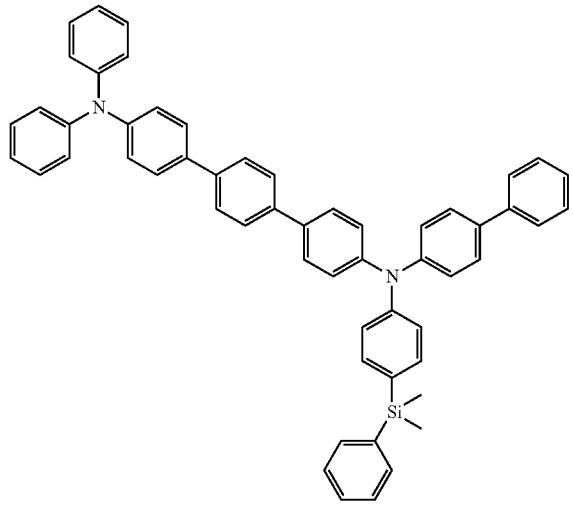
71
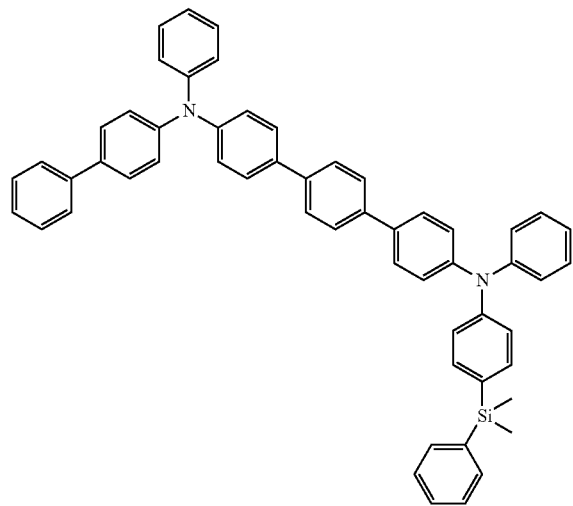
72
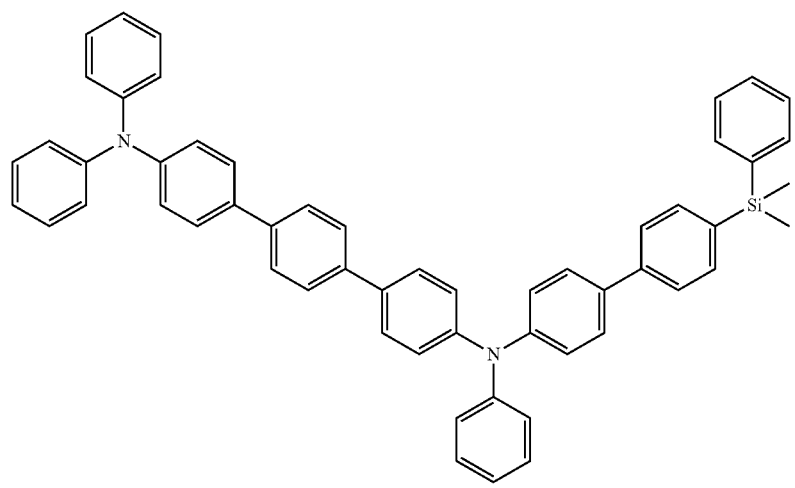

73
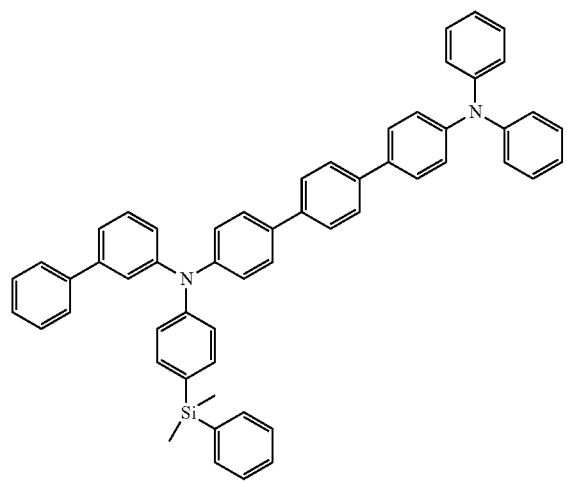
74
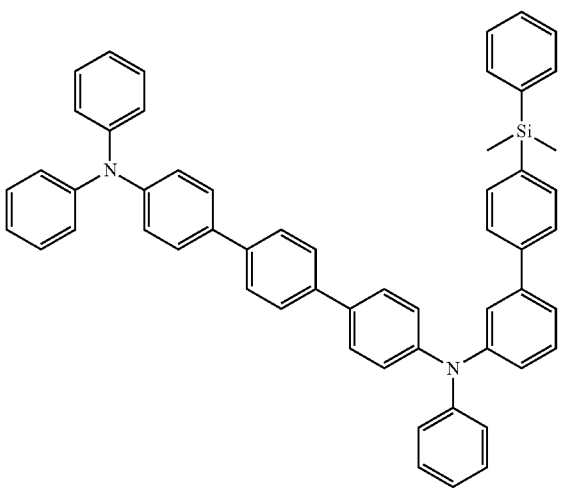
75
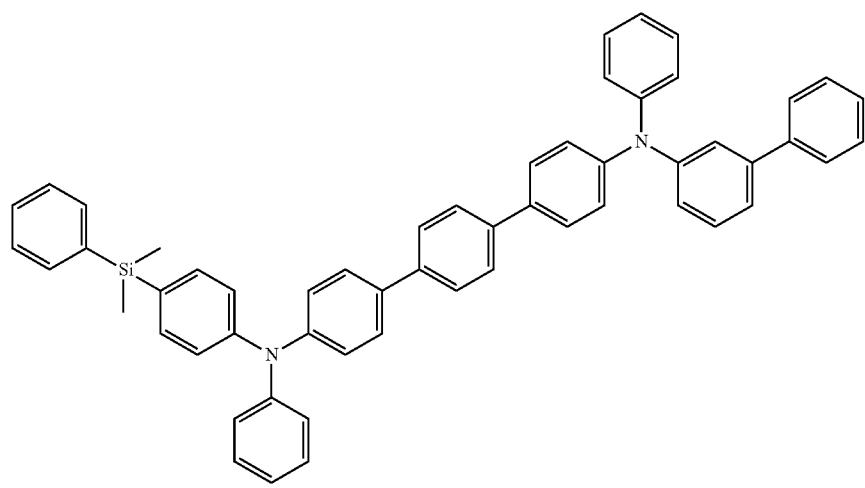
76
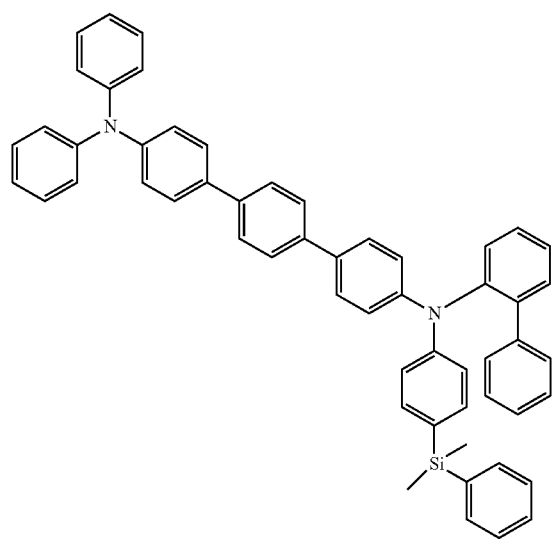
77
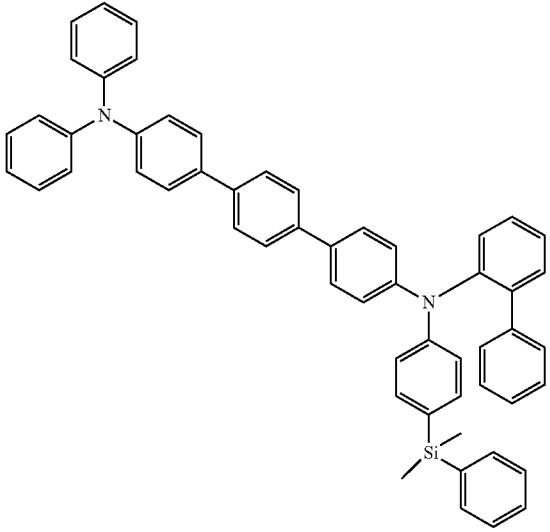

-continued
78
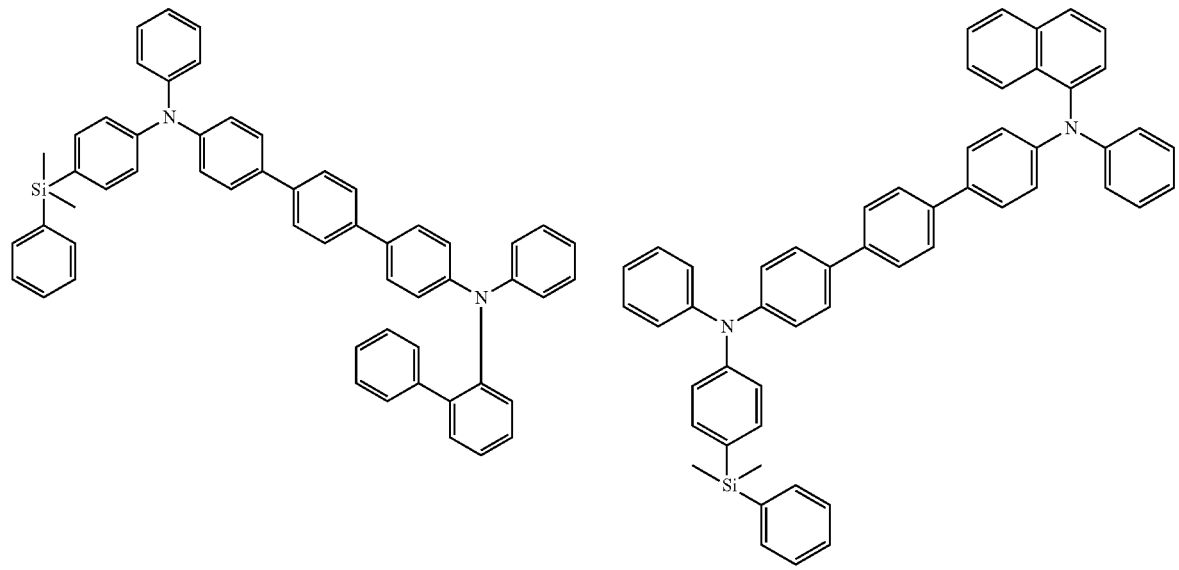
79
80
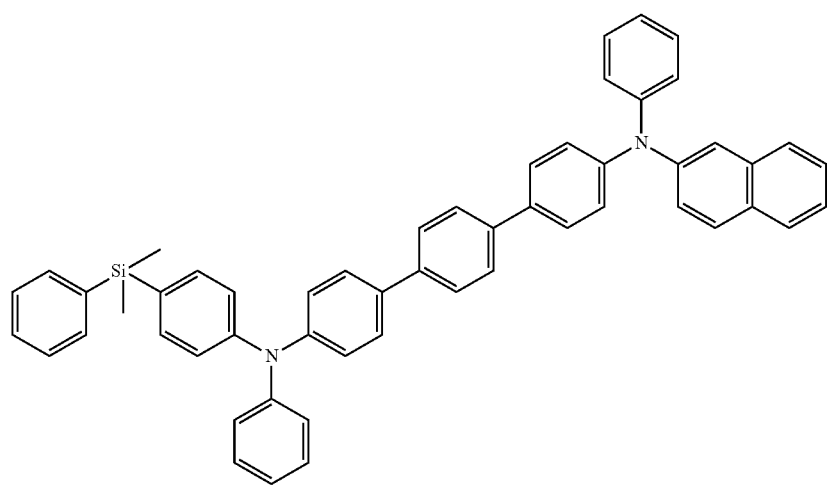
81
82
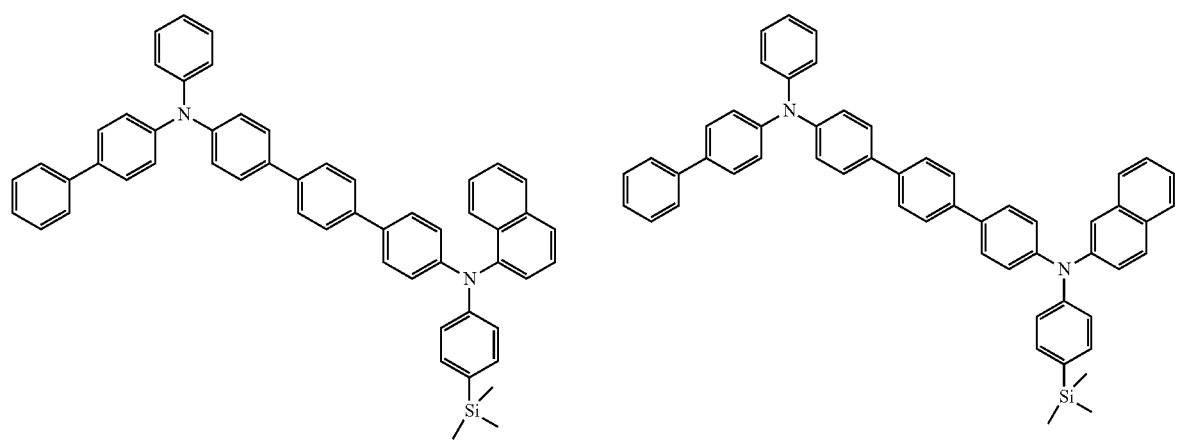

83
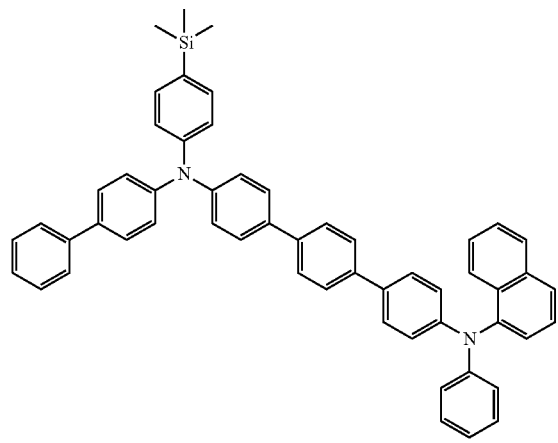
84
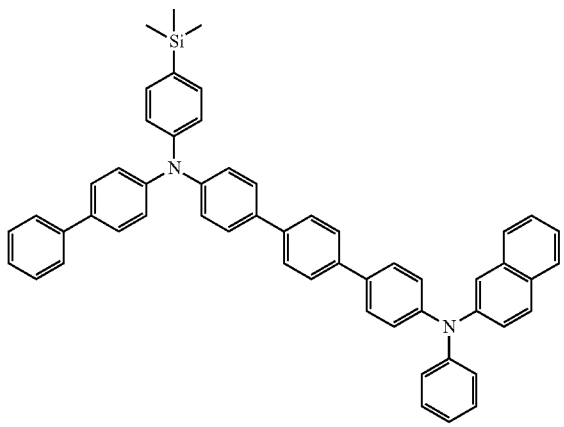
85
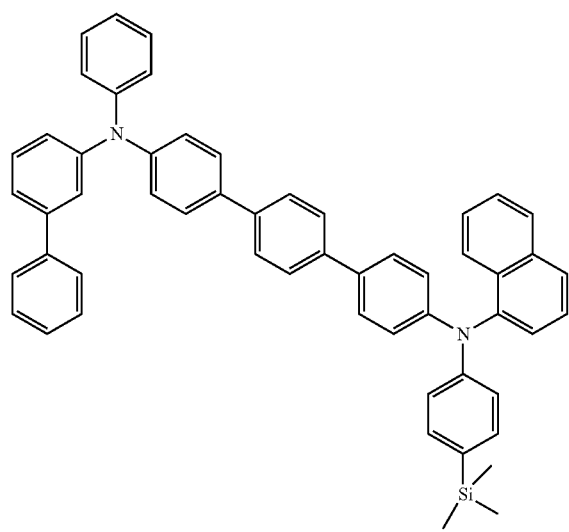
86
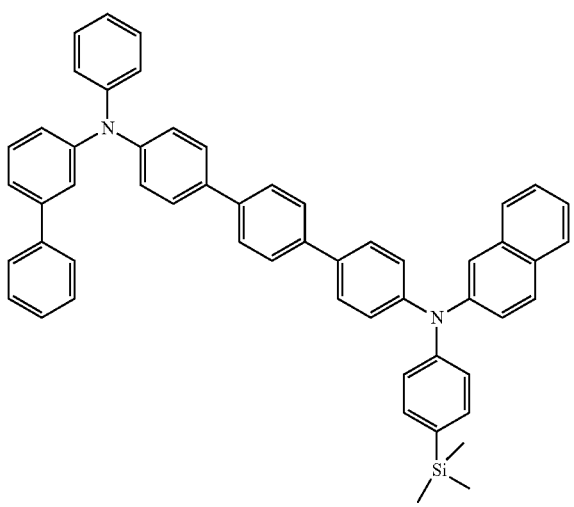

-continued
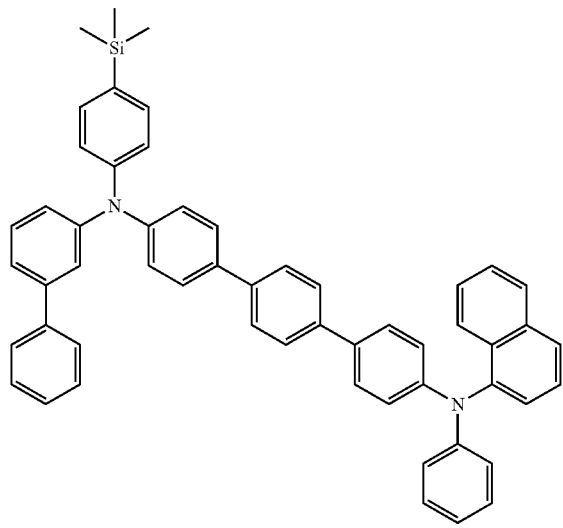
87
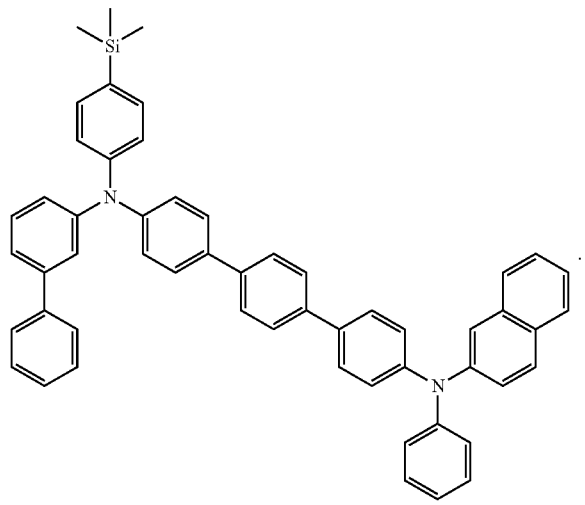
88
* * * * *

UNITED STATES PATENT AND TRADEMARK OFFICE
CERTIFICATE OF CORRECTION

PATENT NO. : 11,980,088 B2
APPLICATION NO. : 17/373336
DATED : May 7, 2024
INVENTOR(S) : Sohee Jo et al.

Page 1 of 2

It is certified that error appears in the above-identified patent and that said Letters Patent is hereby corrected as shown below:

In the Claims

In Column 141, Line 4, in Claim 15, delete "Formula 4-3" and insert -- Formula 1 --.

In Column 145, Lines 1-29, in Claim 19, in Formula 4-3, delete

"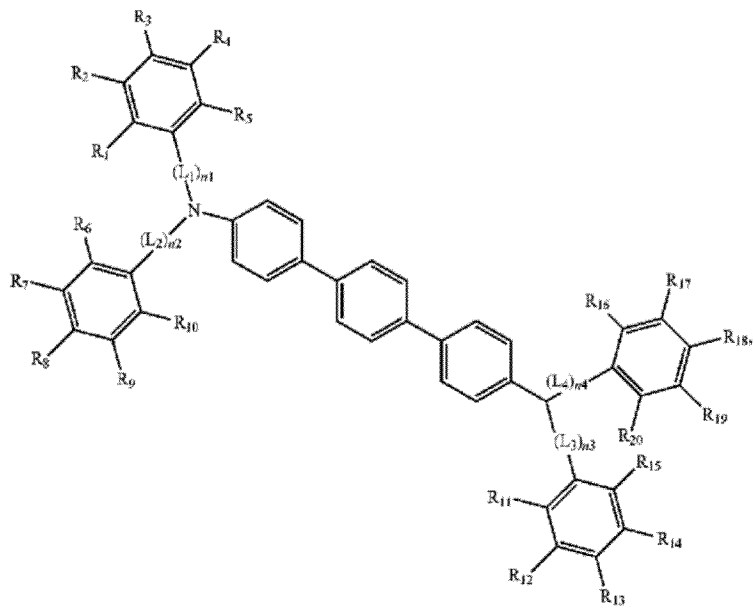" and insert

Signed and Sealed this
Fifteenth Day of October, 2024

Katherine Kelly Vidal
*Director of the United States Patent and Trademark Office*

CERTIFICATE OF CORRECTION (continued)
U.S. Pat. No. 11,980,088 B2

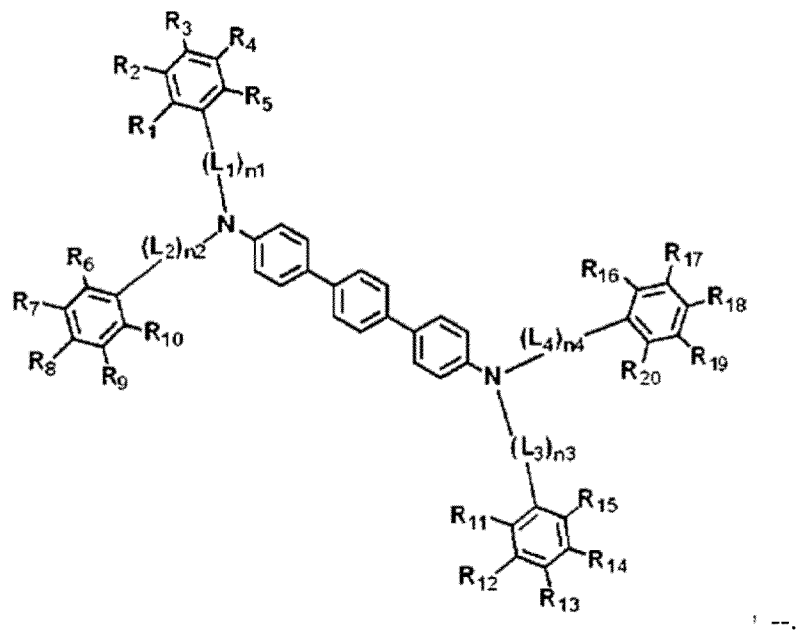

-- ; --.

In Column 145, Line 35, in Claim 20, after "below" insert -- : --.